(12) United States Patent
Yamazaki

(10) Patent No.: US 10,942,408 B2
(45) Date of Patent: Mar. 9, 2021

(54) COMPOSITE OXIDE SEMICONDUCTOR, SEMICONDUCTOR DEVICE USING THE COMPOSITE OXIDE SEMICONDUCTOR, AND DISPLAY DEVICE INCLUDING THE SEMICONDUCTOR DEVICE

(71) Applicant: SEMICONDUCTOR ENERGY LABORATORY CO., LTD., Atsugi (JP)

(72) Inventor: Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/087,685

(22) PCT Filed: Mar. 21, 2017

(86) PCT No.: PCT/IB2017/051614
§ 371 (c)(1),
(2) Date: Sep. 24, 2018

(87) PCT Pub. No.: WO2017/168283
PCT Pub. Date: Oct. 5, 2017

(65) Prior Publication Data
US 2019/0115474 A1 Apr. 18, 2019

(30) Foreign Application Priority Data
Apr. 1, 2016 (JP) .............................. JP2016-074398

(51) Int. Cl.
*H01L 29/786* (2006.01)
*H01L 29/66* (2006.01)
(Continued)

(52) U.S. Cl.
CPC ........ *G02F 1/1368* (2013.01); *H01L 29/0847* (2013.01); *H01L 29/1033* (2013.01);
(Continued)

(58) Field of Classification Search
CPC ............ H01L 21/024; H01L 21/02403; H01L 21/02414; H01L 21/02469;
(Continued)

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

CN 001379827 A 11/2002
EP 1233082 A 8/2002
(Continued)

OTHER PUBLICATIONS

International Search Report (Application No. PCT/IB2017/051614) dated Jul. 4, 2017.
(Continued)

*Primary Examiner* — Natalia A Gondarenko
(74) *Attorney, Agent, or Firm* — Fish & Richardson P.C.

(57) ABSTRACT

A novel composite oxide semiconductor which can be used in a transistor including an oxide semiconductor film is provided. In the composite oxide semiconductor, a first region and a second region are mixed. The first region includes a plurality of first clusters containing In and oxygen as main components. The second region includes a plurality of second clusters containing Zn and oxygen as main components. The plurality of first clusters have portions connected to each other. The plurality of second clusters have portions connected to each other.

13 Claims, 36 Drawing Sheets

US 10,942,408 B2
Page 2

(51) Int. Cl.
*H01L 29/06* (2006.01)
*H01L 29/08* (2006.01)
*H01L 29/10* (2006.01)
*G02F 1/1368* (2006.01)
*H01L 29/24* (2006.01)
*H01L 51/50* (2006.01)
*G06F 3/044* (2006.01)
*G06F 3/041* (2006.01)

(52) U.S. Cl.
CPC ........ *H01L 29/24* (2013.01); *H01L 29/66969* (2013.01); *H01L 29/786* (2013.01); *H01L 29/7869* (2013.01); *H01L 29/78633* (2013.01); *H01L 51/502* (2013.01); *G06F 3/0412* (2013.01); *G06F 3/0443* (2019.05); *G06F 3/0446* (2019.05)

(58) Field of Classification Search
CPC ......... H01L 21/02472; H01L 21/02483; H01L 21/02551; H01L 21/02554; H01L 21/02565; H01L 21/02595; H01L 21/02598; H01L 21/02601; H01L 21/02609; H01L 29/786; H01L 29/24; H01L 29/78633; H01L 29/66969; H01L 29/1033; H01L 29/0847; H01L 29/78696; H01L 29/78648; H01L 29/7869; H01L 27/1225; H01L 51/502; H01L 2924/01049; H01L 2924/0542; H01L 2924/0543; G02F 1/1368; G02F 1/13338; G02F 1/136213; G02F 2001/134372; G02F 2001/13685; G06F 3/044; G06F 3/0412
USPC ............................................. 257/43; 438/104
See application file for complete search history.

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,669,830 B1 | 12/2003 | Inoue et al. |
| 6,727,522 B1 | 4/2004 | Kawasaki et al. |
| 7,049,190 B2 | 5/2006 | Takeda et al. |
| 7,049,258 B2 | 5/2006 | Ohsato et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 8,581,266 B2 | 11/2013 | Nowatari et al. |
| 8,633,480 B2 | 1/2014 | Yamazaki et al. |
| 8,729,547 B2 | 5/2014 | Miyairi et al. |
| 8,748,215 B2 | 6/2014 | Yamazaki |
| 8,785,266 B2 | 7/2014 | Yamazaki |
| 8,894,825 B2 | 11/2014 | Yamazaki |
| 8,901,558 B2 | 12/2014 | Yamazaki |
| 8,941,113 B2 | 1/2015 | Takeuchi et al. |
| 9,246,013 B2 | 1/2016 | Ahmed |
| 9,293,589 B2 | 3/2016 | Yamazaki et al. |
| 9,349,752 B2 | 5/2016 | Yamazaki |
| 9,478,603 B2 | 10/2016 | Yamazaki et al. |
| 9,478,668 B2 | 10/2016 | Takahashi et al. |
| 9,496,330 B2 | 11/2016 | Yamazaki et al. |
| 9,496,408 B2 | 11/2016 | Yamazaki et al. |
| 9,508,864 B2 | 11/2016 | Yamazaki |
| 9,564,482 B2 | 2/2017 | Teraguchi et al. |
| 9,882,062 B2 | 1/2018 | Yamazaki |
| 10,243,081 B2 | 3/2019 | Yamazaki et al. |
| 10,388,738 B2 * | 8/2019 | Yamazaki ........... H01L 29/4908 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0242403 A1 | 12/2004 | Ohsato et al. |
| 2005/0017302 A1 | 1/2005 | Hoffman |
| 2005/0199879 A1 | 9/2005 | Hoffman et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |

(56) References Cited

U.S. PATENT DOCUMENTS

| | | |
|---|---|---|
| 2009/0211903 A1 | 8/2009 | Lee et al. |
| 2009/0278122 A1 | 11/2009 | Hosono et al. |
| 2009/0280600 A1 | 11/2009 | Hosono et al. |
| 2010/0025676 A1 | 2/2010 | Yamazaki et al. |
| 2010/0025677 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0123130 A1 | 5/2010 | Akimoto et al. |
| 2011/0084267 A1 | 4/2011 | Yamazaki et al. |
| 2011/0084268 A1 | 4/2011 | Yamazaki et al. |
| 2011/0084272 A1 | 4/2011 | Miyanaga et al. |
| 2013/0320334 A1 | 12/2013 | Yamazaki et al. |
| 2014/0001032 A1 | 1/2014 | Yamazaki |
| 2014/0084287 A1 | 3/2014 | Yamazaki |
| 2014/0106502 A1 | 4/2014 | Tezuka et al. |
| 2014/0183528 A1* | 7/2014 | Endo ............... H01L 27/1296 257/43 |
| 2014/0183532 A1* | 7/2014 | Yamazaki ......... H01L 29/7869 257/43 |
| 2014/0291671 A1 | 10/2014 | Yamazaki et al. |
| 2014/0346500 A1 | 11/2014 | Yamazaki |
| 2015/0034947 A1 | 2/2015 | Yamazaki et al. |
| 2015/0187575 A1 | 7/2015 | Yamazaki et al. |
| 2015/0236162 A1 | 8/2015 | Yamazaki |
| 2015/0318171 A1 | 11/2015 | Yamazaki |
| 2015/0318359 A1 | 11/2015 | Shimomura et al. |
| 2015/0349127 A1 | 12/2015 | Kurata et al. |
| 2016/0118254 A1 | 4/2016 | Yamazaki |
| 2016/0190346 A1 | 6/2016 | Kawata et al. |
| 2016/0225620 A1 | 8/2016 | Yamazaki |
| 2016/0247902 A1 | 8/2016 | Yamazaki |
| 2016/0349557 A1 | 12/2016 | Shishido et al. |
| 2016/0349558 A1 | 12/2016 | Shishido et al. |
| 2016/0356645 A1 | 12/2016 | Yoneda et al. |
| 2016/0365367 A1 | 12/2016 | Kimura et al. |
| 2016/0372606 A1 | 12/2016 | Ito et al. |
| 2016/0381266 A1 | 12/2016 | Ohmaru |
| 2017/0033130 A1 | 2/2017 | Yoneda et al. |
| 2017/0256572 A1 | 9/2017 | Yamazaki |
| 2017/0256654 A1 | 9/2017 | Yamazaki et al. |
| 2017/0263773 A1 | 9/2017 | Yamazaki |
| 2017/0263783 A1 | 9/2017 | Yamazaki et al. |
| 2017/0271378 A1 | 9/2017 | Yamazaki et al. |
| 2017/0278874 A1 | 9/2017 | Yamazaki et al. |
| 2017/0288023 A1 | 10/2017 | Yamazaki et al. |
| 2017/0338315 A1 | 11/2017 | Yamazaki et al. |

FOREIGN PATENT DOCUMENTS

| | | |
|---|---|---|
| EP | 1752430 A | 2/2007 |
| EP | 1777321 A | 4/2007 |
| JP | 2009-203554 A | 9/2009 |
| JP | 2010-024087 A | 2/2010 |
| JP | 4850378 | 1/2012 |
| JP | 2013-105814 A | 5/2013 |
| JP | 2013-229588 A | 11/2013 |
| JP | 2014-007399 | 1/2014 |
| JP | 2014-111818 A | 6/2014 |
| JP | 2015-046594 A | 3/2015 |
| JP | 2015-173259 A | 10/2015 |
| JP | 2015-173276 A | 10/2015 |
| JP | 2016-028455 A | 2/2016 |
| KR | 10-0774778 | 11/2007 |
| KR | 2009-0092165 A | 8/2009 |
| KR | 2015-0016144 A | 2/2015 |
| KR | 2016-0120741 A | 10/2016 |
| TW | I269817 | 1/2007 |
| TW | 200948995 | 12/2009 |
| TW | 201434788 | 9/2014 |
| TW | 201515107 | 4/2015 |
| TW | 201543692 | 11/2015 |
| WO | WO-2001/038599 | 5/2001 |
| WO | WO-2013/111756 | 8/2013 |
| WO | WO-2014/073210 | 5/2014 |
| WO | WO-2015/125042 | 8/2015 |

OTHER PUBLICATIONS

Written Opinion (Application No. PCT/IB2017/051614) dated Jul. 4, 2017.

* cited by examiner

100J

100J

COMPOSITE OXIDE SEMICONDUCTOR, SEMICONDUCTOR DEVICE USING THE COMPOSITE OXIDE SEMICONDUCTOR, AND DISPLAY DEVICE INCLUDING THE SEMICONDUCTOR DEVICE

CROSS REFERENCE TO RELATED APPLICATIONS

This application is a U.S. National Phase Application under 35 U.S.C. § 371 of International Application PCT/IB2017/051614, filed on Mar. 21, 2017, which claims the benefit of a foreign priority application filed in Japan as Application No. 2016-074398 on Apr. 1, 2016, both of which are incorporated by reference.

TECHNICAL FIELD

One embodiment of the present invention relates to a composite oxide semiconductor. One embodiment of the present invention relates to a semiconductor device including the composite oxide semiconductor and a display device including the semiconductor device.

Note that one embodiment of the present invention is not limited to the above technical field. The technical field of one embodiment of the invention disclosed in this specification and the like relates to an object, a method, or a manufacturing method. The present invention relates to a process, a machine, manufacture, or a composition (a composition of matter). In particular, one embodiment of the present invention relates to a semiconductor device, a display device, a light-emitting device, a power storage device, a memory device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device each include a semiconductor device in some cases.

BACKGROUND ART

Attention has been focused on a technique for forming a transistor using a semiconductor thin film formed over a substrate having an insulating surface (also referred to as a field-effect transistor (FET) or a thin film transistor (TFT)). Such transistors are used in a wide range of electronic devices such as an integrated circuit (IC) and an image display device (display device). A semiconductor material typified by silicon has been widely known as a semiconductor thin film that can be used in a transistor; however, as another material, an oxide semiconductor has attracted attention.

In addition, a semiconductor device which achieves high field-effect mobility (simply referred to as mobility or μFE in some cases) by stacking a plurality of oxide semiconductor layers, containing indium and gallium in an oxide semiconductor layer serving as a channel in the plurality of oxide semiconductor layers, and making the proportion of indium larger than the proportion of gallium (see Patent Document 1).

PRIOR ART DOCUMENT

Patent Document

[Patent Document 1] Japanese Published Patent Application No. 2014-7399

SUMMARY OF THE INVENTION

Problems to be Solved by the Invention

The field-effect mobility of a transistor that uses an oxide semiconductor film as a channel region is preferably as high as possible. However, when the field-effect mobility of a transistor is increased, there is a problem in that the characteristics of the transistor tend to be normally-on characteristics. Note that "normally on" means a state where a channel exists without application of a voltage to a gate electrode and a current flows through the transistor.

Furthermore, in a transistor that uses an oxide semiconductor film as a channel region, oxygen vacancies which are formed in the oxide semiconductor film adversely affect the transistor characteristics and therefore cause a problem. For example, when oxygen vacancies are formed in the oxide semiconductor film, the oxygen vacancies are bonded with hydrogen to serve as carrier supply sources. The carrier supply sources generated in the oxide semiconductor film cause a change in the electrical characteristics, typically, shift in the threshold voltage, of the transistor including the oxide semiconductor film.

When the amount of oxygen vacancies in the oxide semiconductor film is too large, for example, the threshold voltage of the transistor is shifted in the negative direction, and the transistor has normally-on characteristics. Thus, in the oxide semiconductor film, especially in the channel region, the amount of oxygen vacancies is preferably small or the amount with which the normally-on characteristics are not exhibited.

In view of the above problems, one object of one embodiment of the present invention is to provide a novel composite oxide semiconductor that can be used in a transistor including an oxide semiconductor film. Another object of one embodiment of the present invention is to improve field-effect mobility and to improve reliability in a transistor including an oxide semiconductor film. Another object of one embodiment of the present invention is to prevent a change in electrical characteristics and to improve reliability in a transistor including an oxide semiconductor film. Another object of one embodiment of the present invention is to provide a novel semiconductor device. Another object of one embodiment of the present invention is to provide a novel display device. Another object is to provide a method for manufacturing a novel composite oxide semiconductor.

Note that the description of the above objects does not preclude the existence of other objects. In one embodiment of the present invention, there is no need to achieve all the objects. Objects other than the above will be apparent from the description of the specification and the like and objects other than the above can be derived from the description of the specification and the like.

Means for Solving the Problems

One embodiment of the present invention is a composite oxide semiconductor in which a first region and a second region are mixed. The first region includes a plurality of first clusters containing In and oxygen as main components. The second region includes a plurality of second clusters containing Zn and oxygen as main components. The plurality of first clusters have portions connected to each other. The plurality of second clusters have portions connected to each other.

Another embodiment of the present invention is a composite oxide semiconductor in which a first region and a second region are mixed. The first region includes a plurality of first clusters containing In and oxygen as main components. The second region includes a plurality of second clusters containing oxygen and one of or both Zn and Sn as main components. The plurality of first clusters have portions connected to each other. The plurality of second clusters have portions connected to each other.

In the above embodiments, it is preferable that an atomic ratio of In to Zn be in a neighborhood of In:Zn=2:3, and when the proportion of In is 2, the proportion of Zn be higher than or equal to 2 and lower than or equal to 4. In the above embodiments, it is preferable that each of the first region and the second region not contain Ga.

In the above embodiments, it is preferable that the first clusters have electrical conductivity and the second clusters have electrical semiconductivity. In the above embodiments, it is preferable that the first clusters each include a portion longer than or equal to 0.5 nm and shorter than or equal to 1.5 nm.

Another embodiment of the present invention is a semiconductor device including a composite oxide semiconductor. The semiconductor device includes a composite oxide semiconductor and a pair of insulating films between which the composite oxide semiconductor is sandwiched. The composite oxide semiconductor includes a first region and a second region. The first region includes a plurality of first clusters containing In and oxygen as main components. The second region includes a plurality of second clusters containing Zn and oxygen as main components. The plurality of first clusters have portions connected to each other. The plurality of second clusters have portions connected to each other. In the case where thermal desorption spectroscopy analysis is performed in a range of higher than or equal to 100° C. and lower than or equal to 450° C., one of or both the pair of insulating films have a region where the amount of released oxygen converted into oxygen molecules is greater than or equal to $1\times10^{14}$ molecules/cm$^2$ and less than $1\times10^{16}$ molecules/cm$^2$.

Another embodiment of the present invention is a semiconductor device including a composite oxide semiconductor. The semiconductor device includes a composite oxide semiconductor and a pair of insulating films between which the composite oxide semiconductor is sandwiched. The composite oxide semiconductor includes a first region and a second region. The first region includes a plurality of first clusters containing In and oxygen as main components. The second region includes a plurality of second clusters containing oxygen and one of or both Zn and Sn as main components. The plurality of first clusters have portions connected to each other. The plurality of second clusters have portions connected to each other. In the case where thermal desorption spectroscopy analysis is performed in a range of higher than or equal to 100° C. and lower than or equal to 450° C., one of or both the pair of insulating films have a region where the amount of released oxygen converted into oxygen molecules is greater than or equal to $1\times10^{14}$ molecules/cm$^2$ and less than $1\times10^{16}$ molecules/cm$^2$.

In the above embodiments, it is preferable that each of the first region and the second region not contain Ga.

Another embodiment of the present invention is a display device including a display element and the semiconductor device of any one of the above embodiments. Another embodiment of the present invention is a display module which includes the display device and a touch sensor. Another embodiment of the present invention is an electronic device which includes the semiconductor device of any one of the above embodiments, the above display device or the above display module, and an operation key or a battery.

Another embodiment of the present invention is a method for manufacturing a composite oxide semiconductor in which a first region and a second region are mixed. The method for forming a composite oxide semiconductor includes a first step of placing a substrate in a deposition chamber, a second step of introducing one of or both an argon gas and an oxygen gas into the deposition chamber, a third step of applying voltage to a target including In, Zn, and oxygen, and a fourth step of depositing the composite oxide semiconductor over the substrate from the target. The fourth step includes a first step of sputtering the Zn from the target and a second step of sputtering the In from the target.

In the above embodiments, it is preferable that the temperature of the substrate be in the state where heating is not intentionally performed. In the above embodiments, it is preferable that, in the oxygen gas, a percentage of oxygen in a whole deposition gas is higher than or equal to 0% and lower than or equal to 30%.

Effect of the Invention

According to one embodiment of the present invention, a novel composite oxide semiconductor that can be used in a transistor including an oxide semiconductor film can be provided. According to one embodiment of the present invention, the field-effect mobility can be improved and the reliability can be improved in a transistor including an oxide semiconductor film. According to one embodiment of the present invention, a change in electrical characteristics can be prevented and the reliability can be improved in a transistor including an oxide semiconductor film. According to one embodiment of the present invention, a novel semiconductor device can be provided. According to one embodiment of the present invention, a novel display device can be provided. According to one embodiment of the present invention, a method for manufacturing a novel composite oxide semiconductor can be provided.

Note that the description of these effects does not preclude the existence of other effects. One embodiment of the present invention does not necessarily achieve all the effects. Effects other than the above will be apparent from the description of the specification, the drawings, the claims, and the like and effects other than the above can be derived from the description of the specification, the drawings, the claims, and the like.

MODE FOR CARRYING OUT THE INVENTION

Figure 1A:
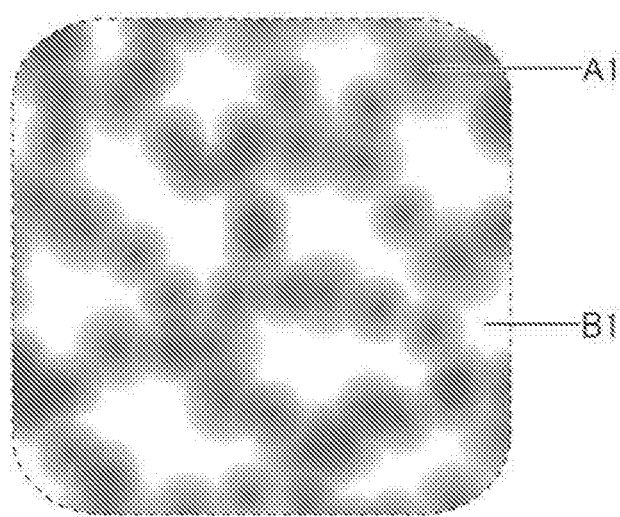
FIGS. 1A and 1B A schematic top view and a schematic cross-sectional view illustrating a composite oxide semiconductor.

Hereinafter, embodiments will be described with reference to drawings. Note that embodiments can be implemented in many different modes, and it will be readily appreciated by those skilled in the art that modes and details thereof can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, they are not limited to the illustrated scale. Note that the drawings schematically show ideal examples, and embodiments of the present invention are not limited to shapes or values shown in the drawings.

Note that in this specification, ordinal numbers "first", "second", and "third" are used in order to avoid confusion among components, and do not limit the components numerically.

In this specification, terms for describing arrangement, such as "over" and "under", are used for convenience in describing a positional relation between components with reference to drawings. Furthermore, the positional relation between components is changed as appropriate in accordance with the direction in which each component is described. Thus, terms for the description are not limited to those used in this specification, and the description can change appropriately depending on the situation.

In this specification and the like, a transistor is an element having at least three terminals of a gate, a drain, and a source. A channel region is provided between the drain (a drain terminal, a drain region, or a drain electrode) and the source (a source terminal, a source region, or a source electrode), and current can flow between the source and the drain through the channel region. Note that in this specification and the like, a channel region refers to a region through which current mainly flows.

Furthermore, functions of a source and a drain might be switched when a transistor of opposite polarity is employed or the direction of current flow is changed in circuit operation, for example. Therefore, the terms "source" and "drain" can be used interchangeably in this specification and the like.

Note that in this specification and the like, the term "electrically connected" includes the case where components are connected through an "object having any electric function". There is no particular limitation on the "object having any electric function" as long as electric signals can be transmitted and received between components that are connected through the object. Examples of the "object having any electric function" include a switching element such as a transistor, a resistor, an inductor, a capacitor, and an element with a variety of functions as well as an electrode and a wiring.

In this specification and the like, the term "parallel" indicates that the angle formed between two straight lines is greater than or equal to −10° and less than or equal to 10°. Thus, the case where the angle is greater than or equal to −5° and less than or equal to 5° is also included. The term "perpendicular" indicates that the angle formed between two straight lines is greater than or equal to 80° and less than or equal to 100°. Thus, the case where the angle is greater than or equal to 85° and less than or equal to 95° is also included.

In this specification and the like, the term "film" and the term "layer" can be interchanged with each other. For example, the term "conductive layer" can be changed into the term "conductive film" in some cases. Also, the term "insulating film" can be changed into the term "insulating layer" in some cases.

Unless otherwise specified, off-state current in this specification and the like refers to drain current of a transistor in an off state (also referred to as a non-conducting state and a cutoff state). Unless otherwise specified, the off state of an n-channel transistor means that the voltage $V_{gs}$ between its gate and source is lower than the threshold voltage $V_{th}$, and the off state of a p-channel transistor means that the voltage $V_{gs}$ between its gate and source is higher than the threshold voltage $V_{th}$. For example, the off-state current of an n-channel transistor sometimes refers to a drain current that flows when the voltage $V_{gs}$ between its gate and source is lower than the threshold voltage $V_{th}$.

The off-state current of a transistor depends on $V_{gs}$ in some cases. Thus, "the off-state current of a transistor is lower than or equal to I" means "there is $V_{gs}$ with which the off-state current of the transistor becomes lower than or equal to I" in some cases. Furthermore, "the off-state current of a transistor" means "the off-state current in an off state at predetermined $V_{gs}$, in an off state at $V_{gs}$ in a predetermined range, in an off state at $V_{gs}$ with which sufficiently reduced off-state current is obtained, or the like" in some cases.

As an example, the assumption is made of an n-channel transistor where the threshold voltage $V_{th}$ is 0.5 V and the drain current is $1 \times 10^{-9}$ A at $V_{gs}$ of 0.5 V, $1 \times 10^{-13}$ A at $V_{gs}$ of 0.1 V, $1 \times 10^{-19}$ A at $V_{gs}$ of –0.5 V, and $1 \times 10^{-22}$ A at $V_{gs}$ of –0.8 V. The drain current of the transistor is $1 \times 10^{-19}$ A or lower at $V_{gs}$ of –0.5 V or at $V_{gs}$ in the range of –0.8 V to –0.5 V; therefore, it is said that the off-state current of the transistor is $1 \times 10^{-19}$ A or lower in some cases. Since there is $V_{gs}$ at which the drain current of the transistor is $1 \times 10^{-22}$ A or lower, it is said that the off-state current of the transistor is $1 \times 10^{-22}$ A or lower in some cases.

In this specification and the like, the off-state current of a transistor with a channel width W is sometimes represented by a current value per channel width W or is sometimes represented by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like including the transistor is used (e.g., temperature in the range of 5° C. to 35° C.). The state in which the off-state current of a transistor is lower than or equal to I may indicate that there is $V_{gs}$ at which the off-state current of a transistor is lower than or equal to I at room temperature, 60° C., 85° C., 95° C., 125° C., a temperature at which the reliability of a semiconductor device or the like including the transistor is ensured, or a temperature at which the semiconductor device or the like including the transistor is used (e.g., temperature in the range of 5° C. to 35° C.).

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at $V_{ds}$ at which the reliability of a semiconductor device or the like including the transistor is ensured or $V_{ds}$ at which the semiconductor device or the like including the transistor is used. The state in which the off-state current of a transistor is lower than or equal to I may indicate that there is $V_{gs}$ at which the off-state current of the transistor is lower than or equal to I at $V_{ds}$ of 0.1 V, 0.8 V, 1 V, 1.2 V, 1.8 V, 2.5 V, 3 V, 3.3 V, 10 V, 12 V, 16 V, or 20 V, at $V_{ds}$ at which the reliability of a semiconductor device or the like including the transistor is ensured, or at $V_{ds}$ used in the semiconductor device or the like including the transistor.

In the above description of off-state current, a drain may be replaced with a source. That is, the off-state current sometimes refers to a current that flows through a source of a transistor in an off state.

In this specification and the like, the term "leakage current" sometimes expresses the same meaning as "off-state current". In this specification and the like, the off-state current sometimes refers to current that flows between a source and a drain of a transistor in an off state, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of 0 ($I_d$=0 A) and an extrapolated straight line that is tangent with the highest inclination to a plotted curve ($V_g$–$\sqrt{I_d}$ characteristics). Alternatively, the threshold voltage of a transistor may refer to a gate voltage ($V_g$) at which the value of $I_d$ [A]×L [μm]/W [μm] is $1 \times 10^{-9}$ [A] where L is channel length and W is channel width.

In this specification and the like, a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. An "insulator" in this specification and the like can be called a "semi-insulator" in some cases.

In this specification and the like, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases. Similarly, a "conductor" in this specification and the like can be called a "semiconductor" in some cases.

In this specification and the like, an impurity in a semiconductor refers to an element other than a main component of a semiconductor film. For instance, an element with a concentration of lower than 0.1 atomic % is an impurity. If an impurity is contained, the DOS (Density of States) may be formed in the semiconductor, the carrier mobility may be decreased, or the crystallinity may be decreased, for example. In the case where the semiconductor includes an oxide semiconductor, examples of the impurity which changes the characteristics of the semiconductor include Group 1 elements, Group 2 elements, Group 14 elements, Group 15 elements, and transition metals other than the main components; specific examples include hydrogen (also included in water), lithium, sodium, silicon, boron, phosphorus, carbon, and nitrogen. When the semiconductor is an oxide semiconductor, oxygen vacancies may be formed by entry of impurities such as hydrogen, for instance. Furthermore, in the case where the semiconductor includes silicon, examples of the impurity which changes the characteristics of the semiconductor include oxygen, Group 1 elements except hydrogen, Group 2 elements, Group 13 elements, and Group 15 elements.

Embodiment 1

In this embodiment, a composite oxide semiconductor of one embodiment of the present invention is described with reference to FIG. 1 to FIG. 5.

<1-1. Composite Oxide Semiconductor>

The composite oxide semiconductor of one embodiment of the present invention preferably contains at least indium. In particular, indium and zinc are preferably contained.

Typically, a composite oxide semiconductor including any one of or both In oxide and In—Zn oxide is given. Note that it is preferable that the composite oxide semiconductor of one embodiment of the present invention not contain Ga. When Ga is contained in a composite oxide semiconductor film, the strength of bonding with oxygen is high, so that formation of oxygen vacancies in the composite oxide semiconductor can be suppressed and options for a process of the transistor including the composite oxide semiconductor film can be increased. Meanwhile, when the composite oxide semiconductor film contains Ga, the on-state current and field-effect mobility of the transistor including the oxide semiconductor film might be lowered. Therefore, in order to increase the on-state current and field-effect mobility of the transistor, a structure in which the composite oxide semiconductor does not contain Ga is favorable.

The composite oxide semiconductor of one embodiment of the present invention may include one or more elements selected from Sn, W, and Hf, in addition to indium and zinc. Typically, In—Sn oxide (also referred to as ITO), In—Sn—Zn oxide, In—Hf oxide, In—Hf—Zn oxide, In—W oxide, In—W—Zn oxide, and the like are given.

Sn, W, and Hf are more strongly bonded to oxygen than In and Zn are. Thus, when the composite oxide semiconductor of one embodiment of the present invention contains one or more elements selected from Sn, W, and Hf, the elements, instead of Ga, can suppress formation of oxygen vacancies. Moreover, the valences of Sn, W, and Hf are higher than those of In and Ga. Specifically, Sn and Hf have a valence of 4 and W has a valence of 4 or 6 while In and Ga have a valence of 3. With the use of an element whose valence is higher than those of In and Ga in the composite oxide semiconductor, this element may serve as a donor source and may increase the carrier density of the composite oxide semiconductor. As described above, when the composite oxide semiconductor contains an element whose valence is higher than those of In and Ga, formation of oxygen vacancies can be suppressed and the on-state current and field-effect mobility of the transistor can be increased.

Furthermore, the composite oxide semiconductor of one embodiment of the present invention may have a structure where Si is contained in In oxide, In—Zn oxide, In—Sn oxide, In—Sn—Zn oxide, In—Hf oxide, In—Hf—Zn oxide, In—W oxide, or In—W—Zn oxide. When the composite oxide semiconductor contains Si, formation of oxygen vacancies that can be formed in the composite oxide semiconductor can be further suppressed. Note that when the content of Si is higher, for example, the content of Si in the composite oxide semiconductor is 10 atomic % or higher, the defect level in the composite oxide semiconductor might be increased. Therefore, in the case where the composite oxide semiconductor of one embodiment of the present invention contains Si, the content of Si is preferably less than 10 atomic % and further preferably less than 5 atomic %. For the composite oxide semiconductor containing Si, typically, In—Si oxide, In—Zn—Si oxide, In—Sn—Si oxide (also referred to as ITSO), and the like are given.

Figure 1B:
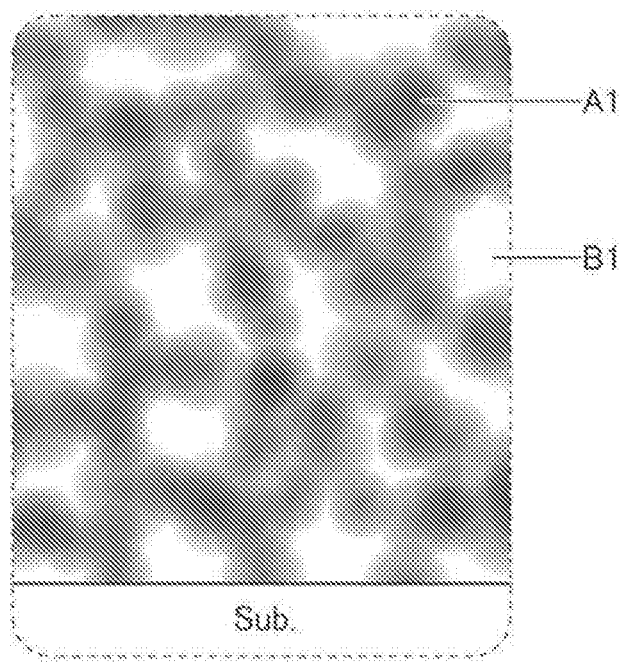

Next, the composite oxide semiconductor of one embodiment of the present invention is described with reference to FIGS. 1(A) and 1(B). FIGS. 1(A) and 1(B) are conceptual views of the composite oxide semiconductor of one embodiment of the present invention. Note that FIG. 1(A) is a conceptual view of a top surface of the composite oxide semiconductor (here, referred to as an a-b plane direction) and FIG. 1(B) is a schematic view of a cross section in which the composite oxide semiconductor is formed over a substrate Sub. (here, referred to as a c-axis direction).

Furthermore, FIG. 1(B) illustrates an example in which the composite oxide semiconductor is formed over the substrate; however, one embodiment of the present invention is not limited to this example, and an insulating film such as a base film or an interlayer film or an oxide semiconductor film may be formed between the substrate and the composite oxide semiconductor.

The composite oxide semiconductor of one embodiment of the present invention is a composite oxide semiconductor having a structure in which a region A1 and a region B1 are mixed as shown in FIGS. 1(A) and 1(B).

In the following description, the case where a composite oxide semiconductor contains indium and zinc is described. Furthermore, in the following description, indium and zinc are represented by [In] and [Zn], respectively, in some cases.

In the region A1 in FIGS. 1(A) and 1(B), [In]:[Zn]=x:y ($x>0$, $y\geq 0$). In contrast, in the region B1, [In]:[Zn]=a:b ($a>0$, $b>0$). Note that in the region A1 and the region B1, when y is larger than 0, $(x/y)>(a/b)$ is satisfied. That is, the region A1 is a region containing a higher proportion of In and the region B1 is a region containing a lower amount of In.

Note that in this specification, when the atomic proportion of In in the region A1 is greater than the atomic proportion of In in the region B1, the region A1 has a higher In concentration than the region B1. Therefore, in this specification, the region A1 is also referred to as an In-rich region and the region B1 is also referred to as an In-poor region.

For example, the In concentration in the region A1 is 1.1 or more times, preferably 2 or more times and 10 or less times that in the region B1. The region A1 is an oxide containing at least In and does not necessarily contain Zn.

Having a high In concentration, the region A1 provides a higher conductivity than the region B1 and has a function of increasing carrier mobility (field-effect mobility). Thus, when the composite oxide semiconductor of one embodiment of the present invention is used for the semiconductor layer of the transistor, the on-state current and carrier mobility of the transistor can be increased.

In contrast, having a low In concentration, the region B1 provides a lower conductivity than the region A1 and has a function of decreasing leakage current. Thus, when the composite oxide semiconductor of one embodiment of the present invention is used for the semiconductor layer of the transistor, the off-state current of the transistor can be decreased.

In the composite oxide semiconductor of one embodiment of the present invention, the region A1 and the region B1 form a composite. That is, carrier movement occurs easily in the region A1, and carrier movement does not occur easily in the region B1. Therefore, the composite oxide semiconductor of one embodiment of the present invention can be used as a material with favorable semiconductor characteristics that has high carrier mobility and excellent switching characteristics.

In other words, in the composite oxide semiconductor of one embodiment of the present invention, a first region with a high In concentration and a second region with a low In concentration are included, and the first region and the second region are connected in a cloud-like manner. Alternatively, in the composite oxide semiconductor of one embodiment of the present invention, the first region where In is distributed at a high concentration and the second region where In is not distributed at a high concentration are included, and the first region and the second region are connected in a cloud-like manner.

For example, a plurality of regions A1 are present in particulate form (also referred to as in cluster form) in the a-b plane direction and the c-axis direction as shown in FIGS. 1(A) and 1(B). Note that clusters may be distributed unevenly and irregularly. A plurality of clusters overlap with each other or are connected to each other in some cases. For example, in some cases, the states where a cluster overlaps with another cluster are connected to each other, so that the region A1 is observed to extend in a cloud-like manner.

Figure 2A:
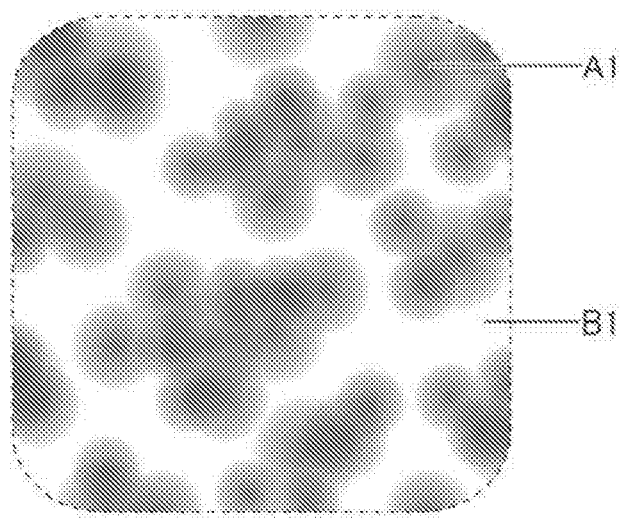
FIGS. 2A and 2B Diagrams illustrating atomic ratios of an oxide semiconductor.
Figure 2B:
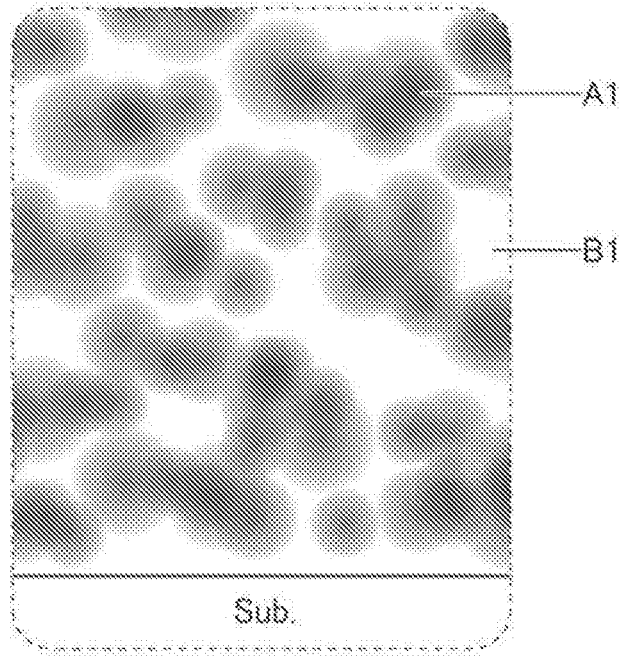

Note that as illustrated in FIGS. 1(A) and 1(B), when the regions A1 are connected to each other in the a-b plane direction, the on-state current of the transistor can be increased. However, parts of the regions A1 may be connected to each other in the a-b plane direction and the other parts of the regions A1 may be scattered. An example of such a case is illustrated in FIGS. 2(A) and 2(B). FIGS. 2(A) and 2(B) show a modification example of a conceptual view of the composite oxide semiconductor of one embodiment of the present invention.

As illustrated in FIGS. 2(A) and 2(B), the region A1 has a structure where the parts of the regions A1 are connected to each other and the other parts of the regions A1 are scattered in the region B1. With the structure illustrated in FIGS. 2(A) and 2(B), the switching characteristics of the transistor, such as an increase in the off-state current of the transistor, can be prevented. In this case, the region A1 can exist in a state of being sandwiched three-dimensionally by the regions B1. In other words, it can also be said that the region A1 is enclosed by the region B1.

From another perspective, the region B1 has a structure including a cluster (also referred to as a second cluster) that is different from a cluster (also referred to as a first cluster) included in the region A1. In this structure, the region B1 includes a plurality of second clusters and has a portion where the plurality of second clusters are connected to each other. In other words, the plurality of first clusters included in the region A1 include a portion where the first clusters are connected to each other in a cloud-like manner, and the plurality of second clusters included in the region B1 include a portion where the second clusters are connected to each other in a cloud-like manner.

Note that the proportion of the regions A1 can be adjusted in accordance with the manufacturing conditions or composition of the composite oxide semiconductor. For example, it is possible to form a composite oxide semiconductor with a lower proportion of the regions A1 than that of the regions B1 or a composite oxide semiconductor with a higher proportion of the regions A1 than that of the regions B1. In a composite oxide semiconductor with an extremely high proportion of the regions A1, depending on the observation range, the region B1 is sometimes formed in the region A1. In addition, for example, the size of the particulate region formed by the region A1 can be appropriately adjusted in accordance with the manufacturing conditions or composition of the composite oxide semiconductor.

In some cases, a clear boundary is not observed between the region A1 and the region B1. Note that the region A1 and the region B1 can be observed by EDX mapping with energy dispersive X-ray spectroscopy (EDX). For example, the diameter of a cluster in the region A1 is observed to be greater than or equal to 0.1 nm and less than or equal to 2.5 nm in the EDX mapping image of a cross-sectional photograph or a plan-view photograph in some cases. Note that the diameter of the cluster is preferably greater than or equal to 0.5 nm and less than or equal to 1.5 nm.

As described above, in the composite oxide semiconductor of one embodiment of the present invention, the region A1 and the region B1 are mixed, the function of the region A1 and the function of the region B1 are different from each other, and the region A1 and the region B1 function complementarily.

In contrast, for example, when the region A1 and the region B1 are stacked in a layered manner, interaction does not take place or is unlikely to take place between the region A1 and the region B1, so that the function of the region A1 and the function of the region B1 are independently performed in some cases. In this case, even when the carrier mobility can be increased owing to the region A1, the off-state current of the transistor might be increased. Thus, in the case where the above-described composite oxide semiconductor is used, a function of achieving high carrier mobility and a function of achieving excellent switching characteristics can be obtained at the same time. This is an advantageous effect obtained by using the composite oxide semiconductor of one embodiment of the present invention.

<1-2. Method for Manufacturing Composite Oxide Semiconductor>

Next, an example of a method for manufacturing the composite oxide semiconductor illustrated in FIGS. 1(A) and 1(B) is described with reference to FIG. 3 to FIG. 5. A composite oxide semiconductor of one embodiment of the present invention can be formed with a sputtering apparatus.

<1-3. Sputtering Apparatus>

Figure 3A:
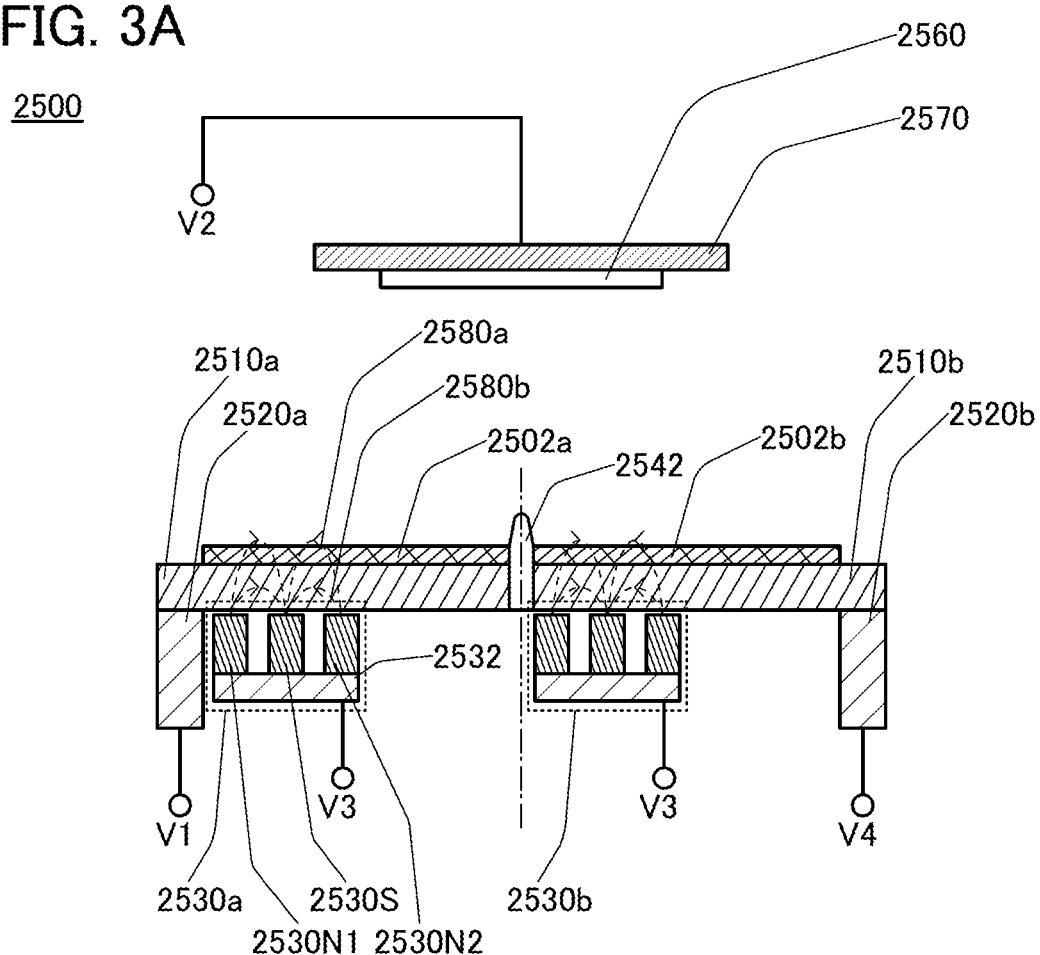
FIGS. 3A and 3B Diagrams illustrating a sputtering apparatus.
Figure 3B:
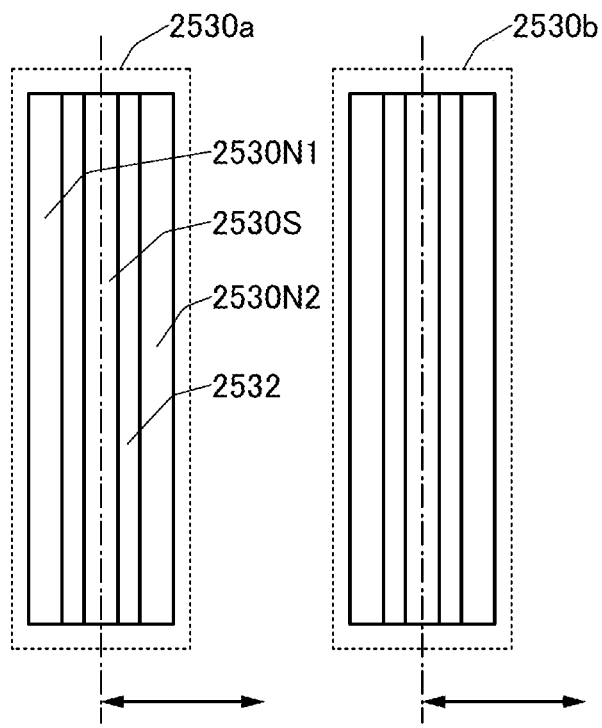

FIG. 3(A) is a cross-sectional view of a deposition chamber 2500 included in the sputtering apparatus and FIG. 3(B) is a plan view of a magnet unit 2530a and a magnet unit 2530b included in the sputtering apparatus.

The deposition chamber 2500 illustrated in FIG. 3(A) includes a target holder 2520a, a target holder 2520b, a backing plate 2510a, a backing plate 2510b, a target 2502a, a target 2502b, a member 2542, and a substrate holder 2570. Note that the target 2502a is placed over the backing plate 2510a. The backing plate 2510a is placed over the target holder 2520a. The magnet unit 2530a is placed under the target 2502a with the backing plate 2510a positioned therebetween. Furthermore, the target 2502b is placed over the backing plate 2510b. The backing plate 2510b is placed over the target holder 2520b. The magnet unit 2530b is placed under the target 2502b with the backing plate 2510b positioned therebetween.

As illustrated in FIGS. 3(A) and 3(B), the magnet unit 2530a includes a magnet 2530N1, a magnet 2530N2, a magnet 2530S, and a magnet holder 2532. The magnet 2530N1, the magnet 2530N2, and the magnet 2530S are placed over the magnet holder 2532 in the magnet unit 2530a. The magnet 2530N1 and the magnet 2530N2 are placed so as to be apart from the magnet 2530S. Note that the magnet unit 2530b has a structure similar to that of the magnet unit 2530a. When the substrate 2560 is transferred into the deposition chamber 2500, the substrate 2560 is placed in contact with the substrate holder 2570.

The target 2502a, the backing plate 2510a, and the target holder 2520a are separated from the target 2502b, the backing plate 2510b, and the target holder 2520b by the member 2542. Note that the member 2542 is preferably an insulator. The member 2542 may be a conductor or a semiconductor. The member 2542 may be a conductor or a semiconductor whose surface is covered with an insulator.

The target holder 2520a and the backing plate 2510a are fixed to each other with a screw (e.g., a bolt) and have the same potential. The target holder 2520a has a function of supporting the target 2502a with the backing plate 2510a positioned therebetween. The target holder 2520b and the backing plate 2510b are fixed to each other with a screw (e.g., a bolt) and have the same potential. The target holder 2520b has a function of supporting the target 2502b with the backing plate 2510b positioned therebetween.

The backing plate 2510a has a function of fixing the target 2502a. The backing plate 2510b has a function of fixing the target 2502b.

Note that in FIG. 3(A), magnetic lines of force 2580a and 2580b formed by the magnet unit 2530a are illustrated.

As illustrated in FIG. 3(B), the magnet unit 2530a has a structure in which the magnet 2530N1 having a rectangular or substantially rectangular shape, the magnet 2530N2 having a rectangular or substantially rectangular shape, and the magnet 2530S having a rectangular or substantially rectangular shape are fixed to the magnet holder 2532. The magnet unit 2530a can be oscillated horizontally as shown by an arrow in FIG. 3(B). For example, the magnet unit 2530a may be oscillated with a beat of greater than or equal to 0.1 Hz and less than or equal to 1 kHz.

The magnetic field over the target 2502a changes in accordance with oscillation of the magnet unit 2530a. The region with an intense magnetic field is a high-density plasma region; thus, sputtering phenomenon of the target 2502a easily occurs in the vicinity of the region. The same applies to the magnet unit 2530b.

<1-4. Manufacturing Flow of Composite Oxide Semiconductor>

Figure 4:
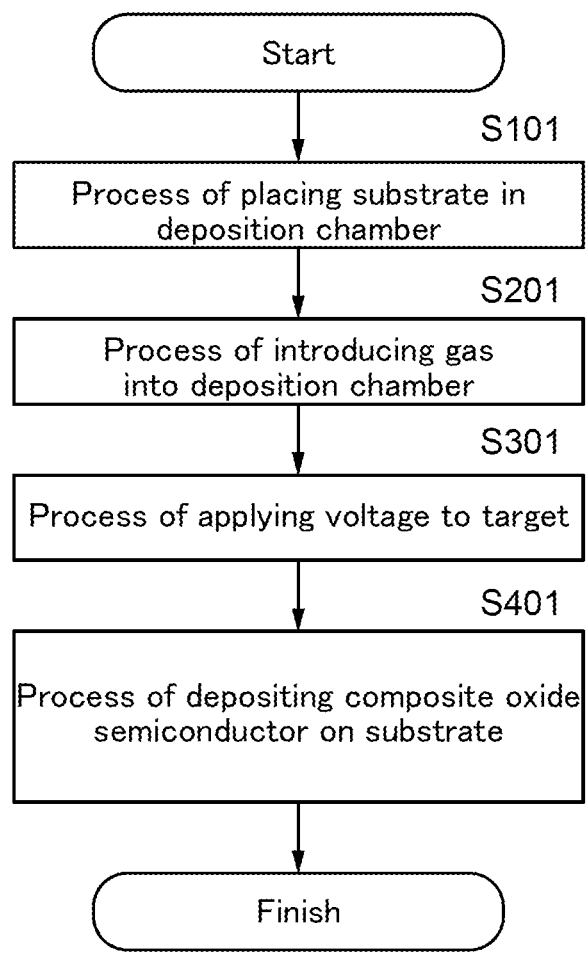
FIG. 4 A process flow chart illustrating a method for manufacturing a composite oxide semiconductor.

FIG. 4 is a process flow chart showing a method for manufacturing a composite oxide semiconductor.

The composite oxide semiconductor shown in FIGS. 1(A) and 1(B) is manufactured through at least first to fourth processes shown in FIG. 4.

[First Process: Process of Placing Substrate in Deposition Chamber]

The first process includes a process of placing a substrate in a deposition chamber (see Step S101 in FIG. 4).

In the first process, for example, the substrate 2560 is placed on the substrate holder 2570 included in the deposition chamber 2500 shown in FIG. 3.

The temperature of the substrate 2560 can be set higher than or equal to room temperature (25° C.) and lower than or equal to 200° C., preferably higher than or equal to room temperature and lower than or equal to 130° C. The substrate temperature in the above range is suitable for the case of using a large-sized glass substrate. In particular, the case where the substrate temperature at the time of the deposition of the composite oxide semiconductor is room temperature, i.e., the substrate is not heated intentionally is favorable because the substrate can be prevented from bending or warping.

The substrate 2560 may be cooled with a cooling mechanism or the like provided for the substrate holder 2570.

[Second Process: Process of Introducing Gas into Deposition Chamber]

The second process includes a process of introducing a gas into the deposition chamber (see Step S201 in FIG. 4).

In the second process, for example, a gas is introduced into the deposition chamber 2500 in FIG. 3. As the gas, one of or both an argon gas and an oxygen gas are introduced. An inert gas such as helium, xenon, or krypton may be used instead of the argon gas.

The percentage of oxygen in the whole deposition gas in forming a composite oxide semiconductor using an oxygen gas is referred to as an "oxygen flow rate percentage" in some cases. The oxygen flow rate percentage in forming a composite oxide semiconductor is higher than or equal to 0% and lower than or equal to 30%, preferably higher than or equal to 5% and lower than or equal to 30%, further preferably higher than or equal to 7% and lower than or equal to 15%. With the oxygen flow rate percentage in the above range, the carrier density of the composite oxide semiconductor can be increased.

In addition, increasing the purity of the above gas is also necessary. For example, as an oxygen gas or an argon gas used as the gas, a gas which is highly purified to have a dew point of −40° C. or lower, preferably −80° C. or lower, further preferably −100° C. or lower, still further preferably −120° C. or lower is used, whereby entry of moisture or the like into the composite oxide semiconductor can be prevented as much as possible.

The deposition chamber 2500 is preferably evacuated to high vacuum (approximately $5 \times 10^{-7}$ Pa to $1 \times 10^{-4}$ Pa) with an adsorption vacuum evacuation pump such as a cryopump so that water or the like, which is an impurity for the composite oxide semiconductor, is removed as much as possible. In particular, the partial pressure of gas molecules corresponding to H2O (gas molecules corresponding to m/z=18) in the deposition chamber 2500 in the standby mode of the sputtering apparatus is preferably lower than or equal to $1 \times 10^{-4}$ Pa, further preferably lower than or equal to $5 \times 10^{-5}$ Pa.

[Third Process: Process of Applying Voltage to Target]

The third process includes a process of applying voltage to a target (see Step S301 in FIG. 4).

In the third process, for example, voltage is applied to the target holder 2520a and the target holder 2520b in FIG. 3. As an example, a potential applied to a terminal V1 connected to the target holder 2520a is lower than a potential applied to a terminal V2 connected to the substrate holder 2570. A potential applied to a terminal V4 connected to the target holder 2520b is lower than the potential applied to the terminal V2 connected to the substrate holder 2570. The potential applied to the terminal V2 connected to the substrate holder 2570 is a ground potential. A potential applied to a terminal V3 connected to the magnet holder 2532 is a ground potential.

Note that the potentials applied to the terminal V1, the terminal V2, the terminal V3, and the terminal V4 are not limited to the above potentials. Not all the target holder 2520, the substrate holder 2570, and the magnet holder 2532 are necessarily supplied with potentials. For example, the substrate holder 2570 may be electrically floating. Note that it is assumed that a power source capable of controlling a potential to be applied is electrically connected to the terminal V1. As the power source, a DC power source, an AC power source, or an RF power source is used.

As the target 2502a and the target 2502b, a target including indium, zinc, and oxygen is preferably used. For example, an In—Zn oxide target (In:Zn=2:3 [atomic ratio])

or the like can be used as the target 2502a and the target 2502b. In the following description, the case of using an In—Zn oxide target (In:Zn=2:3 [atomic ratio]) is described.

[Fourth Process: Process of Depositing Composite Oxide Semiconductor on Substrate]

The fourth process includes a process of depositing a composite oxide semiconductor on the substrate from the target (see Step S401 in FIG. 4).

In the fourth process, for example, in the deposition chamber 2500 illustrated in FIG. 3, an argon gas or an oxygen gas is ionized to be separated into cations and electrons, and plasma is created. Then, the cations in the plasma are accelerated toward the targets 2502a and 2502b by the potentials applied to the target holders 2520a and 2520b. Sputtered particles are generated when the cations collide with the In—Zn oxide target, and the sputtered particles are deposited over the substrate 2560.

Note that when an In—Zn oxide target with an atomic ratio of In:Zn=2:3 is used as the targets 2502a and 2502b, a plurality of crystal grains with different compositions are included in the target in some cases. In many cases, for example, the diameters of the plurality of crystal grains are each 10 μm or less. In the case where, for example, crystal grains with a high proportion of In are included in the In—Zn oxide target, the proportion of the region A1 described above is increased in some cases.

<1-5. Deposition Model>

Figure 5A:
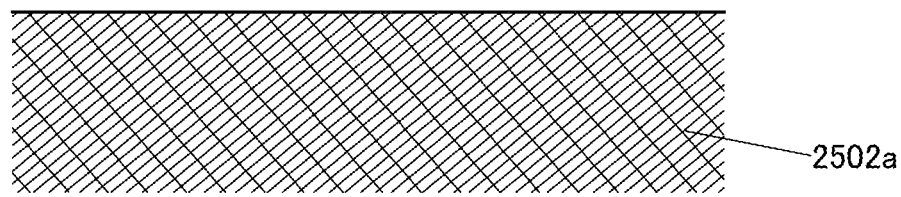
FIGS. 5A to 5C Diagrams illustrating a cross section of the vicinity of a target.
Figure 5B:
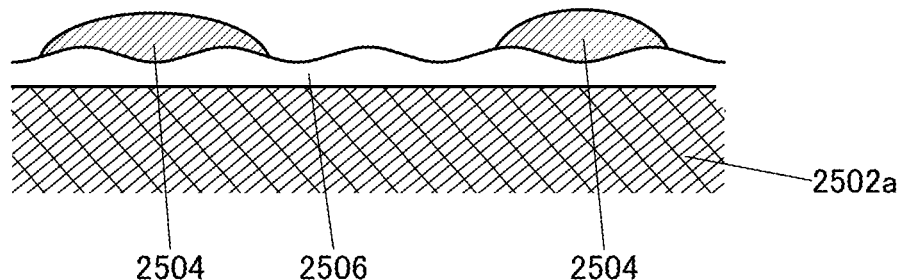
Figure 5C:
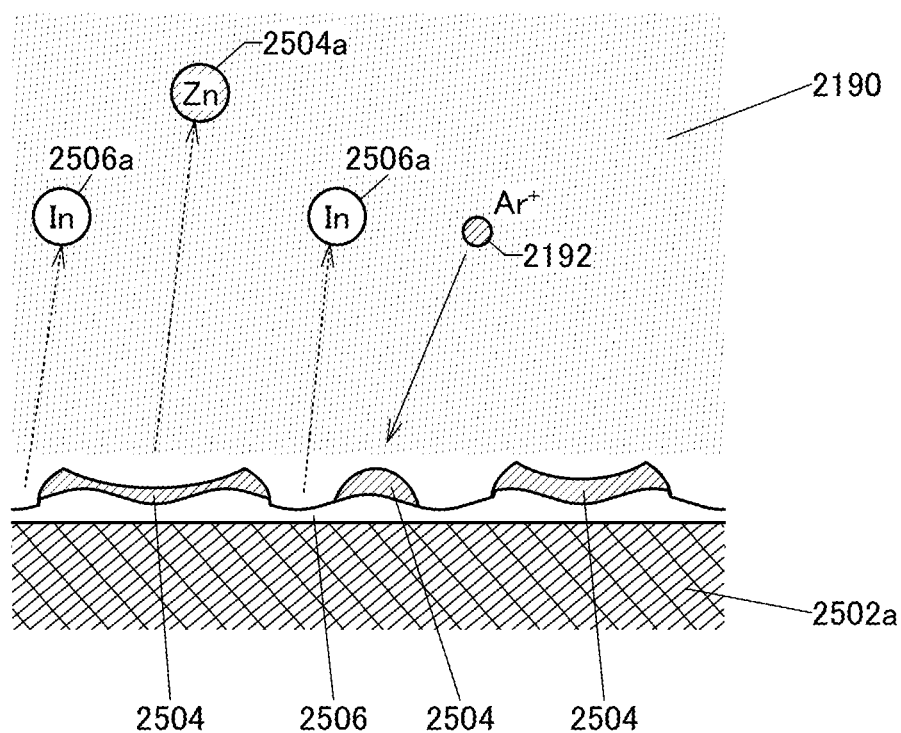

In the fourth process, a deposition model shown in FIGS. 5(A), 5(B), and 5(C) can be presumed.

FIGS. 5(A), 5(B), and 5(C) are schematic cross-sectional views of the vicinity of the target 2502a shown in FIG. 3. Note that FIG. 5(A) illustrates the state of the target before use, FIG. 5(B) illustrates the state of the target before deposition, and FIG. 5(C) illustrates the state of the target during the deposition. Note that in FIGS. 5(A), 5(B), and 5(C), the target 2502a, plasma 2190, a cation 2192, sputtered particles 2504a and 2506a, and the like are shown.

In FIG. 5(A), a surface of the target 2502a is relatively flat and its composition (e.g., the composition ratio between In and Zn) is uniform. In contrast, in FIG. 5(B), unevenness is formed and compositional segregation occurs on the surface of the target 2502a by sputtering treatment performed in advance or the like. The unevenness and the segregation can occur because of plasma (e.g., Ar plasma) generated in the sputtering treatment performed in advance. Note that FIG. 5(B) illustrates a segregation region 2504 and a segregation region 2506. Here, the segregation region 2504 is a region containing a large amount of Zn (a Zn-Rich region), and the segregation region 2506 is a region containing a large amount of In (an In-Rich region).

[First Step]

In FIG. 5(C), an argon gas or an oxygen gas is ionized to be separated into the cation 2192 and an electron (not illustrated), and the plasma 2190 is created. After that, the cations 2192 in the plasma 2190 are accelerated toward the target 2502a (here, an In—Zn oxide target). The cations 2192 collide with the In—Zn oxide target, whereby the sputtered particles 2504a and 2506a are generated and the sputtered particles 2504a and 2506a are ejected from the In—Zn oxide target. Note that since the sputtered particles 2504a are ejected from the segregation region 2504, they form a Zn-Rich cluster in some cases. Since the sputtered particles 2506a are ejected from the segregation region 2506, they form an In-Rich cluster in some cases.

When an In—Zn oxide target is used, presumably, the sputtered particles 2504a are preferentially sputtered first from the segregation region 2504. This is because Zn, whose relative atomic mass is lower than that of In, is preferentially ejected from the In—Zn oxide target by collision of the cation 2192 with the In—Zn oxide target. The sputtered particles 2504a that are ejected are deposited over the substrate, thereby forming the region B1 illustrated in FIGS. 1(A) and 1(B).

[Second Step]

Next, as illustrated in FIG. 5(C), the sputtered particles 2506a are sputtered from the segregation region 2506. The sputtered particles 2506a collide with the region B1 that has been formed on the substrate, thereby forming the region A1 illustrated in FIGS. 1(A) and 1(B).

As illustrated in FIG. 5(C), the target 2502a is subjected to sputtering throughout the deposition; thus, generation of the segregation region 2504 and disappearance of the segregation region 2504 occur intermittently.

The deposition model including the above first step and the above second step is repeated, whereby the composite oxide semiconductor of one embodiment of the present invention and shown in FIGS. 1(A) and 1(B) can be obtained.

That is, the sputtered particles (2504a and 2506a) are respectively ejected from the In-Rich segregation region 2506 and the Zn-Rich segregation region 2504 to be deposited over the substrate. Over the substrate, the In-Rich regions are connected to each other in a cloud-like manner, so that the composite oxide semiconductor of one embodiment of the present invention as illustrated in FIGS. 1(A) and 1(B) can be formed. In a film of the composite oxide semiconductor, the In-Rich regions are connected to each other in a cloud-like manner, whereby a transistor using the composite oxide semiconductor has a high on-state current ($I_{on}$) and high field-effect mobility (μFE).

In this manner, for a transistor having a high on-state current ($I_{on}$) and high field-effect mobility (μFE), In is of importance and other metals (e.g., Ga) are not always necessary.

Note that the manufacturing method is not limited to the above-described sputtering method, and a pulsed laser deposition (PLD) method, a plasma-enhanced chemical vapor deposition (PECVD) method, a thermal CVD (Chemical Vapor Deposition) method, an ALD (Atomic Layer Deposition) method, a vacuum evaporation method, or the like may be used. As an example of the thermal CVD method, a MOCVD (Metal Organic Chemical Vapor Deposition) method can be given.

<1-7. Transistor Including Composite Oxide Semiconductor>

Next, the case where the above-described composite oxide semiconductor is used in a transistor is described.

The composite oxide semiconductor of one embodiment of the present invention can be suitably used for a semiconductor film of a transistor, specifically for an oxide semiconductor film of a transistor. When the above-described composite oxide semiconductor is used for a transistor, the transistor having high carrier mobility and excellent switching characteristics can be achieved. In addition, the transistor having high reliability can be achieved. In the following description, a composite oxide semiconductor is described as an oxide semiconductor film.

An oxide semiconductor film with a low carrier density is preferably used for the transistor. For example, the carrier density of the oxide semiconductor film is lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$.

In the case where the carrier density of the oxide semiconductor film is reduced, the concentration of impurities in the oxide semiconductor film is reduced so that the density of defect states can be reduced. In this specification and the like, a state with a low impurity concentration and a low density of defect states is referred to as a highly purified intrinsic or substantially highly purified intrinsic state. A highly purified intrinsic or substantially highly purified intrinsic oxide semiconductor film has few carrier generation sources, and thus the carrier density can be reduced. A highly purified intrinsic or substantially highly purified intrinsic oxide semiconductor film has a low density of defect states and accordingly has a low density of trap states in some cases.

Charges trapped by the trap states in the oxide semiconductor film take a long time to be released and may behave like fixed charges. Thus, in a transistor whose channel region is formed in the oxide semiconductor having a high density of trap states, the electrical characteristics are unstable in some cases.

Thus, to obtain stable electrical characteristics of the transistor, it is effective to reduce the concentration of impurities in the oxide semiconductor film. In order to reduce the concentration of impurities in the oxide semiconductor film, the concentration of impurities in a film that is adjacent to the oxide semiconductor film is preferably reduced. As examples of the impurities, hydrogen, nitrogen, an alkali metal, an alkaline earth metal, iron, nickel, silicon, and the like are given.

Here, the influence of impurities in the oxide semiconductor film is described.

When silicon or carbon that is one of Group 14 elements is contained in the oxide semiconductor film, defect states are formed in the oxide semiconductor. Thus, the concentration of silicon or carbon in the oxide semiconductor and the concentration of silicon or carbon around an interface with the oxide semiconductor (the concentration measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor film contains an alkali metal or alkaline earth metal, defect states are formed and carriers are generated, in some cases. Thus, a transistor including an oxide semiconductor film which contains an alkali metal or alkaline earth metal is likely to be normally on. Therefore, it is preferable to reduce the concentration of an alkali metal or alkaline earth metal in the oxide semiconductor film. Specifically, the concentration of an alkali metal or alkaline earth metal in the oxide semiconductor film measured by SIMS is set lower than or equal to $1\times10^{18}$ atoms/cm$^3$, preferably lower than or equal to $2\times10^{16}$ atoms/cm$^3$.

When the oxide semiconductor film contains nitrogen, electrons serving as carriers are generated, carrier density is increased, and the oxide semiconductor film easily becomes n-type. As a result, a transistor in which an oxide semiconductor containing nitrogen is used as a semiconductor is likely to be normally on. For this reason, nitrogen in the oxide semiconductor is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in the oxide semiconductor film reacts with oxygen bonded to a metal atom to be water, and thus an oxygen vacancy ($V_o$) is formed in some cases. Due to entry of hydrogen into the oxygen vacancy ($V_o$), an electron serving as a carrier is generated in some cases. Furthermore, in some cases, bonding of part of hydrogen to oxygen bonded to a metal atom causes generation of an electron serving as a carrier. Thus, a transistor including an oxide semiconductor which contains hydrogen is likely to be normally on. Accordingly, it is preferable that hydrogen in the oxide semiconductor be reduced as much as possible. Specifically, the hydrogen concentration of the oxide semiconductor measured by SIMS is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

The oxygen vacancies ($V_o$) in the oxide semiconductor film can be reduced by introduction of oxygen into the oxide semiconductor film. That is, the oxygen vacancies ($V_o$) disappear when the oxygen vacancies ($V_o$) in the oxide semiconductor film are filled with oxygen. Accordingly, diffusion of oxygen into the oxide semiconductor film can reduce the amount of oxygen vacancies ($V_o$) in the oxide semiconductor film and improve the reliability of the transistor.

As a method for introducing oxygen into the oxide semiconductor film, for example, an oxide in which the oxygen content is higher than the oxygen content in the stoichiometric composition can be provided in contact with the oxide semiconductor. That is, in the oxide, a region containing oxygen in excess of that in the stoichiometric composition (hereinafter also referred to as an excess oxygen region) is preferably formed. In particular, in the case of using an oxide semiconductor film in a transistor, an oxide including an excess oxygen region is provided in a base film, an interlayer film, or the like in the vicinity of the transistor, whereby oxygen vacancies in the transistor are reduced, and the reliability can be improved.

When an oxide semiconductor film in which impurities are sufficiently reduced is used for a channel formation region of a transistor, the transistor can have stable electrical characteristics.

<1-8. Classification of Oxide Semiconductor Film>

Next, classification of oxide semiconductor films will be described.

An oxide semiconductor film is classified into a single crystal oxide semiconductor film and a non-single-crystal oxide semiconductor film. Examples of the non-single-crystal oxide semiconductor film include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

From another perspective, an oxide semiconductor film is classified into an amorphous oxide semiconductor film and a crystalline oxide semiconductor film. Examples of the crystalline oxide semiconductor film include a single-crystal oxide semiconductor film, a CAAC-OS, a polycrystalline oxide semiconductor film, and an nc-OS.

An amorphous structure is generally thought to be isotropic and have no non-uniform structure, to be metastable and not to have fixed positions of atoms, to have a flexible bond angle, and to have a short-range order but have no long-range order, for example.

In other words, a stable oxide semiconductor film cannot be called a completely amorphous oxide semiconductor film. Moreover, an oxide semiconductor film that is not isotropic (e.g., an oxide semiconductor film that has a periodic structure in a microscopic region) cannot be called a completely amorphous oxide semiconductor film. In contrast, an a-like OS, which is not isotropic, has an unstable structure that contains a void. Because of its instability, an a-like OS has physical properties similar to those of an amorphous oxide semiconductor film.

[CAAC-OS]

First, a CAAC-OS is described.

A CAAC-OS is one kind of oxide semiconductor films and has a plurality of c-axis aligned crystal parts (also referred to as pellets).

The CAAC-OS is an oxide semiconductor film with high crystallinity. Entry of impurities, formation of defects, or the like might decrease the crystallinity of an oxide semiconductor film; thus, it can also be said that the CAAC-OS is an oxide semiconductor film that has few impurities and defects (e.g., oxygen vacancies).

Note that impurities mean an element other than the main components of an oxide semiconductor film, such as hydrogen, carbon, silicon, and a transition metal element. For example, an element, e.g., silicon, having higher strength of bonding to oxygen than a metal element contained in an oxide semiconductor film extracts oxygen from the oxide semiconductor film, which results in disorder of the atomic arrangement of the oxide semiconductor film and reduction in crystallinity. A heavy metal such as iron or nickel, argon, carbon dioxide, or the like has a large atomic radius (or molecular radius), and thus disturbs the atomic arrangement of the oxide semiconductor film and decreases crystallinity.

[nc-OS]

Next, an nc-OS is described.

In the case where an nc-OS is analyzed by XRD, when the structure of the nc-OS is analyzed by an out-of-plane method, a peak indicating orientation does not appear. That is, a crystal of an nc-OS does not have orientation.

The nc-OS is an oxide semiconductor film that has higher regularity than an amorphous oxide semiconductor film. Thus, the nc-OS has a lower density of defect states than the a-like OS and the amorphous oxide semiconductor film. Note that there is no regularity of crystal orientation between different pellets in the nc-OS. Therefore, the nc-OS has a higher density of defect states than the CAAC-OS in some cases.

[A-Like OS]

An a-like OS is an oxide semiconductor film having a structure between the nc-OS and the amorphous oxide semiconductor film.

The a-like OS has a void or a low-density region. The a-like OS has an unstable structure because it includes a void.

The a-like OS has a lower density than the nc-OS and the CAAC-OS because it includes a void.

As described above, oxide semiconductor films have various structures and various properties. In the oxide semiconductor film, two or more kinds of an amorphous oxide semiconductor film, an a-like OS, an nc-OS, and a CAAC-OS may be mixed.

Note that the region A1 described above is preferably a non-single crystal. The region B1 is preferably a non-single crystal. The region A1 and the region B1 may include different crystals.

At least part of this embodiment can be implemented in combination with the other embodiments described in this specification as appropriate.

Embodiment 2

In this embodiment, a semiconductor device using the composite oxide semiconductor of one embodiment of the present invention, specifically a transistor, is described with reference to FIG. 6 to FIG. 23.

<2-1. Structure Example 1 of Transistor>

Figure 6A:
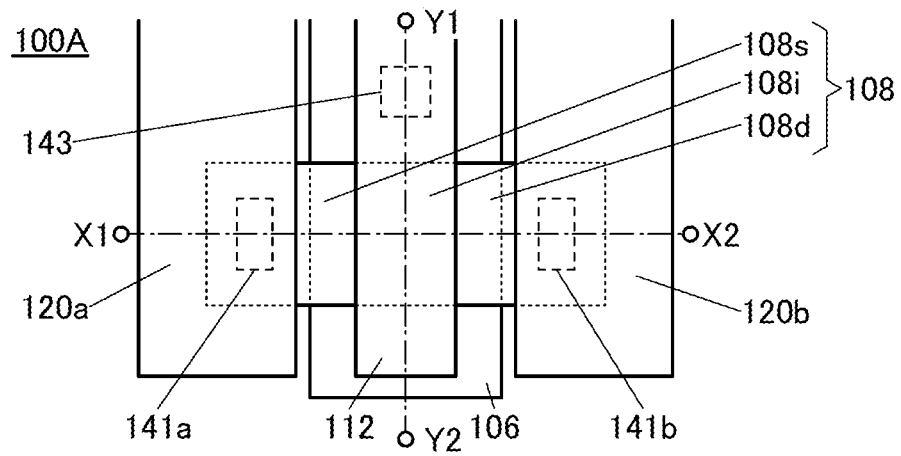
FIGS. 6A to 6C A top view and cross-sectional views illustrating a semiconductor device.
Figure 6B:
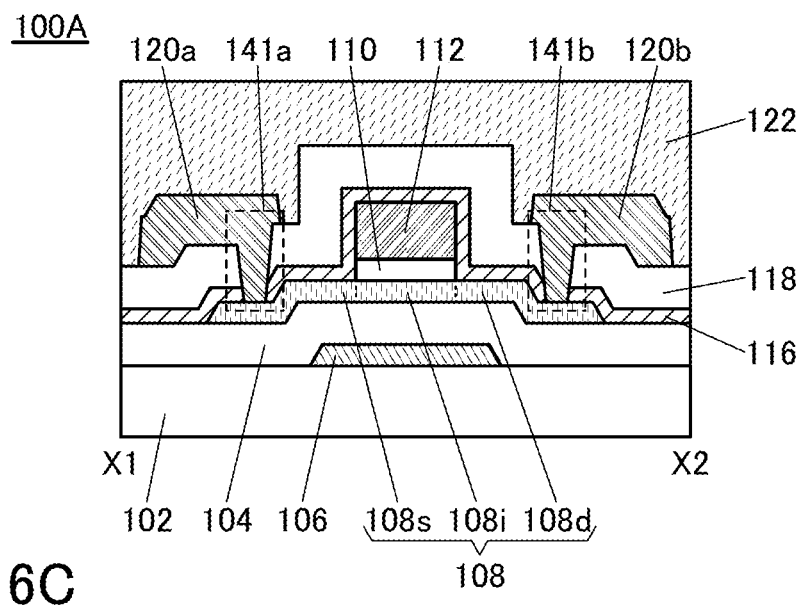
Figure 6C:
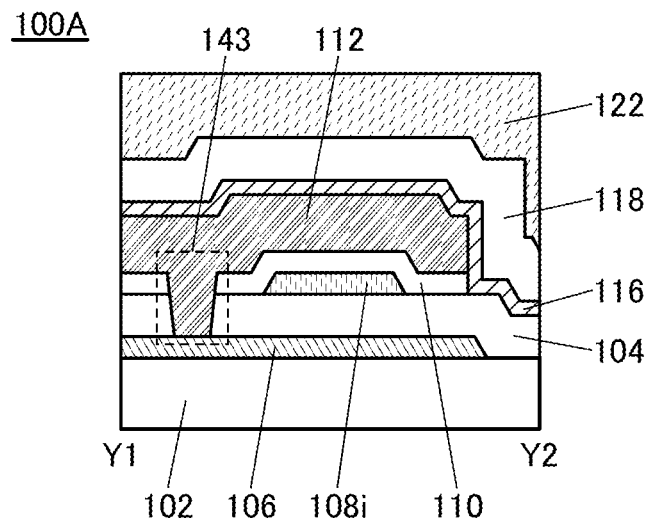

FIG. 6(A) is a top view of a transistor 100A, FIG. 6(B) is a cross-sectional view taken along the dashed-dotted line X1-X2 in FIG. 6(A), and FIG. 6(C) is a cross-sectional view taken along the dashed-dotted line Y1-Y2 in FIG. 6(A). For clarity, components such as an insulating film 110 are omitted in the illustration in FIG. 6(A). Note that as in FIG. 6(A), some components are omitted in the illustration in some cases in top views of transistors also in the following drawings. Furthermore, the direction of the dashed-dotted line X1-X2 is referred to as a channel length (L) direction and the direction of the dashed-dotted line Y1-Y2 is referred to as a channel width (W) direction in some cases.

The transistor 100A illustrated in FIGS. 6(A), 6(B), and 6(C) includes a conductive film 106 over a substrate 102; an insulating film 104 over the conductive film 106; an oxide semiconductor film 108 over the insulating film 104; the insulating film 110 over the oxide semiconductor film 108; a conductive film 112 over the insulating film 110; and an insulating film 116 over the insulating film 104, the oxide semiconductor film 108, and the conductive film 112. Note that the oxide semiconductor film 108 includes a channel region 108$i$ overlapping with the conductive film 112, a source region 108$s$ in contact with the insulating film 116, and a drain region 108$d$ in contact with the insulating film 116.

Note that the oxide semiconductor film 108 includes the composite oxide semiconductor of one embodiment of the present invention described in Embodiment 1. The composite oxide semiconductor of one embodiment of the present invention is used for the oxide semiconductor film 108, whereby a transistor with high on-state current and field-effect mobility can be provided.

Furthermore, the insulating film 116 contains nitrogen or hydrogen. The insulating film 116 is in contact with the source region 108$s$ and the drain region 108$d$, so that nitrogen or hydrogen in the insulating film 116 is added to the source region 108$s$ and the drain region 108$d$. The source region 108$s$ and the drain region 108$d$ each have a high carrier density when nitrogen or hydrogen is added thereto.

The transistor 100A may further include an insulating film 118 over the insulating film 116, a conductive film 120$a$ electrically connected to the source region 108$s$ through an opening 141$a$ provided in the insulating films 116 and 118, and a conductive film 120$b$ electrically connected to the drain region 108$d$ through an opening 141$b$ provided in the insulating films 116 and 118. In addition, an insulating film 122 may be provided over the insulating film 118, the conductive film 120$a$, and the conductive film 120$b$. Although the structure where the insulating film 122 is provided is shown in FIGS. 6(B) and 6(C), one embodiment of the present invention is not limited thereto, and the insulating film 122 is not necessarily provided.

In this specification and the like, the insulating film 104 may be referred to as a first insulating film, the insulating film 110 may be referred to as a second insulating film, the insulating film 116 may be referred to as a third insulating film, the insulating film 118 may be referred to as a fourth insulating film, and the insulating film 122 may be referred to as a fifth insulating film. The insulating film 104 functions as a first gate insulating film and the insulating film 110 functions as a second gate insulating film. The insulating films 116 and 118 function as a protective insulating film and the insulating film 122 functions as a planarization insulating film.

The insulating film 110 includes an excess oxygen region. Since the insulating film 110 includes the excess oxygen region, excess oxygen can be supplied to the channel region 108i included in the oxide semiconductor film 108. As a result, oxygen vacancies that might be formed in the channel region 108i can be filled with excess oxygen, which can provide a highly reliable semiconductor device.

When thermal desorption spectroscopy analysis is performed in a range of higher than or equal to 100° C. and lower than or equal to 450° C., the insulating film 110 has a region where the amount of released oxygen converted into oxygen molecules is greater than or equal to $1\times10^{14}$ molecules/cm$^2$ and less than $1\times10^{16}$ molecules/cm$^2$. With the structure having the above-described amount of released oxygen, oxygen vacancies that might be formed in the channel region 108i can be favorably filled.

Note that oxygen vacancies which might be formed in the channel region 108i may be filled with oxygen which is different from the oxygen contained in the insulating film 110. Specifically, it is preferable that, after the oxide semiconductor film 108 is processed into an island shape, oxygen supplying treatment for filling oxygen vacancies in the channel region 108i be performed by performing heat treatment containing oxygen or plasma treatment containing oxygen.

Since the composite oxide semiconductor of one embodiment of the present invention has a structure which does not contain Ga, oxygen vacancies are easily formed in some cases as compared with a structure which contains Ga. Thus, the insulating film 110 has a structure having the amount of released oxygen in the above range or has a structure in which the above-described oxygen supplying treatment is performed, whereby oxygen vacancies in the channel region 108i in the oxide semiconductor film 108 can be filled.

Furthermore, the oxygen vacancies in the composite oxide semiconductor are filled, whereby a shallow defect state (also referred to as sDOS) which might be formed in the composite oxide semiconductor can be reduced. The sDOS is favorably reduced, in which case the on-state current ($I_{on}$) and field-effect mobility (μFE) of the transistor can be increased.

To supply excess oxygen to the oxide semiconductor film 108, excess oxygen may be supplied to the insulating film 104 that is formed under the oxide semiconductor film 108. That is, the insulating film 104 may have a structure including a region where the amount of released oxygen is in the above range. However, in the case of this structure, excess oxygen contained in the insulating film 104 might also be supplied to the source region 108s and the drain region 108d included in the oxide semiconductor film 108. When excess oxygen is supplied to the source region 108s and the drain region 108d, the resistance of the source region 108s and the drain region 108d might be increased.

In contrast, in a structure in which the insulating film 110 formed over the oxide semiconductor film 108 contains excess oxygen, excess oxygen can be selectively supplied only to the channel region 108i. Alternatively, excess oxygen is supplied to the channel region 108i, the source region 108s, and the drain region 108d, and then the carrier density of the source region 108s and the drain region 108d is selectively increased, in which case an increase in the resistance of the source region 108s and the drain region 108d can be prevented. Thus, in the case where the carrier density of the channel region 108i can be selectively increased by excess oxygen from the insulating film 110, a structure where the insulating film 104 does not contain excess oxygen is preferable.

Furthermore, each of the source region 108s and the drain region 108d included in the oxide semiconductor film 108 preferably contains an element that forms an oxygen vacancy or an element that is bonded to an oxygen vacancy. Typical examples of the element that forms an oxygen vacancy or the element that is bonded to an oxygen vacancy include hydrogen, boron, carbon, nitrogen, fluorine, phosphorus, sulfur, chlorine, titanium, and a rare gas. Typical examples of the rare gas element are helium, neon, argon, krypton, and xenon. In the case where one or more of the above elements that form an oxygen vacancy are contained in the insulating film 116, the element or elements are diffused from the insulating film 116 to the source region 108s and the drain region 108d. In addition or alternatively, the element or elements are added to the source region 108s and the drain region 108d by impurity addition treatment.

When an impurity element is added to the oxide semiconductor film, a bond between a metal element and oxygen in the oxide semiconductor film is cut, and an oxygen vacancy is formed. Alternatively, when the impurity element is added to the oxide semiconductor film, oxygen bonded to a metal element in the oxide semiconductor film is bonded to the impurity element, and the oxygen is released from the metal element, so that an oxygen vacancy is formed. As a result, the carrier density of the oxide semiconductor film is increased and thus the conductivity thereof becomes higher.

Figure 7:
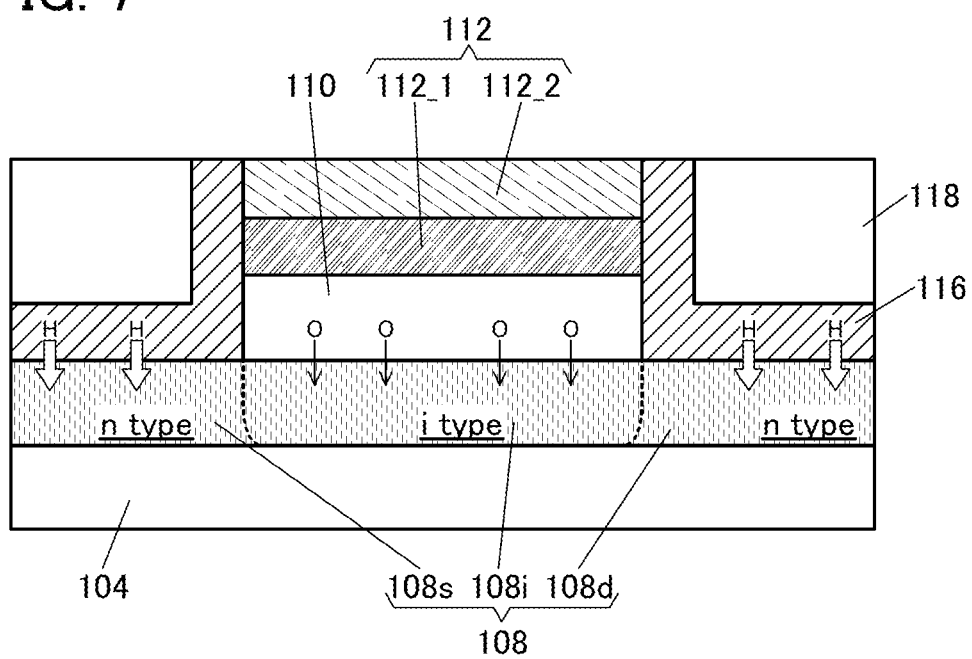
FIG. 7 A diagram illustrating a cross section of the vicinity of an oxide semiconductor film.

FIG. 7 shows an enlarged view of the vicinity of the oxide semiconductor film 108 in FIG. 6(B). As illustrated in FIG. 7, oxygen (O) is supplied from the insulating film 110 to the channel region 108i by heat treatment or the like, so that oxygen vacancies are reduced. As a result, the channel region 108i can be of an i-type. Meanwhile, hydrogen (H) is supplied from the insulating film 116 to the source region 108s and the drain region 108d and this hydrogen and an oxygen vacancy are bonded. Thus, the source region 108s and the drain region 108d can be of an n-type. Examples of the above hydrogen include hydrogen contained in a deposition gas at the time of forming the insulating film 116 and hydrogen released from the insulating film 116 because of heat treatment or the like.

The conductive film 106 functions as a first gate electrode, the conductive film 112 functions as a second gate electrode, the conductive film 120a functions as a source electrode, and the conductive film 120b functions as a drain electrode.

As illustrated in FIG. 6(C), an opening 143 is provided in the insulating films 104 and 110. The conductive film 106 is electrically connected to the conductive film 112 through the opening 143. Thus, the same potential is applied to the conductive film 106 and the conductive film 112. Note that different potentials may be applied to the conductive film 106 and the conductive film 112 without providing the opening 143. Alternatively, the conductive film 106 may be used as a light-blocking film without providing the opening 143. When the conductive film 106 is formed using a light-blocking material, for example, light irradiating the channel region 108i from the bottom can be reduced.

As illustrated in FIGS. 6(B) and 6(C), the oxide semiconductor film 108 is positioned to face the conductive film 106 functioning as the first gate electrode and the conductive film 112 functioning as the second gate electrode and is interposed between the conductive films which function as two gate electrodes.

Furthermore, the length of the conductive film 112 in the channel width direction is larger than the length of the oxide semiconductor film 108 in the channel width direction. In the channel width direction, the whole oxide semiconductor film 108 is covered with the conductive film 112 with the insulating film 110 interposed therebetween. Since the conductive film 112 is connected to the conductive film 106 through the opening 143 provided in the insulating film 104 and the insulating film 110, one of the side surfaces of the oxide semiconductor film 108 in the channel width direction faces the conductive film 112 with the insulating film 110 interposed therebetween.

In other words, in the channel width direction of the transistor 100A, the conductive film 106 and the conductive film 112 are connected to each other through the opening 143 provided in the insulating film 104 and the insulating film 110 and surround the oxide semiconductor film 108 with the insulating films 104 and 110 interposed therebetween.

Such a structure enables the oxide semiconductor film 108 included in the transistor 100A to be electrically surrounded by electric fields of the conductive film 106 functioning as the first gate electrode and the conductive film 112 functioning as the second gate electrode. A device structure of a transistor, like that of the transistor 100A, in which electric fields of a first gate electrode and a second gate electrode electrically surround the oxide semiconductor film 108 in which a channel region is formed can be referred to as a surrounded channel (S-channel) structure. Note that the transistor 100A can also be called a dual-gate structure owing to the number of gate electrodes.

Since the transistor 100A has the S-channel structure, an electric field for inducing a channel can be effectively applied to the oxide semiconductor film 108 by the conductive film 106 or the conductive film 112; thus, the current drive capability of the transistor 100A can be improved and high on-state current characteristics can be obtained. Since the on-state current can be increased, it is possible to miniaturize the transistor 100A. Furthermore, since the transistor 100A has a structure in which the metal oxide 108 has a structure surrounded by the conductive film 106 and the conductive film 112, the mechanical strength of the transistor 100A can be increased.

When seen in the channel width direction of the transistor 100A, an opening different from the opening 143 may be formed on the side of the oxide semiconductor film 108 on which the opening 143 is not formed.

The transistor 100A may be called a TGSA (top gate self align) FET from the position of the conductive film 112 relative to the oxide semiconductor film 108 or the formation method of the conductive film 112. Note that the semiconductor device of one embodiment of the present invention is not limited to this and may be a BGTC (bottom gate top contact) FET.

<2-2. Structure Example 2 of Transistor>

Figure 8A:
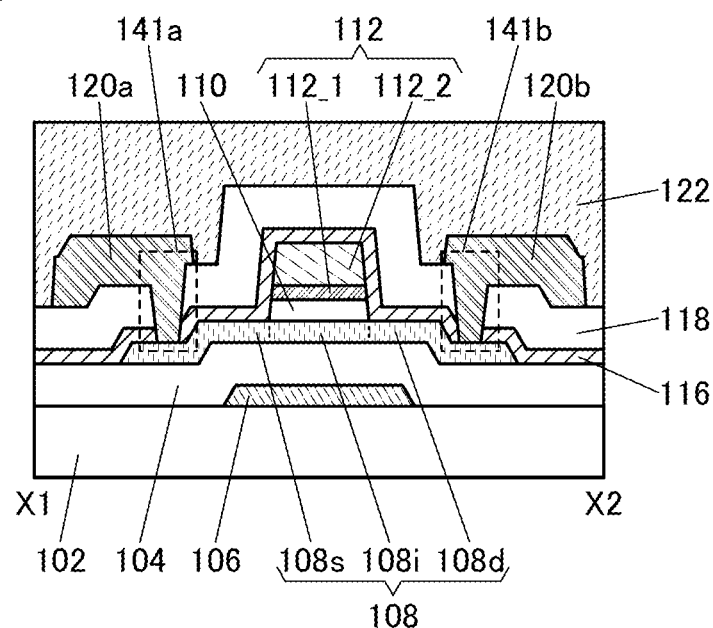
FIGS. 8A and 8B Cross-sectional views illustrating a semiconductor device.
Figure 8B:
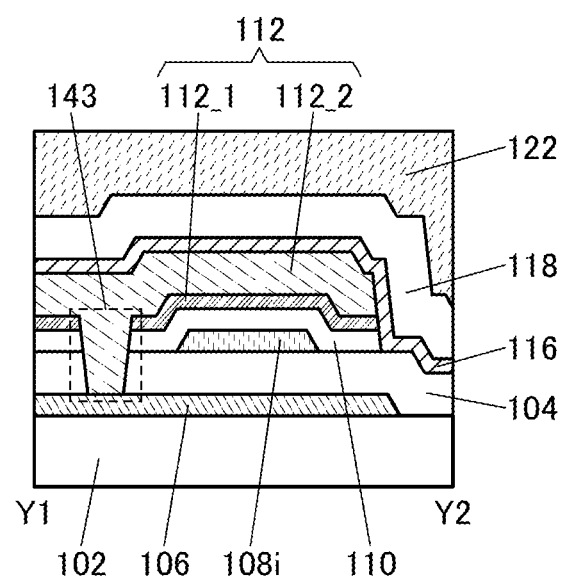
Figure 9A:
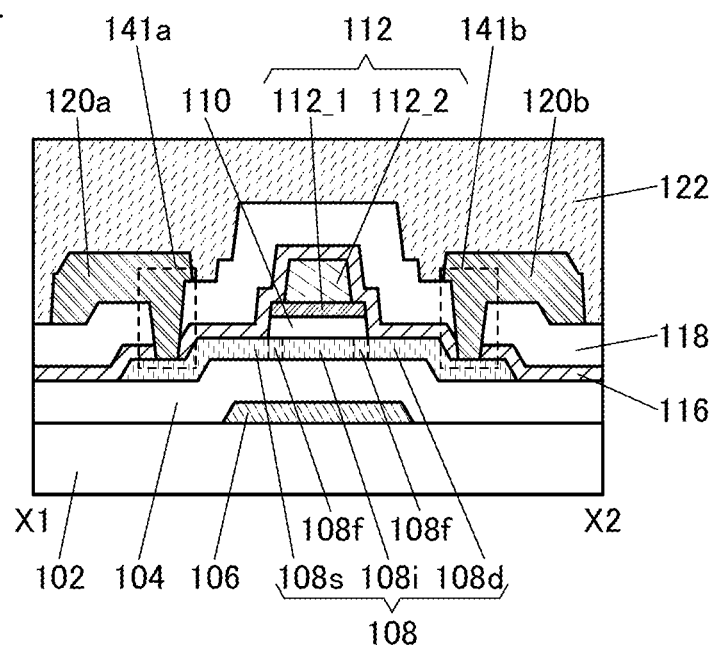
FIGS. 9A and 9B Cross-sectional views illustrating a semiconductor device.
Figure 9B:
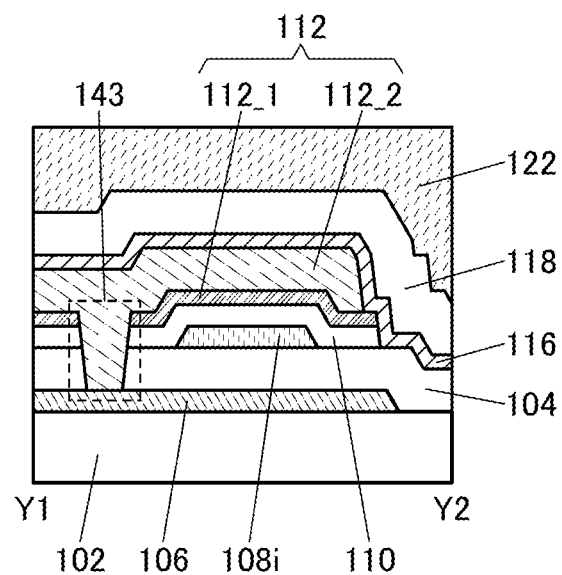
Figure 10A:
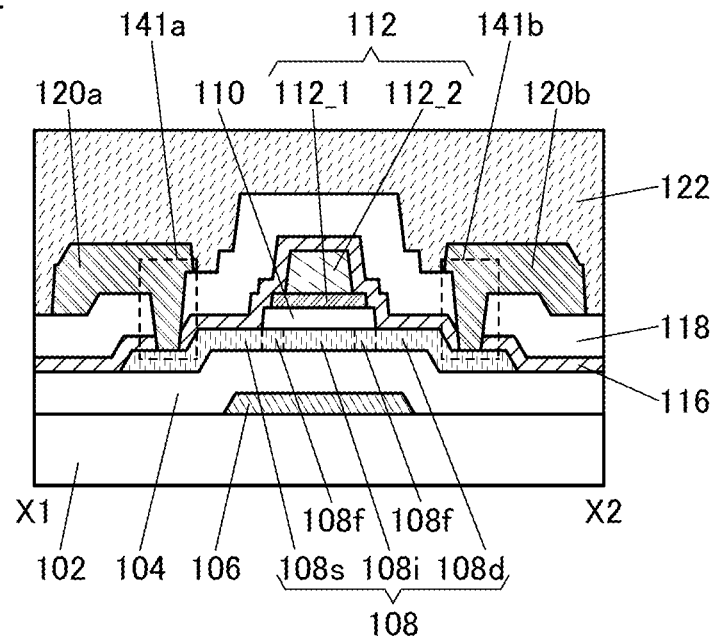
FIGS. 10A and 10B Cross-sectional views illustrating a semiconductor device.
Figure 10B:
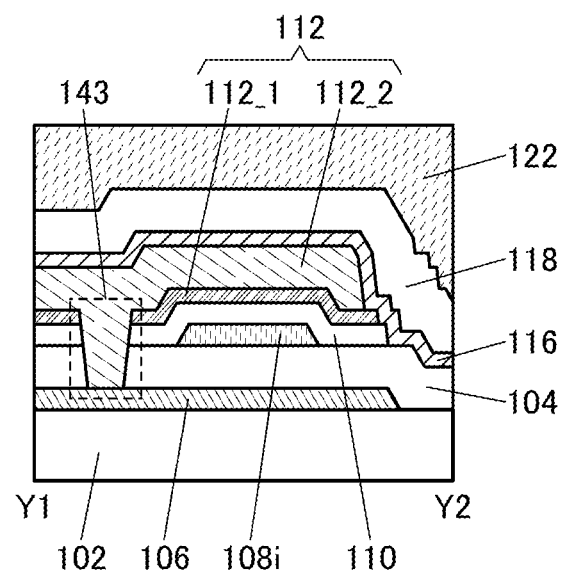

FIGS. 8(A) and 8(B) are cross-sectional views of a transistor 100B. FIGS. 9(A) and 9(B) are cross-sectional views of a transistor 100C. FIGS. 10(A) and 10(B) are cross-sectional views of a transistor 100D. The top views of the transistor 100B, the transistor 100C, and the transistor 100D are similar to that of the transistor 100A illustrated in FIG. 6(A) and thus the description is omitted here.

The transistor 100B illustrated in FIGS. 8(A) and 8(B) is different from the transistor 100A in the stacked-layer structure of the conductive film 112, the shape of the conductive film 112, and the shape of the insulating film 110.

The conductive film 112 in the transistor 100B includes a conductive film 112_1 over the insulating film 110 and a conductive film 112_2 over the conductive film 112_1. For example, an oxide conductive film is used as the conductive film 112_1, so that excess oxygen can be added to the insulating film 110. The above oxide conductive film can be formed by a sputtering method in an atmosphere containing an oxygen gas. Examples of the above oxide conductive film include In—Sn oxide, In—Zn oxide, In—W oxide, In—W—Zn oxide, In—Sn—Si oxide, and In—Ga—Zn oxide.

As illustrated in FIG. 8(B), the conductive film 112_2 is connected to the conductive film 106 through the opening 143. When the opening 143 is formed, by forming the opening 143 after a conductive film to be the conductive film 112_1 is formed, the shape illustrated in FIG. 8(B) can be obtained. In the case where an oxide conductive film is used as the conductive film 112_1, the structure in which the conductive film 112_2 is connected to the conductive film 106 can decrease the connection resistance between the conductive film 112 and the conductive film 106.

The conductive film 112 and the insulating film 110 of the transistor 100B have a tapered shape. More specifically, the lower end portion of the conductive film 112 is formed outward from the upper end portion of the conductive film 112. The lower end portion of the insulating film 110 is formed outward from the upper end portion of the insulating film 110. In addition, the lower end portion of the conductive film 112 is formed in substantially the same position as that of the upper end portion of the insulating film 110.

It is favorable that the conductive film 112 and the insulating film 110 of the transistor 100B are formed to have a tapered shape because the coverage with the insulating film 116 can be high as compared with the case of the transistor 100A in which the conductive film 112 and the insulating film 110 have a rectangular shape.

The other components of the transistor 100B are similar to those of the transistor 100A described above and have similar effects.

The transistor 100C illustrated in FIGS. 9(A) and 9(B) is different from the transistor 100A in the stacked-layer structure of the conductive film 112, the shape of the conductive film 112, and the shape of the insulating film 110.

The conductive film 112 in the transistor 100C includes the conductive film 112_1 over the insulating film 110 and the conductive film 112_2 over the conductive film 112_1. A lower end portion of the conductive film 112_1 is formed outward from an upper end portion of the conductive film 112_2. For example, the conductive film 112_1, the conductive film 112_2, and the insulating film 110 are processed with the same mask, the conductive film 112_2 is processed by a wet etching method, and the conductive film 112_1 and the insulating film 110 are processed by a dry etching method, whereby the above structure can be obtained.

With the structure of the transistor 100C, regions 108f are formed in the oxide semiconductor film 108 in some cases. The regions 108f are formed between the channel region 108i and the source region 108s and between the channel region 108i and the drain region 108d.

The regions 108f function as high-resistance regions or low-resistance regions. The high-resistance regions have the same level of resistance as the channel region 108i and do not overlap with the conductive film 112 functioning as a gate electrode. In the case where the regions 108f are high-resistance regions, the regions 108f function as what is called offset regions. In the case where the regions 108f function as offset regions, to suppress a decrease in the on-state current of the transistor 100C, the regions 108f may each have a length of 1 μm or less in the channel length (L) direction.

The low-resistance regions have a resistance that is lower than that of the channel region 108i and higher than that of the source region 108s and the drain region 108d. In the case where the regions 108f are low-resistance regions, the regions 108f function as what is called LDD (Lightly Doped Drain) regions. In the case where the regions 108f function as LDD regions, an electric field in the drain region can be relieved, whereby a change in the threshold voltage of the transistor due to the electric field in the drain region can be reduced.

Note that in the case where the regions 108f are LDD regions, for example, the regions 108f can be formed by supplying one or more of nitrogen, hydrogen, and fluorine from the insulating film 116 to the regions 108f or by adding an impurity element from above the conductive film 112_1 using the insulating film 110 and the conductive film 112_1 as a mask so that the impurity is added to the oxide semiconductor film 108 through the conductive film 112_1 and the insulating film 110.

As illustrated in FIG. 9(B), the conductive film 112_2 is connected to the conductive film 106 through the opening 143.

The other components of the transistor 100C are similar to those of the transistor 100A described above and have similar effects.

The transistor 100D illustrated in FIGS. 10(A) and 10(B) is different from the transistor 100A in the stacked-layer structure of the conductive film 112, the shape of the conductive film 112, and the shape of the insulating film 110.

The conductive film 112 in the transistor 100D includes the conductive film 112_1 over the insulating film 110 and the conductive film 112_2 over the conductive film 112_1. A lower end portion of the conductive film 112_1 is formed outward from a lower end portion of the conductive film 112_2. Furthermore, a lower end portion of the insulating film 110 is formed outward from the lower end portion of the conductive film 112_1. For example, the conductive film 112_1, the conductive film 112_2, and the insulating film 110 are processed with the same mask, the conductive film 112_2 and the conductive film 112_1 are processed by a wet etching method, and the insulating film 110 is processed by a dry etching method, whereby the above structure can be obtained.

As in the transistor 100C, the regions 108f are formed in the oxide semiconductor film 108 in the transistor 100D, in some cases. The regions 108f are formed between the channel region 108i and the source region 108s and between the channel region 108i and the drain region 108d.

As illustrated in FIG. 10(B), the conductive film 112_2 is connected to the conductive film 106 through the opening 143.

The other components of the transistor 100D are similar to those of the transistor 100A described above and have similar effects.

<2-3. Structure Example 3 of Transistor>

Figure 11A:
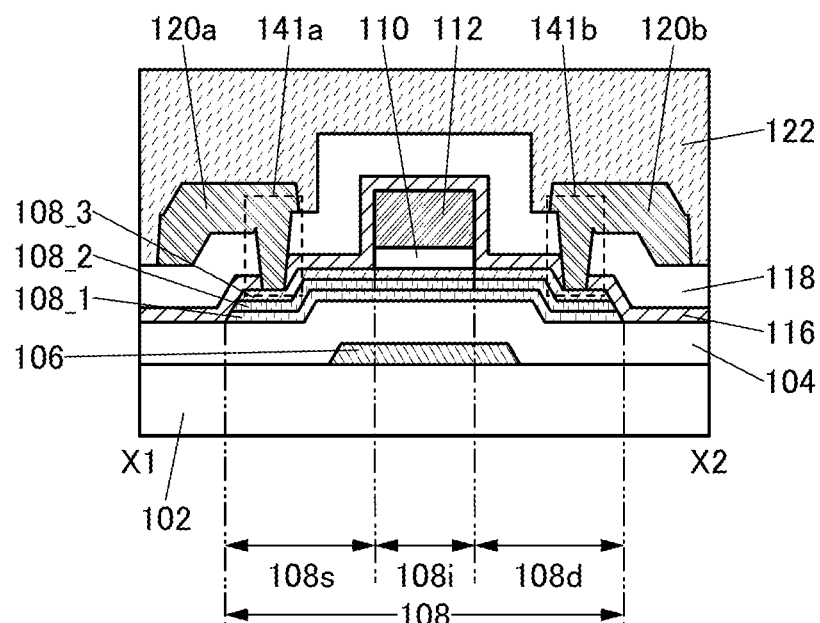
FIGS. 11A and 11B Cross-sectional views illustrating a semiconductor device.
Figure 11B:
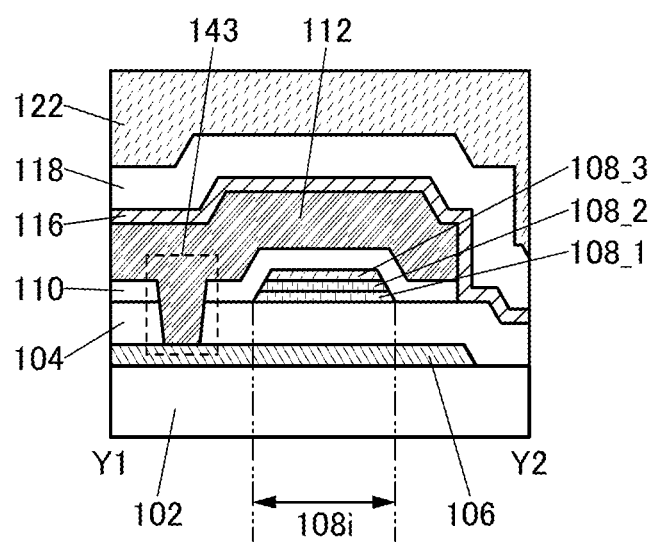
Figure 12A:
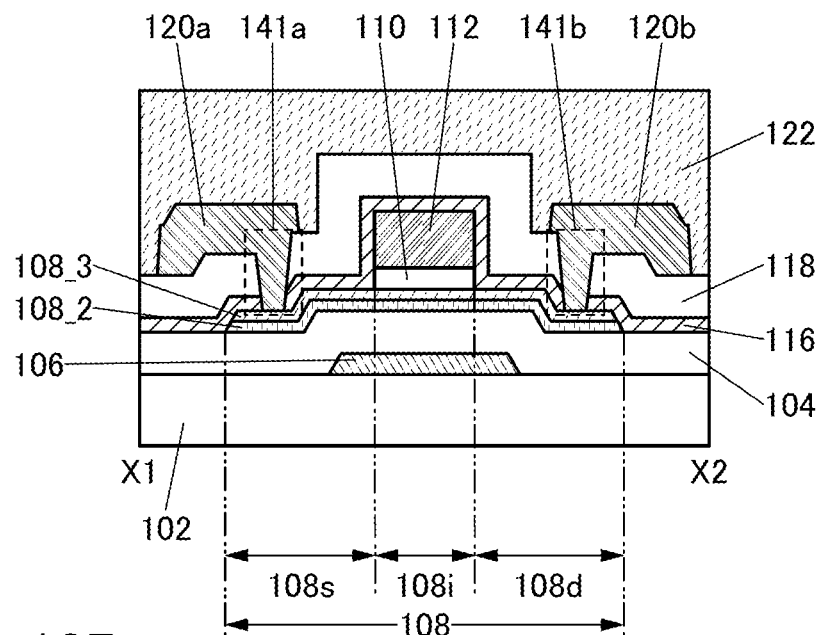
FIGS. 12A and 12B Cross-sectional views illustrating a semiconductor device.
Figure 12B:
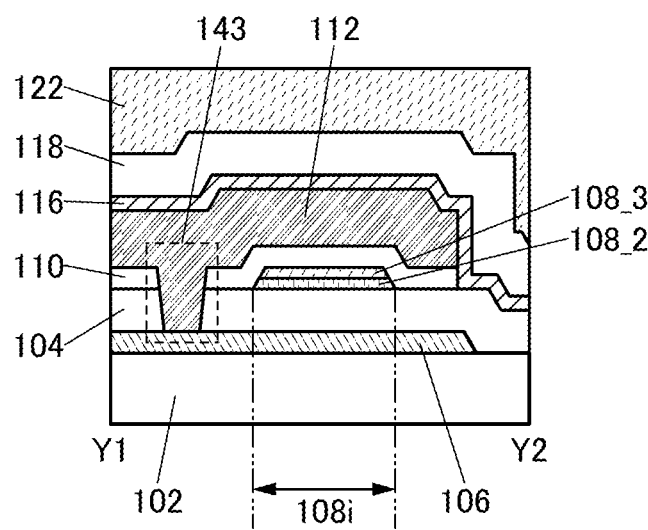
Figure 13A:
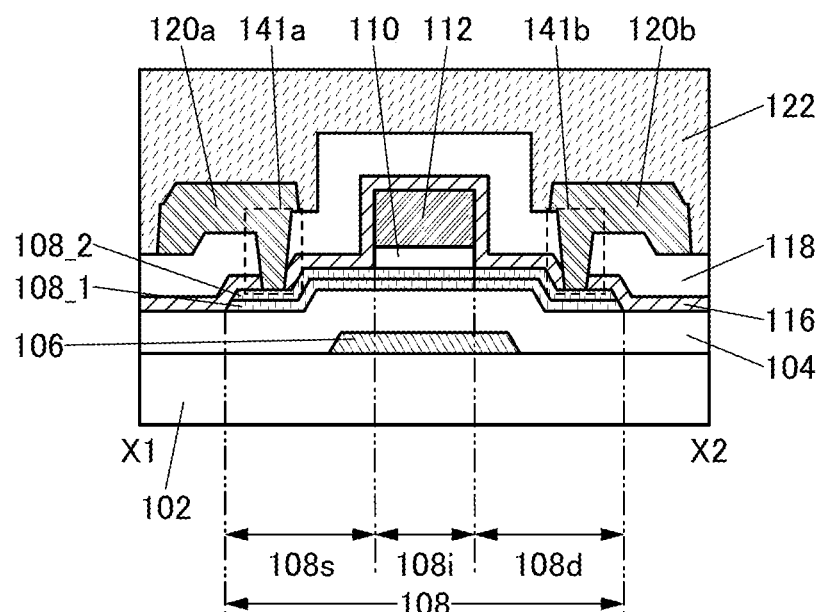
FIGS. 13A and 13B Cross-sectional views illustrating a semiconductor device.
Figure 13B:
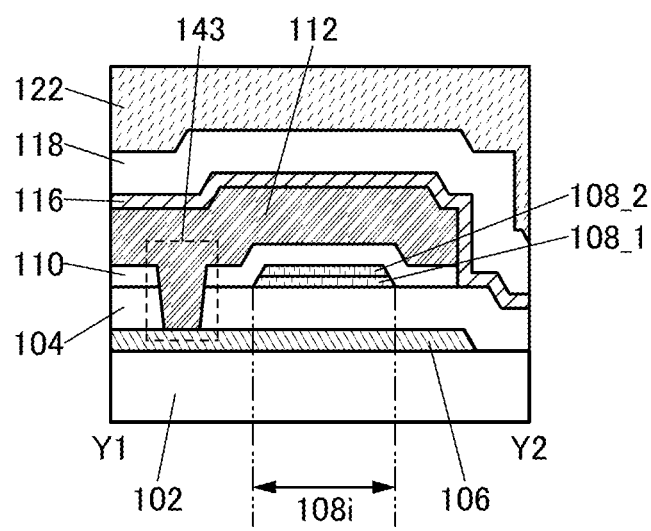
Figure 14A:
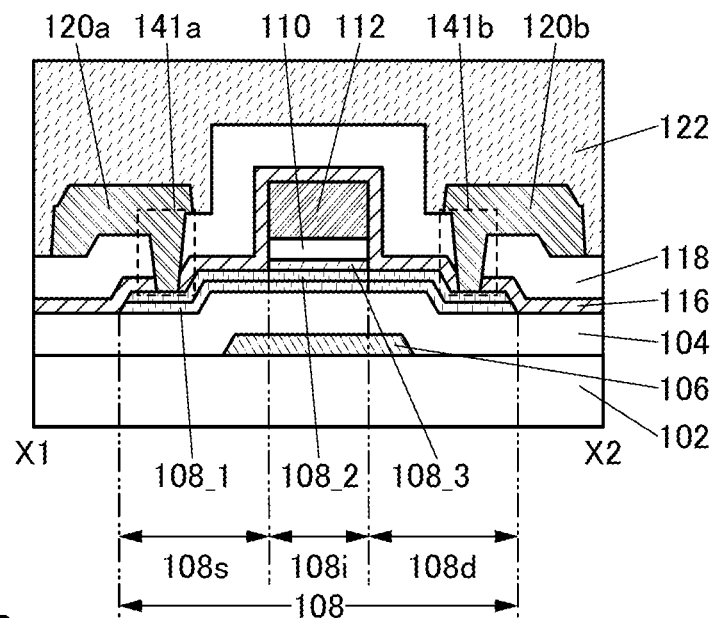
FIGS. 14A and 14B Cross-sectional views illustrating a semiconductor device.
Figure 14B:
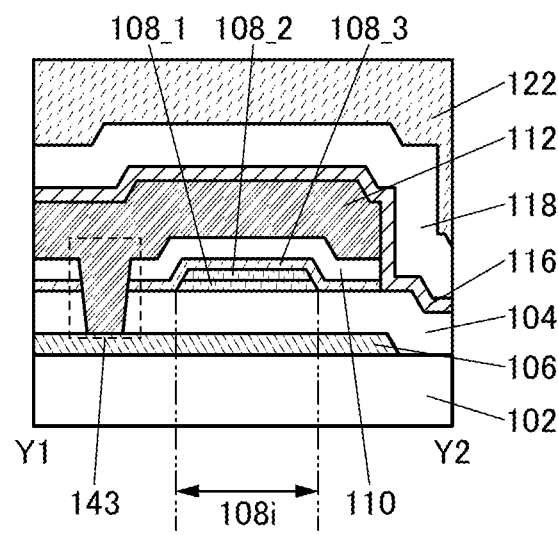
Figure 15A:
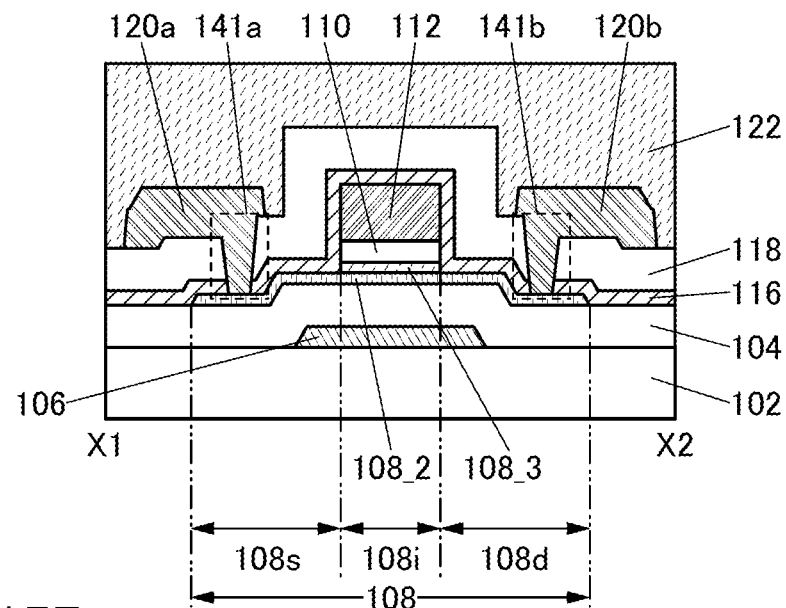
FIGS. 15A and 15B Cross-sectional views illustrating a semiconductor device.
Figure 15B:
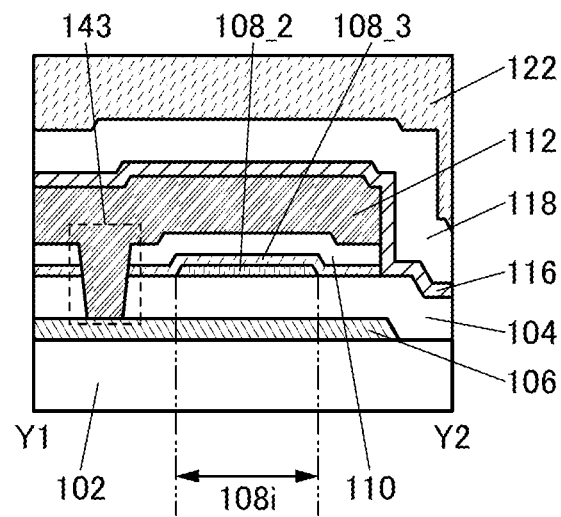

FIGS. 11(A) and 11(B) are cross-sectional views of a transistor 100E. FIGS. 12(A) and 12(B) are cross-sectional views of a transistor 100F. FIGS. 13(A) and 13(B) are cross-sectional views of a transistor 100G. FIGS. 14(A) and 14(B) are cross-sectional views of a transistor 100H. FIGS. 15(A) and 15(B) are cross-sectional views of a transistor 100J. Note that top views of the transistor 100E, the transistor 100F, the transistor 100G, the transistor 100H, and the transistor 100J are similar to that of the transistor 100A illustrated in FIG. 6(A) and thus the description is omitted here.

The transistor 100E, the transistor 100F, the transistor 100G, the transistor 100H, and the transistor 100J are different from the above-described transistor 100A in the structure of the oxide semiconductor film 108. The other components are similar to those of the transistor 100A described above and have similar effects.

The oxide semiconductor film 108 of the transistor 100E illustrated in FIGS. 11(A) and 11(B) includes an oxide semiconductor film 108_1 over the insulating film 104, an oxide semiconductor film 108_2 over the oxide semiconductor film 1081, and an oxide semiconductor film 108_3 over the oxide semiconductor film 108_2. The channel region 108i, the source region 108s, and the drain region 108d each have a three-layer stacked structure of the oxide semiconductor film 108_1, the oxide semiconductor film 108_2, and the oxide semiconductor film 108_3.

The oxide semiconductor film 108 of the transistor 100F illustrated in FIGS. 12(A) and 12(B) includes the oxide semiconductor film 108_2 over the insulating film 104, and the oxide semiconductor film 108_3 over the oxide semiconductor film 108_2. The channel region 108i, the source region 108s, and the drain region 108d each have a two-layer stacked structure of the oxide semiconductor film 108_2 and the oxide semiconductor film 108_3.

The oxide semiconductor film 108 of the transistor 100G illustrated in FIGS. 13(A) and 13(B) includes the oxide semiconductor film 108_1 over the insulating film 104, and the oxide semiconductor film 108_2 over the oxide semiconductor film 108_1. The channel region 108i, the source region 108s, and the drain region 108d each have a two-layer stacked structure of the oxide semiconductor film 108_1 and the oxide semiconductor film 108_2.

The oxide semiconductor film 108 of the transistor 100H illustrated in FIGS. 14(A) and 14(B) includes the oxide semiconductor film 108_1 over the insulating film 104, the oxide semiconductor film 108_2 over the oxide semiconductor film 1081, and the oxide semiconductor film 108_3 over the oxide semiconductor film 108_2. The channel region 108i has a three-layer stacked structure of the oxide semiconductor film 108_1, the oxide semiconductor film 108_2, and the oxide semiconductor film 108_3. The source region 108s and the drain region 108d each have a two-layer stacked structure of the oxide semiconductor film 108_1 and the oxide semiconductor film 108_2. Note that in the cross section of the transistor 100H in the channel width (W) direction, the oxide semiconductor film 108_3 covers side surfaces of the oxide semiconductor film 108_1 and the oxide semiconductor film 108_2.

The oxide semiconductor film 108 of the transistor 100J illustrated in FIGS. 15(A) and 15(B) includes the oxide semiconductor film 108_2 over the insulating film 104, and the oxide semiconductor film 108_3 over the oxide semiconductor film 108_2. The channel region 108i has a two-layer stacked structure of the oxide semiconductor film 108_2 and the oxide semiconductor film 108_3. The source region 108s and the drain region 108d each have a single-layer structure of the oxide semiconductor film 108_2. Note that in the cross section of the transistor 100J in the channel width (W) direction, the oxide semiconductor film 108_3 covers side surfaces of the oxide semiconductor film 108_2.

A side surface of the channel region 108i in the channel width (W) direction or its vicinity is easily damaged by processing, resulting in forming a defect (e.g., oxygen vacancy), or easily contaminated by an impurity attached thereto. Therefore, even when the channel region 108i is substantially intrinsic, stress such as an electric field applied thereto activates the side surface of the channel region 108i in the channel width (W) direction or its vicinity and turns it into a low-resistance (n-type) region easily. Moreover, in the case where the side surface of the channel region 108i in the channel width (W) direction or its vicinity is an n-type region, a parasitic channel may be formed because the n-type region serves as a carrier path.

Thus, in the transistor 100H and the transistor 100J, the channel region 108*i* has a stacked-layer structure and side surfaces of the channel region 108*i* in the channel width (W) direction are covered with one layer of the stacked-layer structure. With such a structure, defects on the side surfaces of the channel region 108*i* or in their vicinity can be suppressed or adhesion of an impurity to the side surfaces of the channel region 108*i* or to their vicinity can be reduced.

[Band Structure]

Here, a band structure of the insulating film 104, the oxide semiconductor films 108_1, 108_2, and 108_3, and the insulating film 110, a band structure of the insulating film 104, the oxide semiconductor films 108_2 and 108_3, and the insulating film 110, and a band structure of the insulating film 104 and the oxide semiconductor films 108_1 and 108_2 will be described with reference to FIGS. 16(A), 16(B), and 16(C). Note that FIGS. 16(A), 16(B), and 16(C) are each a band structure of the channel region 108*i*.

Figure 16A:
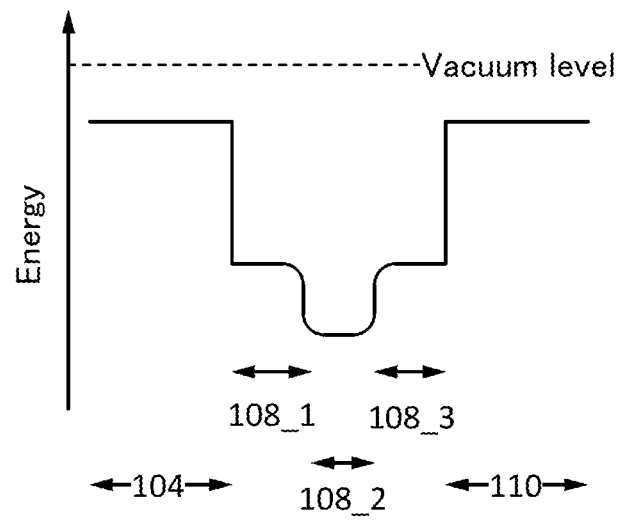
FIGS. 16A to 16C Diagrams illustrating band structures.

FIG. 16(A) shows an example of a band structure in the thickness direction of a stacked-layer structure including the insulating film 104, the oxide semiconductor films 108_1, 108_2, and 108_3, and the insulating film 110. FIG. 16(B) shows an example of a band structure in the thickness direction of a stacked-layer structure including the insulating film 104, the oxide semiconductor films 108_2 and 108_3, and the insulating film 110. FIG. 16(C) shows an example of a band structure in the thickness direction of a stacked-layer structure including the insulating film 104, the oxide semiconductor films 108_1 and 108_2, and the insulating film 110. For easy understanding, the band structures show the energy level of the conduction band minimum (Ec) of each of the insulating film 104, the oxide semiconductor films 108_1, 1082, and 108_3, and the insulating film 110.

FIG. 16(A) shows a band diagram of a structure in which a silicon oxide film is used as the insulating films 104 and 110, an oxide semiconductor formed using a metal oxide target with an atomic ratio of metal elements of In:Ga:Zn=1:3:2 is used for the oxide semiconductor film 108_1, a composite oxide semiconductor formed using a metal oxide target with an atomic ratio of metal elements of In:Zn=2:3 is used for the oxide semiconductor film 108_2, and an oxide semiconductor film formed using a metal oxide target with an atomic ratio of metal elements of In:Ga:Zn=1:3:2 is used as the oxide semiconductor film 108_3.

Figure 16B:
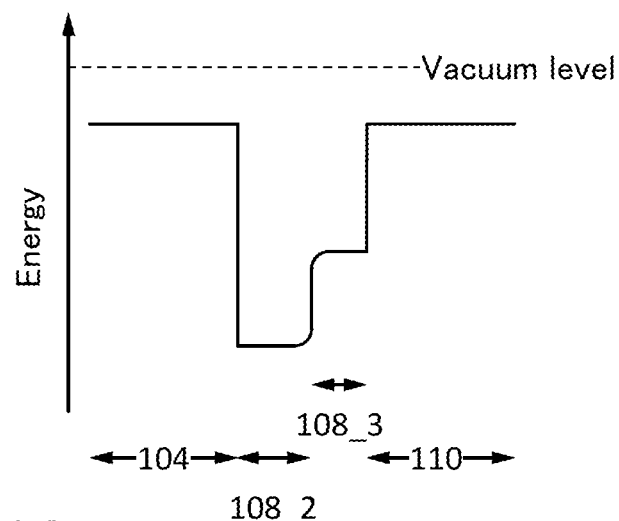
Figure 16C:
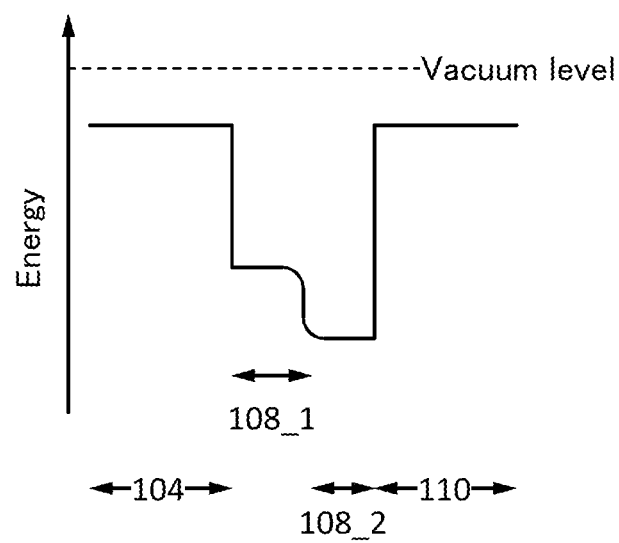

FIG. 16(B) shows a band diagram of a structure in which a silicon oxide film is used as the insulating films 104 and 110, a composite oxide semiconductor formed using a metal oxide target with an atomic ratio of metal elements of In:Zn=2:3 is used for the oxide semiconductor film 108_2, and an oxide semiconductor film formed using a metal oxide target with an atomic ratio of metal elements of In:Ga:Zn=1:3:2 is used as the oxide semiconductor film 108_3.

FIG. 16(C) shows a band diagram of a structure in which a silicon oxide film is used as the insulating films 104 and 110, an oxide semiconductor film formed using a metal oxide target with an atomic ratio of metal elements of In:Ga:Zn=1:3:2 is used as the oxide semiconductor film 108_1, and a composite oxide semiconductor film formed using a metal oxide target with an atomic ratio of metal elements of In:Zn=2:3 is used as the oxide semiconductor film 108_2.

As illustrated in FIG. 16(A), the energy level of the conduction band minimum gradually varies between the oxide semiconductor films 108_1, 108_2, and 108_3. As illustrated in FIG. 16(B), the energy level of the conduction band minimum gradually varies between the oxide semiconductor films 108_2 and 108_3. As illustrated in FIG. 16(C), the energy level of the conduction band minimum gradually varies between the oxide semiconductor films 108_1 and 108_2. In other words, the energy level of the conduction band minimum is continuously varied or continuously connected. To obtain such a band structure, there exists no impurity, which forms a defect state such as a trap center or a recombination center, at the interface between the oxide semiconductor film 108_1 and the oxide semiconductor film 108_2 or the interface between the oxide semiconductor film 108_2 and the oxide semiconductor film 108_3.

To form a continuous junction between the oxide semiconductor films 108_1, 108_2, and 108_3, it is necessary to stack the films successively without exposure to the air with a multi-chamber deposition apparatus (sputtering apparatus) provided with a load lock chamber.

With the structure in FIG. 16(A), 16(B), or 16(C), the oxide semiconductor film 108_2 serves as a well, and a channel region is formed in the oxide semiconductor film 108_2 in the transistor with the above stacked-layer structure.

By providing the oxide semiconductor films 108_1 and 108_3, the oxide semiconductor film 108_2 can be distanced away from defect states.

In addition, the defect states might be more distant from the vacuum level than the energy level of the conduction band minimum (Ec) of the oxide semiconductor film 108_2 functioning as a channel region, so that electrons are likely to be accumulated in the defect states. When the electrons are accumulated in the defect states, the electrons become negative fixed electric charge, so that the threshold voltage of the transistor is shifted in the positive direction. Therefore, it is preferable that the defect states be closer to the vacuum level than the energy level of the conduction band minimum (Ec) of the oxide semiconductor film 108_2. With such a structure, electrons are not easily accumulated in the defect states, the on-state current of the transistor can be increased, and the field-effect mobility can be increased.

The energy level of the conduction band minimum of each of the oxide semiconductor films 108_1 and 108_3 is closer to the vacuum level than that of the oxide semiconductor film 108_2. A typical difference between the energy level of the conduction band minimum of the oxide semiconductor film 108_2 and the energy level of the conduction band minimum of each of the oxide semiconductor films 108_1 and 108_3 is 0.15 eV or more or 0.5 eV or more and 2 eV or less or 1 eV or less. That is, a difference between the electron affinity of each of the oxide semiconductor films 108_1 and 108_3 and the electron affinity of the oxide semiconductor film 108_2 is 0.15 eV or more or 0.5 eV or more and 2 eV or less or 1 eV or less.

In such a structure, the oxide semiconductor film 108_2 serves as a main path of a current. In other words, the oxide semiconductor film 108_2 serves as a channel region, and the oxide semiconductor films 108_1 and 108_3 serve as oxide insulating films. It is preferable that as the oxide semiconductor films 108_1 and 108_3, an oxide semiconductor film which includes one or more kinds of metal elements constituting the oxide semiconductor film 108_2 where a channel region is formed be used. With such a structure, interface scattering hardly occurs at the interface between the oxide semiconductor film 108_1 and the oxide semiconductor film 108_2 or at the interface between the oxide semiconductor film 108_2 and the oxide semiconductor film 108_3. Thus, the transistor can have high field-effect mobility because the movement of carriers is not hindered at the interface.

For the oxide semiconductor film 1082, the composite oxide semiconductor of one embodiment of the present invention described in Embodiment 1 can be used.

To prevent each of the oxide semiconductor films 108_1 and 108_3 from functioning as part of a channel region, a material having sufficiently low conductivity is used. Thus, the oxide semiconductor films 108_1 and 108_3 can be referred to as oxide insulating films for their properties and/or functions. Alternatively, for the oxide semiconductor films 108_1 and 108_3, a material which has a smaller electron affinity (a difference between the vacuum level and the energy level of the conduction band minimum) than the oxide semiconductor film 108_2 and has a difference (band offset) of the energy level of its conduction band minimum from the energy level of the conduction band minimum of the oxide semiconductor film 108_2 is used. Furthermore, to inhibit generation of a difference in threshold voltage depending on the value of the drain voltage, it is preferable to use a material with which energy level of the conduction band minimum of each of the oxide semiconductor films 108_1 and 108_3 is closer to the vacuum level than the energy level of the conduction band minimum of the oxide semiconductor film 108_2. For example, a difference between the energy level of the conduction band minimum of the oxide semiconductor film 108_2 and the energy level of the conduction band minimum of each of the oxide semiconductor films 108_1 and 108_3 is preferably greater than or equal to 0.2 eV, further preferably greater than or equal to 0.5 eV.

It is preferable that the oxide semiconductor films 108_1 and 108_3 not have a spinel crystal structure in the films. This is because if the oxide semiconductor films 108_1 and 108_3 have a spinel crystal structure in the films, constituent elements of the conductive films 120a and 120b might be diffused into the oxide semiconductor film 108_2 at the interface between the spinel crystal structure and another region. Note that each of the oxide semiconductor films 108_1 and 108_3 is preferably a CAAC-OS described later, in which case a higher blocking property against a constituent element of the conductive films 120a and 120b, for example, a copper element, can be obtained.

Although the example of the structure where an oxide semiconductor film formed using a metal oxide target with an atomic ratio of metal elements of In:Ga:Zn=1:3:2 is used as each of the oxide semiconductor films 108_1 and 108_3 is described in this embodiment, one embodiment of the present invention is not limited thereto. For example, an oxide semiconductor film formed using a metal oxide target with In:Ga:Zn=1:1:1 [atomic ratio], In:Ga:Zn=1:1:1.2 [atomic ratio], In:Ga:Zn=1:3:4 [atomic ratio], In:Ga:Zn=1:3:6 [atomic ratio], In:Ga:Zn=1:4:5 [atomic ratio], In:Ga:Zn=1:5:6 [atomic ratio], or In:Ga:Zn=1:10:1 [atomic ratio] may be used as each of the oxide semiconductor films 108_1 and 108_3. Alternatively, an oxide semiconductor film formed using a metal oxide target with an atomic ratio of metal elements of Ga:Zn=10:1 may be used as each of the oxide semiconductor films 108_1 and 108_3.

Note that in the case where the oxide semiconductor films 108_1 and 108_3 are formed using a metal oxide target with In:Ga:Zn=1:1:1 [atomic ratio], the oxide semiconductor films 108_1 and 108_3 have an atomic ratio of In:Ga:Zn=1:$\beta$1 (0<$\beta$1≤2):$\beta$2 (0<$\beta$2≤2) in some cases. In the case where the oxide semiconductor films 108_1 and 108_3 are formed using a metal oxide target with In:Ga:Zn=1:3:4 [atomic ratio], the oxide semiconductor films 108_1 and 108_3 have an atomic ratio of In:Ga:Zn=1:$\beta$3 (1≤$\beta$3≤5):$\beta$4 (2≤$\beta$4≤6) in some cases. In the case where the oxide semiconductor films 108_1 and 108_3 are formed using a metal oxide target with In:Ga:Zn=1:3:6 [atomic ratio], the oxide semiconductor films 108_1 and 108_3 have an atomic ratio of In:Ga:Zn=1:$\beta$5 (1≤$\beta$5≤5):$\beta$6 (4≤$\beta$6≤8) in some cases.

<2-4. Structure Example 4 of Transistor>

Figure 17A:
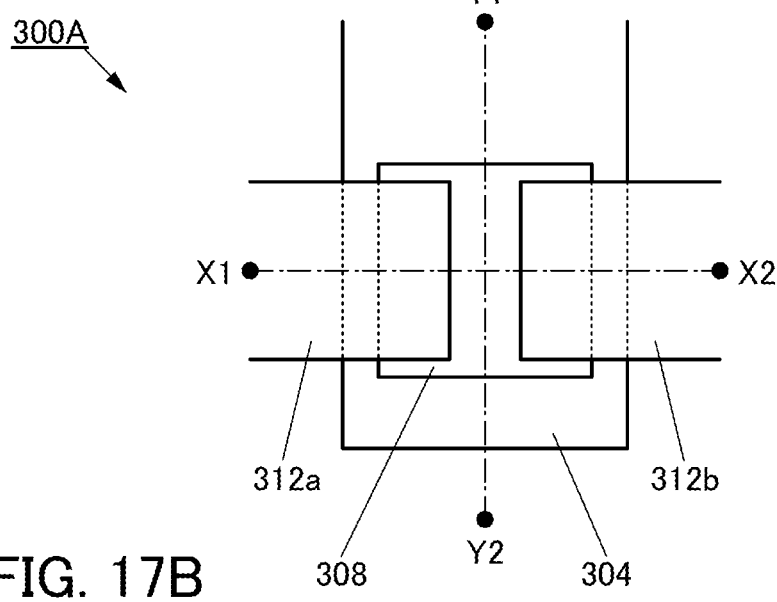
FIGS. 17A to 17C A top view and cross-sectional views illustrating a semiconductor device.
Figure 17B:
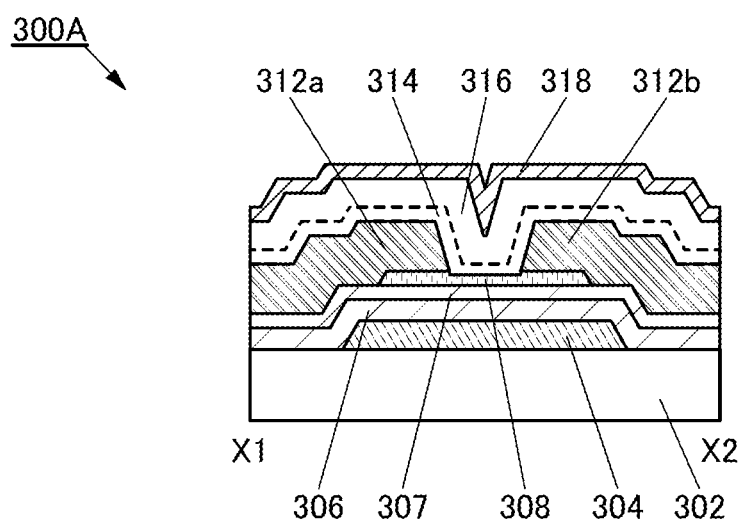
Figure 17C:
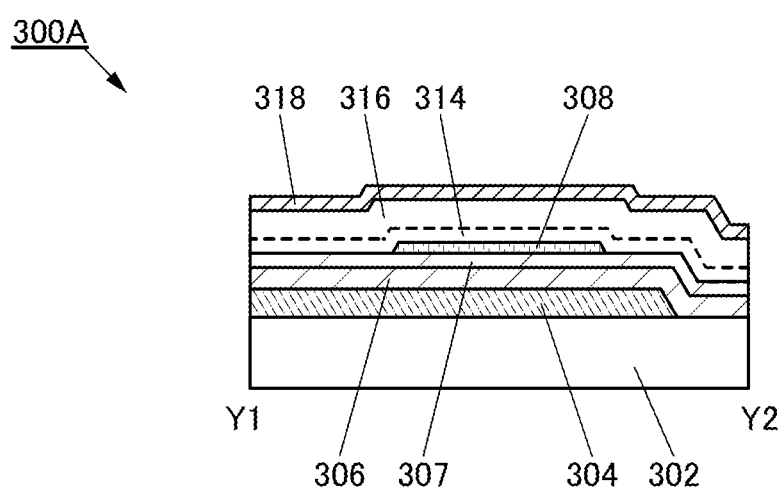

FIG. 17(A) is a top view of a transistor 300A. FIG. 17(B) corresponds to a cross-sectional view of a cutting surface along a dashed-dotted line X1-X2 in FIG. 17(A). FIG. 17(C) corresponds to a cross-sectional view of a cutting surface along a dashed-dotted line Y1-Y2 in FIG. 17(A).

The transistor 300A illustrated in FIGS. 17(A), 17(B), and 17(C) includes a conductive film 304 over a substrate 302, an insulating film 306 over the substrate 302 and the conductive film 304, an insulating film 307 over the insulating film 306, an oxide semiconductor film 308 over the insulating film 307, a conductive film 312a over the oxide semiconductor film 308, and a conductive film 312b over the oxide semiconductor film 308. Over the transistor 300A, specifically, over the conductive films 312a and 312b and the oxide semiconductor film 308, insulating films 314 and 316 and an insulating film 318 are provided.

In the transistor 300A, the insulating films 306 and 307 function as a gate insulating film of the transistor 300A, and the insulating films 314, 316, and 318 function as a protective insulating film of the transistor 300A. Furthermore, in the transistor 300A, the conductive film 304 functions as a gate electrode, the conductive film 312a functions as a source electrode, and the conductive film 312b functions as a drain electrode.

In this specification and the like, the insulating films 306 and 307 may be referred to as a first insulating film, the insulating films 314 and 316 may be referred to as a second insulating film, and the insulating film 318 may be referred to as a third insulating film.

The transistor 300A illustrated in FIGS. 17(A), 17(B), and 17(C) has a channel-etched transistor structure. The composite oxide semiconductor of one embodiment of the present invention can be suitably used for a semiconductor film of the channel-etched transistor.

<2-5. Structure Example 5 of Transistor>

Figure 18A:
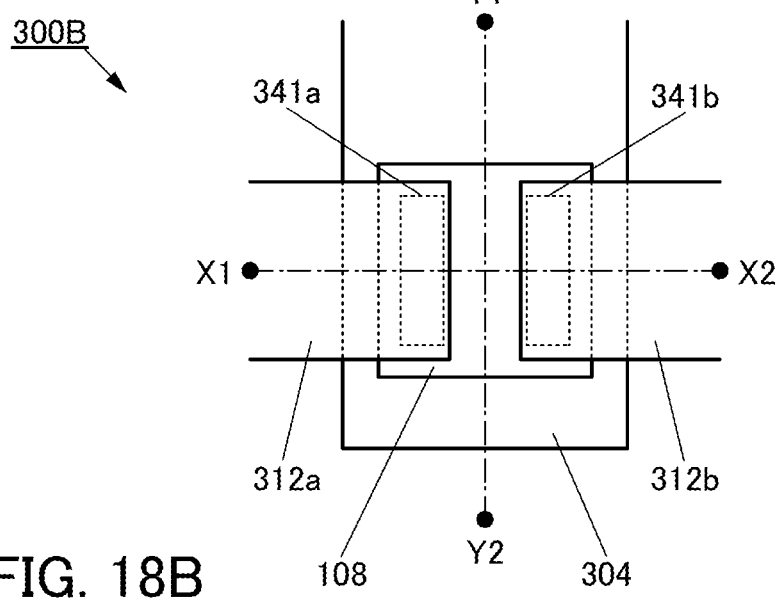
FIGS. 18A to 18C A top view and cross-sectional views illustrating a semiconductor device.
Figure 18B:
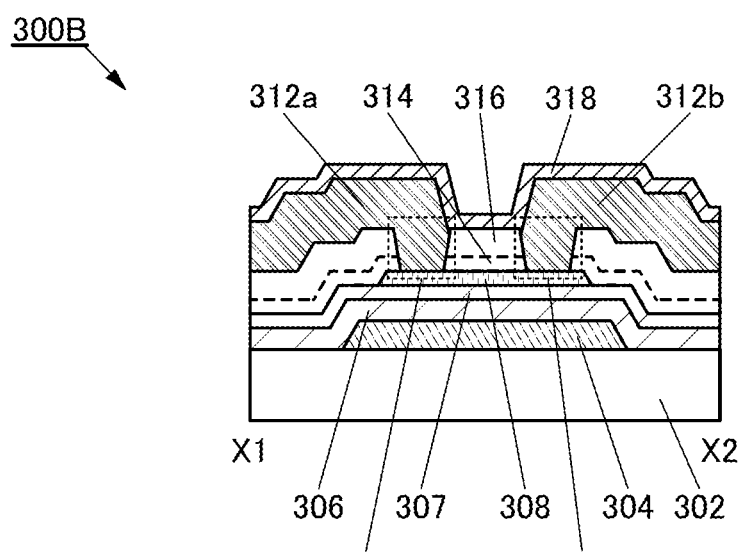
Figure 18C:
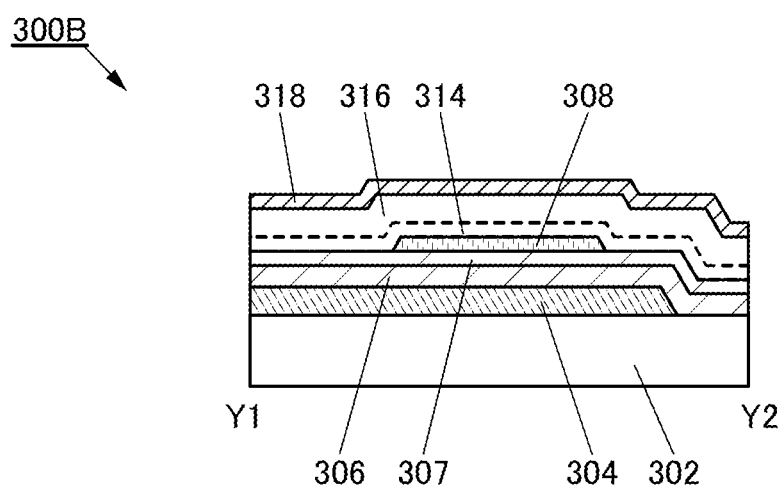

FIG. 18(A) is a top view of a transistor 300B. FIG. 18(B) corresponds to a cross-sectional view of a cutting surface along a dashed-dotted line X1-X2 in FIG. 18(A). FIG. 18(C) corresponds to a cross-sectional view of a cutting surface along a dashed-dotted line Y1-Y2 in FIG. 18(A).

The transistor 300B illustrated in FIG. 18 includes the conductive film 304 over the substrate 302, the insulating film 306 over the substrate 302 and the conductive film 304, the insulating film 307 over the insulating film 306, the oxide semiconductor film 308 over the insulating film 307, the insulating film 314 over the oxide semiconductor film 308, the insulating film 316 over the insulating film 314, the conductive film 312a electrically connected to the oxide semiconductor film 308 through an opening 341a provided in the insulating film 314 and the insulating film 316, and the conductive film 312b electrically connected to the oxide semiconductor film 308 through an opening 341b provided in the insulating film 314 and the insulating film 316. Over the transistor 300B, specifically, over the conductive films 312a and 312b and the insulating film 316, the insulating film 318 is provided.

In the transistor 300B, the insulating films 306 and 307 function as a gate insulating film of the transistor 300B, the insulating films 314 and 316 function as a protective insulating film of the oxide semiconductor film 308, and the insulating film 318 functions as a protective insulating film of the transistor 300B. Moreover, in the transistor 300B, the conductive film 304 functions as a gate electrode, the conductive film 312a functions as a source electrode, and the conductive film 312b functions as a drain electrode.

The transistor 300A illustrated in FIG. 17 has a channel-etched structure, whereas the transistor 300B in FIGS. 18(A), 18(B), and 18(C) has a channel-protective structure. The composite oxide semiconductor of one embodiment of the present invention can be suitably used for a semiconductor film of the channel-protective transistor as well.

<2-6. Structure Example 6 of Transistor>

Figure 19A:
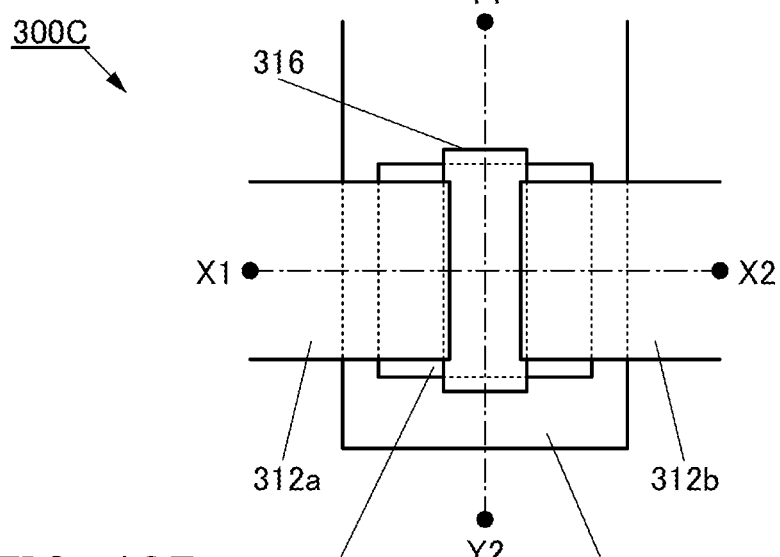
FIGS. 19A to 19C A top view and cross-sectional views illustrating a semiconductor device.
Figure 19B:
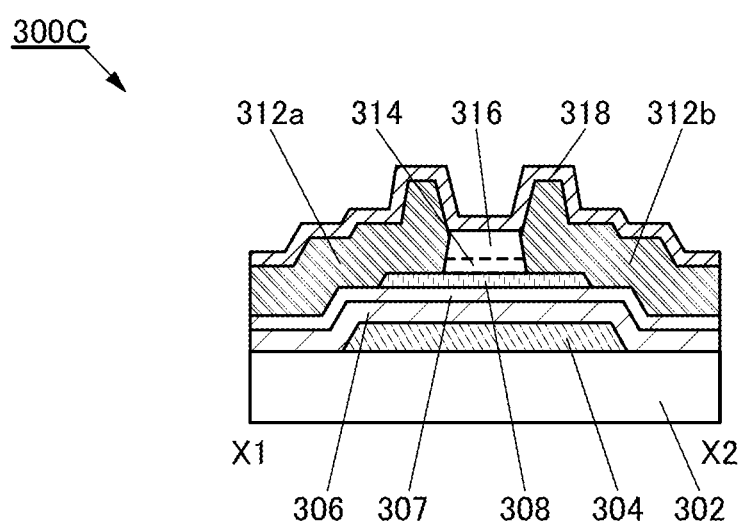
Figure 19C:
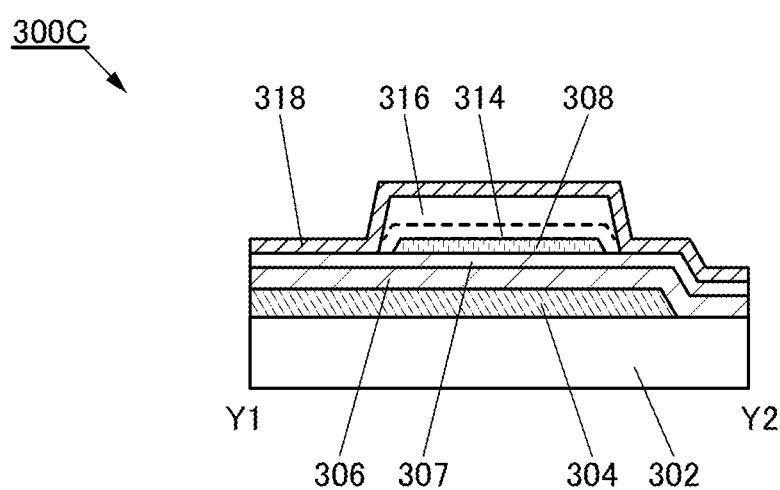

FIG. 19(A) is a top view of a transistor 300C. FIG. 19(B) corresponds to a cross-sectional view of a cutting surface along a dashed-dotted line X1-X2 in FIG. 19(A). FIG. 19(C) corresponds to a cross-sectional view of a cutting surface along a dashed-dotted line Y1-Y2 in FIG. 19(A).

The transistor 300C illustrated in FIG. 19 is different from the transistor 300B in FIGS. 18(A), 18(B), and 18(C) in the shapes of the insulating films 314 and 316. Specifically, the insulating films 314 and 316 of the transistor 300C are provided in island shapes and over a channel region of the oxide semiconductor film 308. Other components are similar to those of the transistor 300B.

<2-7. Structure Example 7 of Transistor>

Figure 20A:
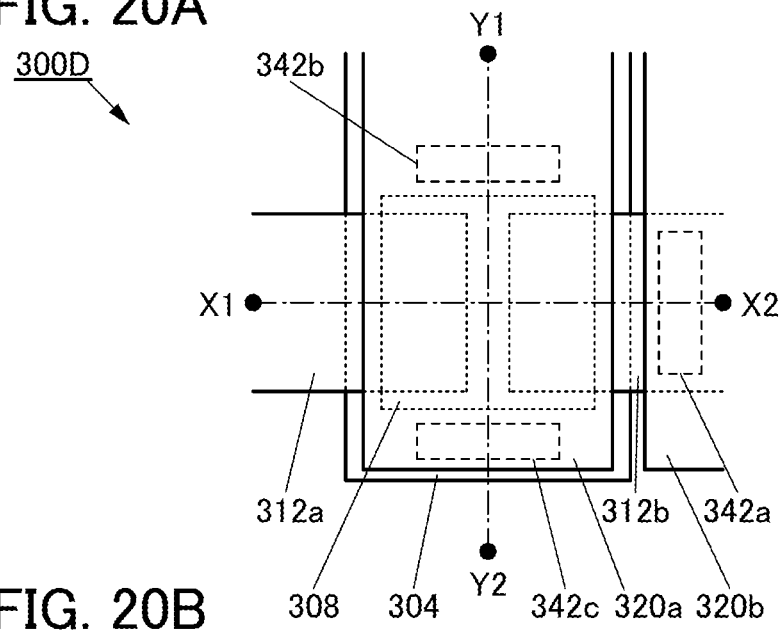
FIGS. 20A to 20C A top view and cross-sectional views illustrating a semiconductor device.
Figure 20B:
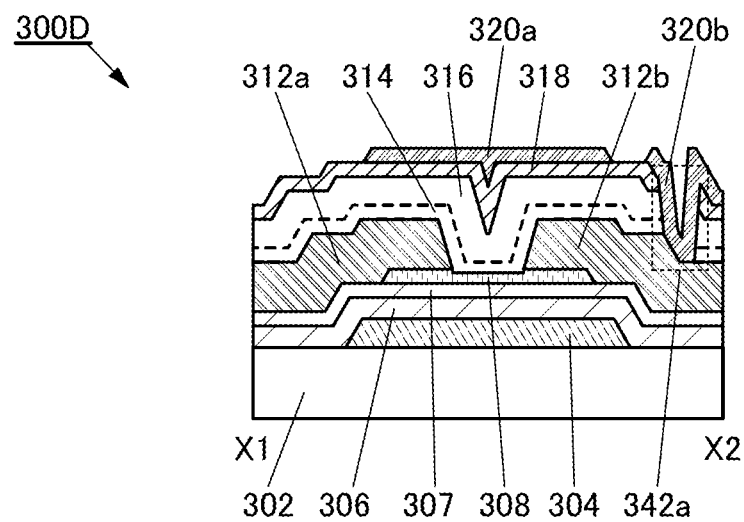
Figure 20C:
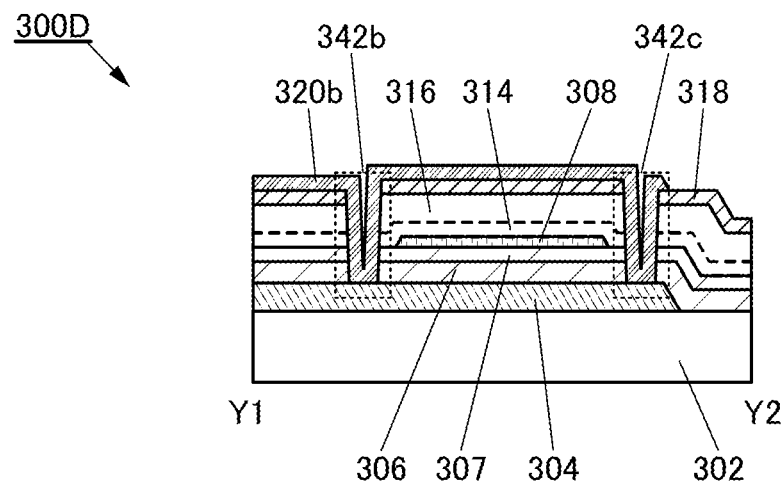

FIG. 20(A) is a top view of a transistor 300D. FIG. 20(B) corresponds to a cross-sectional view of a cutting surface along a dashed-dotted line X1-X2 in FIG. 20(A). FIG. 20(C) corresponds to a cross-sectional view taken along a dashed-dotted line Y1-Y2 in FIG. 20(A).

The transistor 300D illustrated in FIG. 20 includes the conductive film 304 over the substrate 302, the insulating film 306 over the substrate 302 and the conductive film 304, the insulating film 307 over the insulating film 306, the oxide semiconductor film 308 over the insulating film 307, the conductive film 312a over the oxide semiconductor film 308, the conductive film 312b over the oxide semiconductor film 308, the insulating film 314 over the oxide semiconductor film 308 and the conductive films 312a and 312b, the insulating film 316 over the insulating film 314, the insulating film 318 over the insulating film 316, and conductive films 320a and 320b over the insulating film 318.

In the transistor 300D, the insulating films 306 and 307 function as a first gate insulating film of the transistor 300D, and the insulating films 314, 316, and 318 function as a second gate insulating film of the transistor 300D. Furthermore, in the transistor 300D, the conductive film 304 functions as a first gate electrode, the conductive film 320a functions as a second gate electrode, and the conductive film 320b functions as a pixel electrode used for a display device. The conductive film 312a functions as a source electrode, and the conductive film 312b functions as a drain electrode.

As illustrated in FIG. 20(C), the conductive film 320a is connected to the conductive film 304 in openings 342b and 342c provided in the insulating films 306, 307, 314, 316, and 318. Thus, the same potential is applied to the conductive film 320a and the conductive film 304.

The structure of the transistor 300D in which the openings 342b and 342c are provided so that the conductive film 320a is connected to the conductive film 304 is shown as an example; however, one embodiment of the present invention is not limited thereto. For example, a structure in which only one of the openings 342b and 342c is provided so that the conductive film 320a is connected to the conductive film 304, or a structure in which the conductive film 320a is not connected to the conductive film 304 without providing the openings 342b and 342c may be employed. Note that in the case where the structure in which the conductive film 320a is not connected to the conductive film 304 is employed, it is possible to apply different potentials to the conductive film 320a and the conductive film 304.

The conductive film 320b is connected to the conductive film 312b through an opening 342a provided in the insulating films 314, 316, and 318.

Note that the transistor 300D has the S-channel structure described above.

<2-8. Structure Example 8 of Transistor>

The oxide semiconductor film 308 included in the transistor 300A in FIGS. 17(A), 17(B), and 17(C) may have a stacked structure of a plurality of layers. FIGS. 21(A) and 21(B) and FIGS. 22(A) and 22(B) illustrate examples of such a case.

Figure 21A:
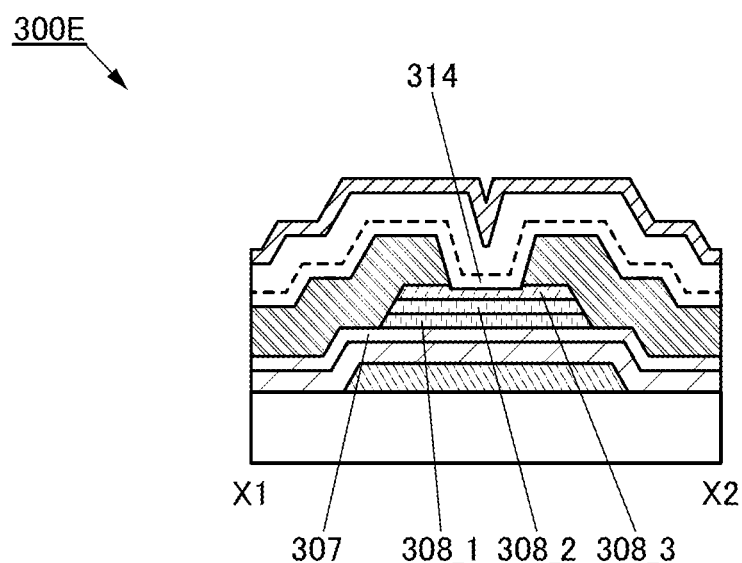
FIGS. 21A and 21B Cross-sectional views illustrating a semiconductor device.
Figure 21B:
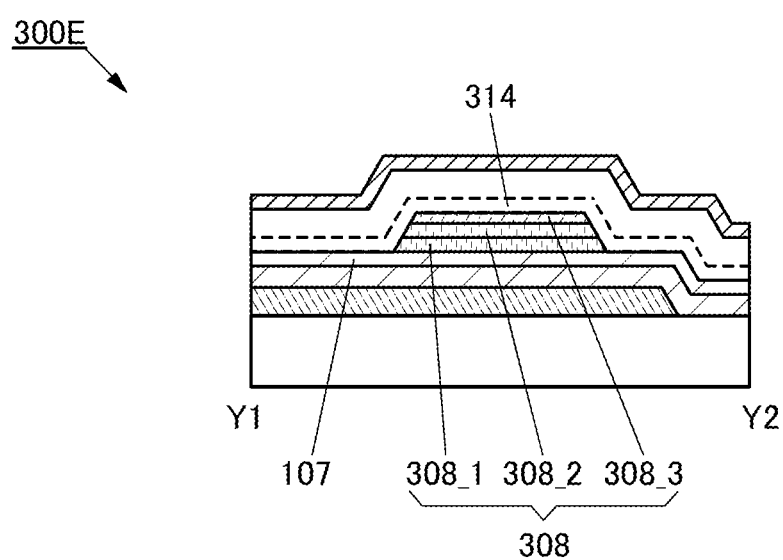
Figure 22A:
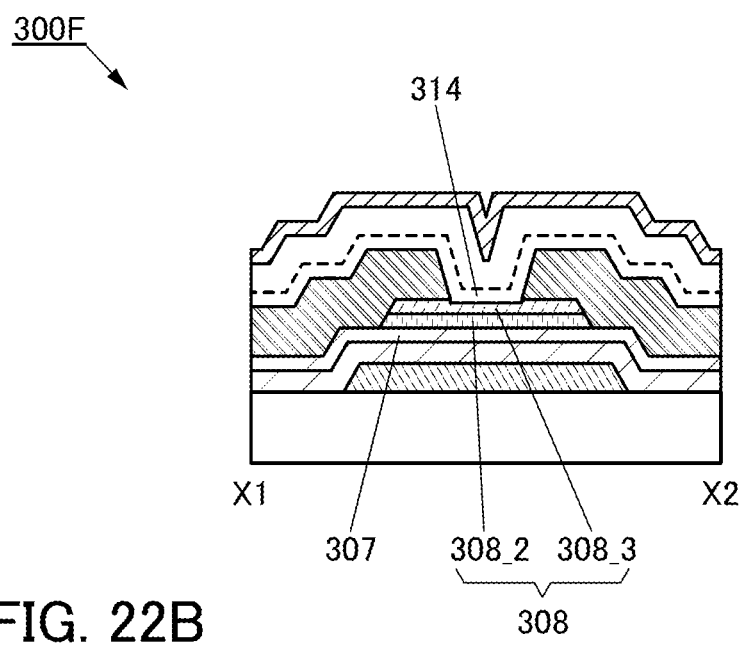
FIGS. 22A and 22B Cross-sectional views illustrating a semiconductor device.
Figure 22B:
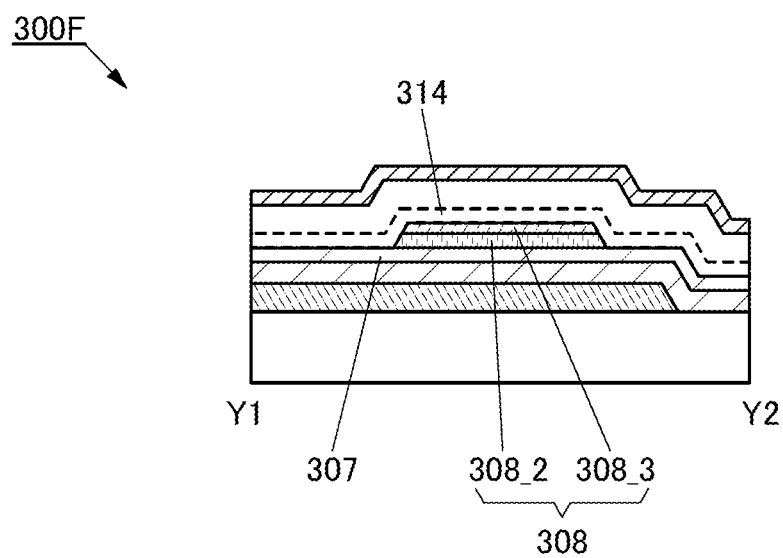

FIGS. 21(A) and 21(B) are cross-sectional views of a transistor 300E and FIGS. 22(A) and 22(B) are cross-sectional views of a transistor 300F. The top views of the transistors 300E and 300F are similar to that of the transistor 300A illustrated in FIG. 17(A).

The oxide semiconductor film 308 included in the transistor 300E illustrated in FIGS. 21(A) and 21(B) includes an oxide semiconductor film 308_1, an oxide semiconductor film 308_2, and an oxide semiconductor film 308_3. The oxide semiconductor film 308 included in the transistor 300F illustrated in FIGS. 22(A) and 22(B) includes the oxide semiconductor film 308_2 and the oxide semiconductor film 308_3.

Note that for the conductive film 304, the insulating film 306, the insulating film 307, the oxide semiconductor film 308, the oxide semiconductor film 308_1, the oxide semiconductor film 308_2, the oxide semiconductor film 308_3, the conductive films 312a and 312b, the insulating film 314, the insulating film 316, the insulating film 318, and the conductive films 320a and 320b, the materials similar to those of the conductive film 106, the insulating film 116, the oxide semiconductor film 108, the oxide semiconductor film 108_1, the oxide semiconductor film 108_2, the oxide semiconductor film 108_3, the conductive films 120a and 120b, the insulating film 104, the insulating film 118, the insulating film 116, and the conductive film 112, respectively, described above can be used.

<2-9. Structure Example 9 of Transistor>

Figure 23A:
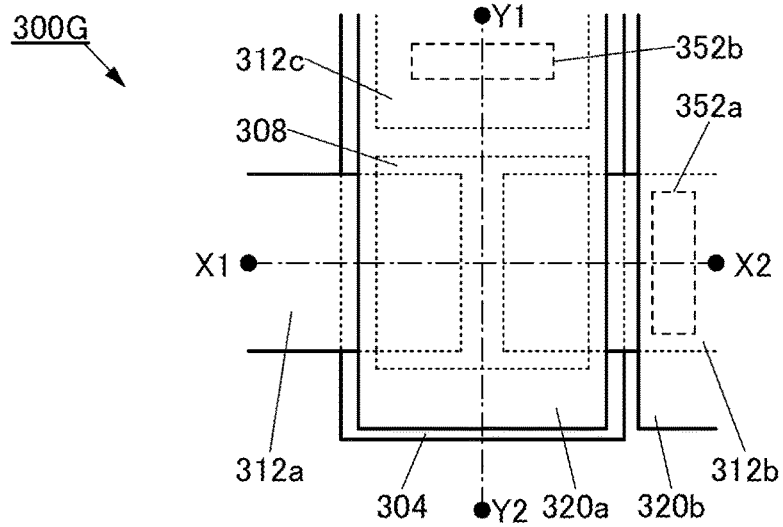
FIGS. 23A to 23C A top view and cross-sectional views illustrating a semiconductor device.
Figure 23B:
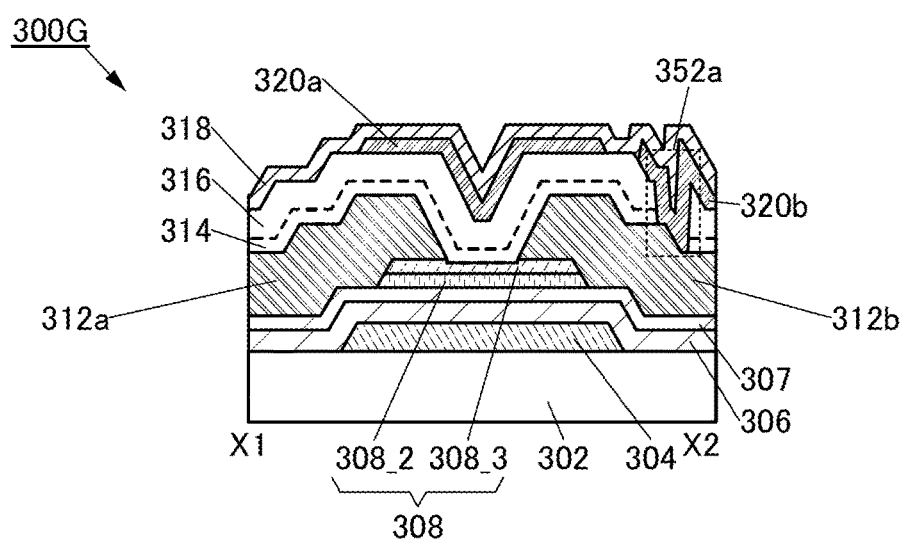
Figure 23C:
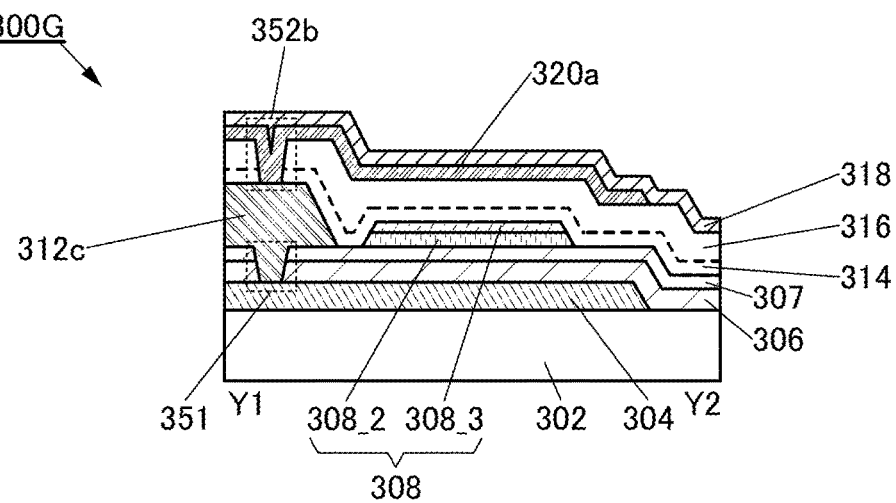

FIG. 23(A) is a top view of a transistor 300G. FIG. 23(B) corresponds to a cross-sectional view of a cutting surface along a dashed-dotted line X1-X2 in FIG. 23(A). FIG. 23(C) corresponds to a cross-sectional view of a cutting surface along a dashed-dotted line Y1-Y2 in FIG. 23(A).

The transistor 300G illustrated in FIG. 23 includes the conductive film 304 over the substrate 302, the insulating film 306 over the substrate 302 and the conductive film 304, the insulating film 307 over the insulating film 306, the oxide semiconductor film 308 over the insulating film 307, the conductive film 312a over the oxide semiconductor film 308, the conductive film 312b over the oxide semiconductor film 308, the insulating film 314 over the oxide semiconductor film 308, the conductive film 312a, and the conductive film 312b, the insulating film 316 over the insulating film 314, the conductive film 320a over the insulating film 316, and the conductive film 320b over the insulating film 316.

The insulating film 306 and the insulating film 307 have an opening 351. A conductive film 312c, which is electrically connected to the conductive film 304 through the opening 351, is formed over the insulating film 306 and the insulating film 307. The insulating film 314 and the insulating film 316 have an opening 352a that reaches the conductive film 312b and an opening 352b that reaches the conductive film 312c.

The oxide semiconductor film 308 includes the oxide semiconductor film 308_2 on the conductive film 304 side and the oxide semiconductor film 308_3 over the oxide semiconductor film 308_2.

The insulating film 318 is provided over the transistor 300G. The insulating film 318 is formed to cover the insulating film 316, the conductive film 320a, and the conductive film 320b.

In the transistor 300G, the insulating films 306 and 307 function as a first gate insulating film of the transistor 300G, the insulating films 314 and 316 function as a second gate insulating film of the transistor 300G, and the insulating film 318 functions as a protective insulating film of the transistor 300G. Furthermore, in the transistor 300G, the conductive film 304 functions as a first gate electrode, the conductive film 320a functions as a second gate electrode, and the conductive film 320b functions as a pixel electrode used for a display device. Moreover, in the transistor 300G, the conductive film 312a functions as a source electrode and the conductive film 312b functions as a drain electrode. Furthermore, in the transistor 300G, the conductive film 312c functions as a connection electrode.

Note that the transistor 300G has the S-channel structure described above.

The structures of the transistor 300A to the transistor 300G can be freely combined with each other.

<2-10. Components of Transistor>

Next, components of the transistor described above are described in detail.

[Substrate]

For the substrate 102, a material having heat resistance high enough to withstand heat treatment in the manufacturing process can be used.

Specifically, non-alkali glass, soda-lime glass, alkali glass, crystal glass, quartz, sapphire, or the like can be used. Alternatively, an inorganic insulating film may be used. Examples of the inorganic insulating film include a silicon oxide film, a silicon nitride film, a silicon oxynitride film, and an aluminum oxide film.

The above non-alkali glass may have a thickness of greater than or equal to 0.2 mm and less than or equal to 0.7 mm, for example. The non-alkali glass may be polished to obtain the above thickness.

As the non-alkali glass, a large-area glass substrate of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), or the like can be used. Thus, a large-sized display device can be manufactured.

Alternatively, as the substrate 102, a single-crystal semiconductor substrate or a polycrystalline semiconductor substrate made of silicon or silicon carbide, a compound semiconductor substrate made of silicon germanium or the like, an SOI substrate, or the like may be used.

For the substrate 102, an inorganic material such as a metal may be used. Examples of the inorganic material such as a metal include stainless steel and aluminum.

Alternatively, for the substrate 102, an organic material such as a resin, a resin film, or plastic may be used. Examples of the resin film include polyester, polyolefin, polyamide (e.g., nylon or aramid), polyimide, polycarbonate, polyurethane, an acrylic resin, an epoxy resin, polyethylene terephthalate (PET), polyethylene naphthalate (PEN), polyether sulfone (PES), and a resin having a siloxane bond.

For the substrate 102, a composite material in which an inorganic material and an organic material are combined may be used. Examples of the composite material include a material in which a metal plate or a thin glass plate is bonded to a resin film, a material in which a fibrous metal, a particulate metal, a fibrous glass, or a particulate glass is dispersed into a resin film, and a material in which a fibrous resin or a particulate resin is dispersed into an inorganic material.

The substrate 102 can at least support films or layers formed thereover or thereunder and may be one or more of an insulating film, a semiconductor film, and a conductive film.

[First Insulating Film]

The insulating film 104 can be formed by a sputtering method, a CVD method, an evaporation method, a pulsed laser deposition (PLD) method, a printing method, a coating method, or the like as appropriate. For example, the insulating film 104 can be formed to have a single layer or a stacked layer including an oxide insulating film or a nitride insulating film. To improve the properties of the interface with the oxide semiconductor film 108, at least a region in the insulating film 104, which is in contact with the oxide semiconductor film 108, is preferably formed using an oxide insulating film. When an oxide insulating film from which oxygen is released by heating is used as the insulating film 104, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased, and interface states at the interface between the insulating film 104 and the oxide semiconductor film 108 and oxygen vacancies included in the channel region 108i of the oxide semiconductor film 108 can be reduced.

For example, the insulating film 104 can be provided in a single layer or a stacked layer including silicon oxide, silicon oxynitride, silicon nitride oxide, silicon nitride, aluminum oxide, hafnium oxide, gallium oxide, Ga—Zn oxide, or the like. In this embodiment, the insulating film 104 has a stacked-layer structure including a silicon nitride film and a silicon oxynitride film. With the insulating film 104 having such a stacked-layer structure including a silicon nitride film on the lower layer side and a silicon oxynitride film on the upper layer side, oxygen can be efficiently introduced into the oxide semiconductor film 108.

[Oxide Semiconductor Film]

It is favorable that the above-described composite oxide semiconductor is used for the oxide semiconductor film 108.

[Second Insulating Film]

The insulating film 110 has a function of supplying oxygen to the oxide semiconductor film 108, particularly to the channel region 108i. The insulating film 110 can be formed to have a single layer or a stacked layer of an oxide insulating film or a nitride insulating film, for example. To improve the properties of the interface with the oxide semiconductor film 108, a region in the insulating film 110, which is in contact with the oxide semiconductor film 108, is preferably formed using at least an oxide insulating film. For example, silicon oxide, silicon oxynitride, silicon nitride oxide, or silicon nitride may be used for the insulating film 110.

The thickness of the insulating film 110 can be greater than or equal to 5 nm and less than or equal to 400 nm, greater than or equal to 5 nm and less than or equal to 300 nm, or greater than or equal to 10 nm and less than or equal to 250 nm.

It is preferable that the insulating film 110 have few defects and typically have few signals observed by electron spin resonance spectroscopy (ESR) as possible. Examples of the above-described signals include an E' center observed at a g-factor of 2.001. Note that the E' center is due to the dangling bond of silicon. As the insulating film 110, a silicon oxide film or a silicon oxynitride film whose spin density due to the E' center is lower than or equal to $3 \times 10^{17}$ spins/cm$^3$ and preferably lower than or equal to $5 \times 10^{16}$ spins/cm$^3$ may be used.

In addition to the above-described signal, a signal due to nitrogen dioxide (NO$_2$) might be observed in the insulating film 110. The signal is divided into three signals according to the N nuclear spin, and these signals are observed at a g-factor of greater than or equal to 2.037 and less than or equal to 2.039 (referred to as a first signal), at a g-factor of greater than or equal to 2.001 and less than or equal to 2.003 (referred to as a second signal), and at a g-factor of greater than or equal to 1.964 and less than or equal to 1.966 (referred to as a third signal).

It is suitable to use an insulating film whose spin density due to nitrogen dioxide (NO$_2$) is higher than or equal to $1 \times 10^{17}$ spins/cm$^3$ and lower than $1 \times 10^{18}$ spins/cm$^3$ as the insulating film 110, for example.

Note that a nitrogen oxide (NO$_x$) including nitrogen dioxide (NO$_2$) forms a state in the insulating film 110. The state is positioned in the energy gap of the oxide semiconductor film 108. Thus, when nitrogen oxide (NO$_x$) is diffused to the interface between the insulating film 110 and the oxide semiconductor film 108, an electron might be trapped by the state on the insulating film 110 side. As a result, the trapped electron remains in the vicinity of the interface between the insulating film 110 and the oxide semiconductor film 108, leading to a positive shift of the threshold voltage of the transistor. Accordingly, the use of a film with a low nitrogen oxide content as the insulating film 110 can reduce a shift of the threshold voltage of the transistor.

As an insulating film that releases a small amount of nitrogen oxide (NO$_x$), for example, a silicon oxynitride film can be used. The silicon oxynitride film releases more ammonia than nitrogen oxide (NO$_x$) in thermal desorption spectroscopy analysis (TDS); the typical released amount of ammonia is greater than or equal to $1 \times 10^{18}$ cm$^3$ and less than or equal to $5 \times 10^{19}$ cm$^3$. Note that the above released amount of ammonia is the total amount of ammonia released by heat treatment in a temperature range from 50° C. to 650° C. or a range from 50° C. to 550° C. in TDS.

Since nitrogen oxide (NO$_x$) reacts with ammonia and oxygen in heat treatment, the use of an insulating film that releases a large amount of ammonia reduces nitrogen oxide (NO$_x$).

Note that in the case where the insulating film 110 is analyzed by SIMS, the nitrogen concentration in the film is preferably lower than or equal to $6 \times 10^{20}$ atoms/cm$^3$.

For the insulating film 110, a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), or hafnium oxide may be used. The use of such a high-k material enables a reduction in gate leakage of a transistor.

[Third Insulating Film]

The insulating film 116 contains nitrogen or hydrogen. The insulating film 116 may contain fluorine. A nitride insulating film can be given as the insulating film 116, for example. The nitride insulating film can be formed using silicon nitride, silicon nitride oxide, silicon oxynitride, silicon nitride fluoride, silicon fluoronitride, or the like. The hydrogen concentration in the insulating film 116 is preferably higher than or equal to $1 \times 10^{22}$ atoms/cm$^3$. Furthermore, the insulating film 116 is in contact with the source region 108$s$ and the drain region 108$d$ of the oxide semiconductor film 108. Thus, the concentration of an impurity (nitrogen or hydrogen) in the source region 108$s$ and the drain region 108$d$ in contact with the insulating film 116 is increased, leading to an increase in the carrier density of the source region 108$s$ and the drain region 108$d$.

[Fourth Insulating Film]

As the insulating film 118, an oxide insulating film can be used. Alternatively, a stacked-layer film of an oxide insulating film and a nitride insulating film can be used as the insulating film 118. For the insulating film 118, for example, silicon oxide, silicon oxynitride, silicon nitride oxide, aluminum oxide, hafnium oxide, gallium oxide, or Ga—Zn oxide is used.

Furthermore, the insulating film 118 is preferably a film which functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

[Fifth Insulating Film]

The insulating film 122 has an insulating property and is formed using an inorganic material or an organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

[Conductive Films]

The conductive films 106, 112, 120$a$, and 120$b$ can be formed by a sputtering method, a vacuum evaporation method, a pulsed laser deposition (PLD) method, a thermal CVD method, or the like. As each of the conductive films 106, 112, 120$a$, and 120$b$, a metal film having conductivity, a conductive film having a function of reflecting visible light, or a conductive film having a function of transmitting visible light may be used.

A material containing a metal element selected from aluminum, gold, platinum, silver, copper, chromium, tantalum, titanium, molybdenum, tungsten, nickel, iron, cobalt, palladium, and manganese can be used for the metal film having conductivity. Alternatively, an alloy containing any of the above-described metal elements may be used.

For the above-described metal film having conductivity, specifically a two-layer structure in which a copper film is stacked over a titanium film, a two-layer structure in which a copper film is stacked over a titanium nitride film, a two-layer structure in which a copper film is stacked over a tantalum nitride film, a three-layer structure in which a copper film is stacked over a titanium film, and a titanium film is formed thereover, or the like may be used. In particular, a conductive film containing a copper element is preferably used, in which case the resistance can be reduced. As an example of the conductive film containing a copper element, an alloy film containing copper and manganese is given. The alloy film is preferable because it can be processed by a wet etching method.

Note that a tantalum nitride film is preferably used as the conductive films 106, 112, 120a, and 120b. The tantalum nitride film has conductivity and high barrier properties against copper or hydrogen. The tantalum nitride film can be used most preferably as a metal film in contact with the oxide semiconductor film 108 or a metal film in the vicinity of the oxide semiconductor film 108 because the amount of hydrogen released from the tantalum nitride film is small.

As the above-described conductive film having conductivity, a conductive high molecule or a conductive polymer may be used.

For the above-described conductive film having a function of reflecting visible light, a material containing a metal element selected from gold, silver, copper, and palladium can be used. In particular, a conductive film containing a silver element is preferably used because reflectance of visible light can be increased.

For the above-described conductive film having a function of transmitting visible light, a material containing one or more selected from In, Sn, Zn, Ga, and Si. Specifically, In oxide, Zn oxide, In—Sn oxide, In—Sn—Si oxide, In—Zn oxide, In—Ga—Zn oxide, or the like can be used.

As the above-described conductive film having a function of transmitting visible light, a film containing graphene or graphite may be used. The film containing graphene can be formed by forming a film containing graphene oxide and reducing the film containing graphene oxide. As the reducing method, a method with application of heat, a method using a reducing agent, or the like can be employed.

The conductive films 112, 120a, and 120b can be formed by electroless plating. As a material that can be formed by the electroless plating, for example, one or more elements selected from Cu, Ni, Al, Au, Sn, Co, Ag, and Pd can be used. It is particularly favorable to use Cu or Ag because the resistance of the conductive film can be reduced.

When the conductive film is formed by electroless plating, a diffusion prevention film may be formed under the conductive film to prevent constituent elements of the conductive film from diffusing outward. A seed layer that can make the conductive film grow may be formed between the diffusion prevention film and the conductive film. The above diffusion prevention film can be formed by a sputtering method, for example. As the diffusion prevention film, a tantalum nitride film or a titanium nitride film can be used, for example. The above seed layer can be formed by electroless plating. For the seed layer, a material similar to the material for the conductive film that can be formed by electroless plating can be used.

Note that an oxide semiconductor typified by In—Ga—Zn oxide may be used for the conductive film 112. The oxide semiconductor can have a high carrier density when nitrogen or hydrogen is supplied from the insulating film 116. In other words, the oxide semiconductor functions as an oxide conductor (OC). Accordingly, the oxide semiconductor can be used for a gate electrode. Moreover, the composite oxide semiconductor of one embodiment of the present invention with a high carrier density may be used for the conductive film 112.

The conductive film 112 can have, for example, a single-layer structure of an oxide conductor (OC), a single-layer structure of a metal film, or a stacked-layer structure of an oxide conductor (OC) and a metal film.

Note that it is preferable that the conductive film 112 has a single-layer structure of a light-blocking metal film or a stacked-layer structure of an oxide conductor (OC) and a light-blocking metal film because the channel region 108i formed under the conductive film 112 can be shielded from light. In the case where the conductive film 112 has a stacked-layer structure of an oxide semiconductor or an oxide conductor (OC) and a light-blocking metal film, a metal film (e.g., a titanium film or a tungsten film) is formed over the oxide semiconductor or the oxide conductor (OC), whereby the resistance of the oxide semiconductor or the oxide conductor (OC) is reduced by the diffusion of the constituent element in the metal film to the oxide semiconductor or oxide conductor (OC) side, the resistance is reduced by damage (e.g., sputtering damage) during the deposition of the metal film, or the resistance is reduced when oxygen vacancies are formed by the diffusion of oxygen in the oxide semiconductor or the oxide conductor (OC) to the metal film.

The thicknesses of the conductive films 106, 112, 120a, and 120b can be greater than or equal to 30 nm and less than or equal to 500 nm, or greater than or equal to 100 nm and less than or equal to 400 nm.

At least part of this embodiment can be implemented in combination with the other embodiments described in this specification as appropriate.

Embodiment 3

In this embodiment, examples of a display device that includes the semiconductor device described in the above embodiments are described below with reference to FIG. 24 to FIG. 31.

Figure 24:
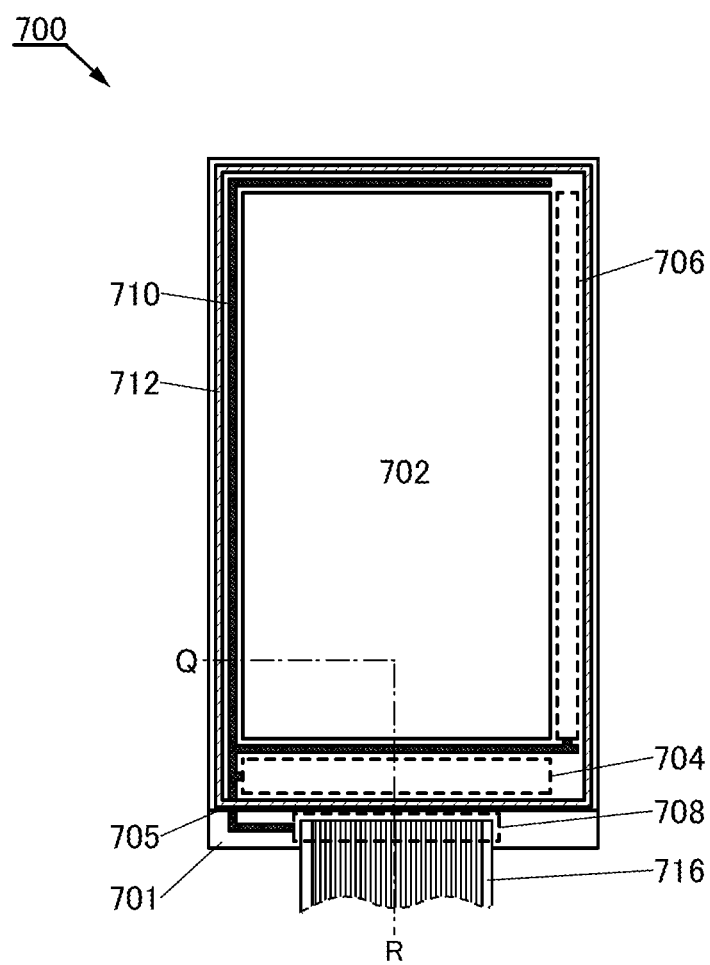
FIG. 24 A top view illustrating one embodiment of a display device.

FIG. 24 is a top view showing an example of a display device. A display device 700 illustrated in FIG. 24 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. Note that the first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Note that although not illustrated in FIG. 24, a display element is provided between the first substrate 701 and the second substrate 705.

In the display device 700, an FPC terminal portion 708 (FPC: Flexible Printed Circuit) electrically connected to each of the pixel portion 702, the source driver circuit portion 704, the gate driver circuit portion 706, and the gate driver circuit portion 706 is provided in a region different from the region which is surrounded by the sealant 712 and positioned over the first substrate 701. An FPC 716 is connected to the FPC terminal portion 708, and a variety of signals and the like are supplied from the FPC 716 to the pixel portion 702, the source driver circuit portion 704, and the gate driver circuit portion 706. A signal line 710 is connected to the pixel portion 702, the source driver circuit portion 704, the gate driver circuit portion 706, and the FPC terminal portion 708. A variety of signals and the like supplied from the FPC 716 are supplied to the pixel portion 702, the source driver circuit portion 704, the gate driver circuit portion 706, and the FPC terminal portion 708 via the signal line 710.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate over which a source driver circuit, a gate driver circuit, or the like is formed (e.g., a driver circuit substrate formed using a single-crystal semiconductor film or a polycrystalline semiconductor film) may be formed on the first substrate 701. Note that there is no particular limitation on the method for connecting a separately prepared driver circuit substrate, and a COG (chip on glass) method, a wire bonding method, or the like can be used.

The pixel portion 702, the source driver circuit portion 704, and the gate driver circuit portion 706 included in the display device 700 include a plurality of transistors.

The display device 700 can include a variety of elements. Examples of the elements include an electroluminescent (EL) element (e.g., an EL element containing an organic material and an inorganic material, an organic EL element, an inorganic EL element, and an LED), a light-emitting transistor element (a transistor that emits light depending on current), an electron emitter, a liquid crystal element, an electronic ink element, an electrophoretic element, an electrowetting element, a plasma display panel (PDP), a MEMS (microelectromechanical systems) display (e.g., a grating light valve (GLV), a digital micromirror device (DMD), a digital micro shutter (DMS) element, and an interferometric modulation (IMOD) element), and a piezoelectric ceramic display.

An example of a display device using an EL element is an EL display. Examples of display devices using electron emitters are a field emission display (FED) and an SED-type flat panel display (SED: Surface-conduction Electron-emitter Display). Examples of display devices using liquid crystal elements include liquid crystal displays (e.g., a transmissive liquid crystal display, a transflective liquid crystal display, a reflective liquid crystal display, a direct-view liquid crystal display, and a projection liquid crystal display). An example of a display device using an electronic ink element or an electrophoretic element is electronic paper. Note that in the case where a transflective liquid crystal display or a reflective liquid crystal display is achieved, some of or all of pixel electrodes function as reflective electrodes. For example, some of or all of pixel electrodes contain aluminum, silver, or the like. Moreover, in such a case, a memory circuit such as an SRAM can be provided under the reflective electrodes. Thus, the power consumption can be further reduced.

Note that as a display method in the display device 700, a progressive method, an interlace method, or the like can be employed. Furthermore, color elements controlled in a pixel at the time of color display are not limited to three colors: R, G, and B (R, G, and B represent red, green, and blue, respectively). For example, four pixels of the R pixel, the G pixel, the B pixel, and a W (white) pixel may be employed. Alternatively, a color element may be composed of two colors among R, G, and B as in PenTile layout; the two colors may differ among color elements. Alternatively, one or more colors of yellow, cyan, magenta, and the like may be added to RGB. Note that the size of a display region may be different depending on respective dots of the color elements. Note that the disclosed invention is not limited to a display device for color display and can also be applied to a display device for monochrome display.

A coloring layer (also referred to as a color filter) may be used to make a display device perform full-color display in which white light (W) is used for a backlight (e.g., an organic EL element, an inorganic EL element, an LED, or a fluorescent lamp). For example, for the coloring layer, red (R), green (G), blue (B), and yellow (Y) can be used in combination as appropriate. With the use of the coloring layer, higher color reproducibility can be obtained than without the coloring layer. In this case, by providing a region with the coloring layer and a region without the coloring layer, white light in the region without the coloring layer may be directly utilized for display. By partly providing the region without the coloring layer, a decrease in luminance of a bright image due to the coloring layer can be suppressed, and power consumption can sometimes be reduced by approximately 20% to 30%. Note that in the case where full-color display is performed using a self-luminous element such as an organic EL element or an inorganic EL element, elements may emit light of their respective colors R, G, B, Y, and W. By using a self-luminous element, power consumption can sometimes be further reduced compared with the case of using the coloring layer.

As a coloring method, other than a method in which part of light emission from the above-described white light emission is converted into red, green, and blue through color filters as described above (a color filter method), a method in which red light emission, green light emission, and blue light emission are used (a three-color method) or a method in which part of light emission from blue light emission is converted into red or green (a color conversion method or a quantum dot method) may be used.

Figure 25:
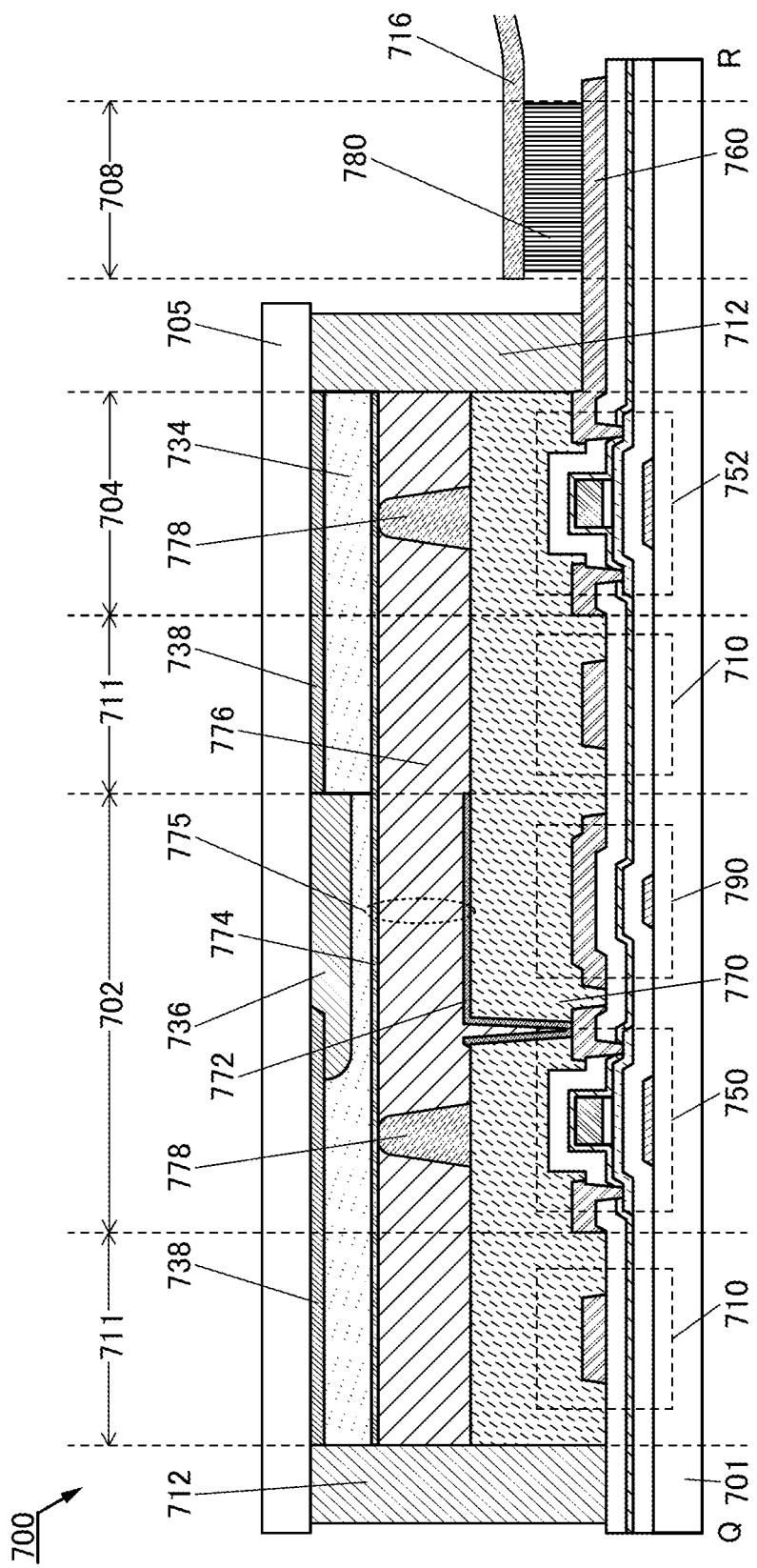
FIG. 25 A cross-sectional view illustrating one embodiment of a display device.
Figure 26:
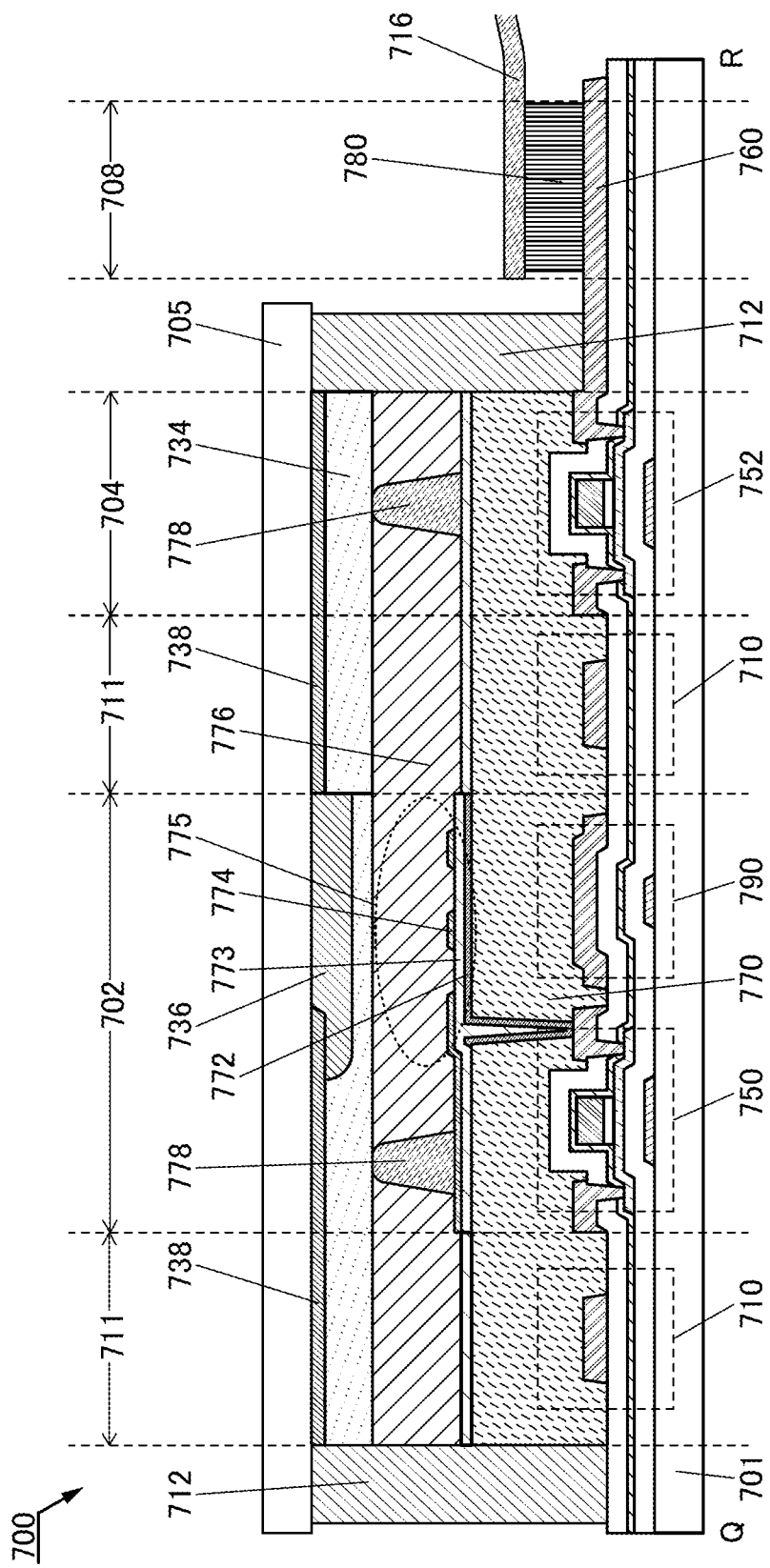
FIG. 26 A cross-sectional view illustrating one embodiment of a display device.
Figure 27:
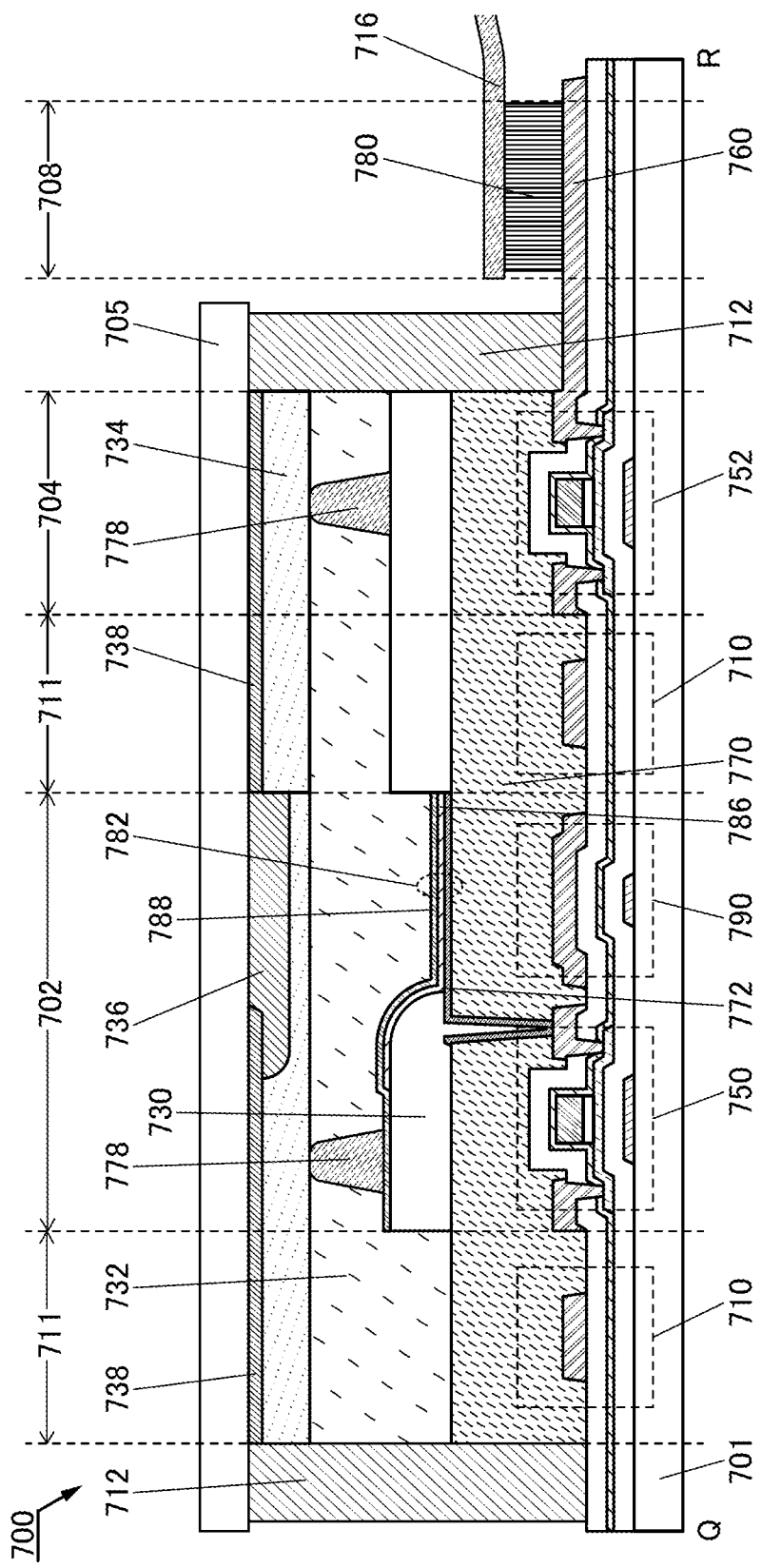
FIG. 27 A cross-sectional view illustrating one embodiment of a display device.

In this embodiment, structures using a liquid crystal element and an EL element as display elements are described with reference to FIG. 25 to FIG. 27. Note that FIG. 25 and FIG. 26 are cross-sectional views along a dashed-dotted line Q-R shown in FIG. 24 and each show a structure using a liquid crystal element as a display element. FIG. 27 is a cross-sectional view taken along dashed-dotted line Q-R shown in FIG. 24 and shows a structure using an EL element as a display element.

Portions common to FIG. 25 to FIG. 27 are described first, and then different portions are described below.

<3-1. Description of Common Portions in Display Devices>

Display devices 700 illustrated in FIG. 25 to FIG. 27 each include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 100A described above. Note that the transistor 750 and the transistor 752 may each have the structure of any of the other transistors described in the above embodiments.

The transistor used in this embodiment is highly purified and includes an oxide semiconductor film in which formation of oxygen vacancy is suppressed. The transistor can have a low off-state current. Accordingly, an electrical signal such as an image signal can be held for a longer period, and a writing interval can be set longer in an on state. Accordingly, the frequency of refresh operation can be reduced, which leads to an effect of suppressing power consumption.

In addition, the transistor used in this embodiment can have relatively high field-effect mobility and thus is capable of high-speed operation. For example, in a liquid crystal display device that uses such a transistor capable of high-speed operation, a switching transistor in a pixel portion and a driver transistor used in a driver circuit portion can be formed over one substrate. That is, a semiconductor device formed using a silicon wafer or the like is not additionally needed as a driver circuit, by which the number of components of the semiconductor device can be reduced. Moreover, the use of the transistor capable of high-speed operation in the pixel portion can provide a high-quality image.

The capacitor 790 includes a lower electrode that is formed through a step of processing the same conductive film as a conductive film functioning as a first gate electrode included in the transistor 750 and an upper electrode that is formed through a step of processing the same conductive film as a conductive film functioning as a second gate electrode included in the transistor 750. Between the lower electrode and the upper electrode, an insulating film formed through a step of forming an insulating film which is the same as an insulating film functioning as a first gate insulating film included in the transistor 750 and an insulating film formed through a step of forming an insulating film which is the same as an insulating film functioning as a protective insulating film over the transistor 750 are provided. That is, the capacitor 790 has a stacked-layer structure in which the insulating films functioning as dielectric films are positioned between a pair of electrodes.

In FIG. 25 to FIG. 27, a planarization insulating film 770 is provided over the transistor 750, the transistor 752, and the capacitor 790.

Although FIG. 25 to FIG. 27 each illustrate an example in which transistors with the same structure are used as the transistor 750 included in the pixel portion 702 and the transistor 752 included in the source driver circuit portion 704, one embodiment of the present invention is not limited thereto. For example, the pixel portion 702 and the source driver circuit portion 704 may include different transistors. Specifically, a structure in which a top-gate transistor is used in the pixel portion 702 and a bottom-gate transistor is used in the source driver circuit portion 704, a structure in which a bottom-gate transistor is used in the pixel portion 702 and a top-gate transistor is used in the source driver circuit portion 704, and the like are given. Note that "source driver circuit portion 704" described above can be replaced with "gate driver circuit portion".

The signal line 710 is formed through the same step as the conductive films functioning as source electrodes and drain electrodes of the transistors 750 and 752. When the signal line 710 is formed using a material containing a copper element, for example, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same step as the conductive films functioning as the source electrodes and the drain electrodes of the transistors 750 and 752. The connection electrode 760 is electrically connected to a terminal included in the FPC 716 through the anisotropic conductive film 780.

For example, glass substrates can be used as the first substrate 701 and the second substrate 705. Alternatively, flexible substrates may be used as the first substrate 701 and the second substrate 705. As an example of the flexible substrate, a plastic substrate is given.

A structure body 778 is provided between the first substrate 701 and the second substrate 705. The structure body 778 is a columnar spacer obtained by selective etching of an insulating film and is provided to control the distance (cell gap) between the first substrate 701 and the second substrate 705. Note that a spherical spacer may be used as the structure body 778.

A light-blocking film 738 functioning as a black matrix, a coloring film 736 functioning as a color filter, and an insulating film 734 in contact with the light-blocking film 738 and the coloring film 736 are provided on the second substrate 705 side.

<3-2. Structure Example of Display Device Using Liquid Crystal Element>

The display device 700 illustrated in FIG. 25 includes a liquid crystal element 775. The liquid crystal element 775 includes a conductive film 772, a conductive film 774, and a liquid crystal layer 776. The conductive film 774 is provided on the second substrate 705 side and has a function as a counter electrode. The display device 700 illustrated in FIG. 25 can display an image in such a manner that transmission or non-transmission of light is controlled by the alignment state in the liquid crystal layer 776 that is changed depending on the voltage applied between the conductive film 772 and the conductive film 774.

The conductive film 772 is electrically connected to the conductive film functioning as the source electrode and the drain electrode included in the transistor 750. The conductive film 772 is formed over the planarization insulating film 770 to function as a pixel electrode, i.e., one electrode of the display element.

A conductive film that has a light-transmitting property with respect to visible light or a conductive film that has a reflective property with respect to visible light can be used as the conductive film 772. The conductive film that has a light-transmitting property with respect to visible light is preferably formed using a material containing one selected from indium (In), zinc (Zn), and tin (Sn), for example. The conductive film that has a reflective property with respect to visible light is preferably formed using a material containing aluminum or silver, for example.

In the case where a conductive film that has a reflective property with respect to visible light is used as the conductive film 772, the display device 700 is a reflective liquid crystal display device. In the case where a conductive film that has a reflective property with respect to visible light is used as the conductive film 772, the display device 700 is a transmissive liquid crystal display device.

A method for driving a liquid crystal element can be changed with the change in the structure over the conductive film 772. An example in that case is shown in FIG. 26. The display device 700 illustrated in FIG. 26 is an example of employing a horizontal electric field mode (e.g., an FFS mode) as a driving mode of the liquid crystal element. In the structure illustrated in FIG. 26, an insulating film 773 is provided over the conductive film 772, and the conductive film 774 is provided over the insulating film 773. In this case, the conductive film 774 has a function as a common electrode, and an electric field generated between the conductive film 772 and the conductive film 774 through the insulating film 773 can control the alignment state in the liquid crystal layer 776.

Although not illustrated in FIG. 25 and FIG. 26, one of or both the conductive film 772 and the conductive film 774 may be provided with an alignment film on a side in contact with the liquid crystal layer 776. Although not illustrated in FIG. 25 and FIG. 26, an optical member (optical substrate) or the like such as a polarizing member, a retardation member, or an anti-reflection member may be provided as appropriate. For example, circular polarization may be employed by using a polarizing substrate and a retardation substrate. In addition, a backlight, a side light, or the like may be used as a light source.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case of employing a horizontal electric field mode, a liquid crystal exhibiting a blue phase for which an alignment film is not used may be used. The blue phase is one of liquid crystal phases, which appears just before a cholesteric phase changes into an isotropic phase while the temperature of a cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition that contains a liquid crystal exhibiting the blue phase and a chiral material has a short response time and optical isotropy, which makes the alignment process unneeded. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Moreover, the liquid crystal material that exhibits the blue phase has small viewing angle dependence.

In the case where a liquid crystal element is used as the display element, a TN (Twisted Nematic) mode, an IPS (In-Plane-Switching) mode, an FFS (Fringe Field Switching) mode, an ASM (Axially Symmetric aligned Micro-cell) mode, an OCB (Optical Compensated Birefringence) mode, an FLC (Ferroelectric Liquid Crystal) mode, an AFLC (AntiFerroelectric Liquid Crystal) mode, or the like can be used.

Furthermore, a normally black liquid crystal display device, for example, a transmissive liquid crystal display device utilizing a vertical alignment (VA) mode, may be used. There are some examples of a vertical alignment mode; for example, an MVA (Multi-domain Vertical Alignment) mode, a PVA (Patterned Vertical Alignment) mode, an ASV mode, or the like can be employed.

<3-3. Display Device Using Light-Emitting Element>

The display device 700 illustrated in FIG. 27 includes a light-emitting element 782. The light-emitting element 782 includes the conductive film 772, an EL layer 786, and a conductive film 788. The display device 700 illustrated in FIG. 27 is capable of displaying an image by light emission from the EL layer 786 included in the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Group 12 and Group 16, elements belonging to Group 13 and Group 15, or elements belonging to Group 14 and Group 16 may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

The above-described organic compound and the inorganic compound can be deposited by a method such as an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be included in the EL layer 786.

Here, a method for forming the EL layer 786 by a droplet discharge method is described with reference to FIG. 30. FIG. 30(A) to FIG. 30(D) are cross-sectional views illustrating the method for manufacturing the EL layer 786.

Figure 30A:
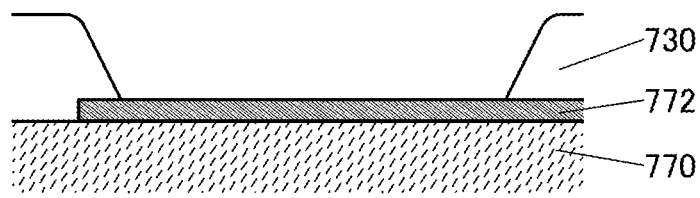
FIGS. 30A to 30D Cross-sectional views illustrating a method for manufacturing an EL layer.
Figure 30B:
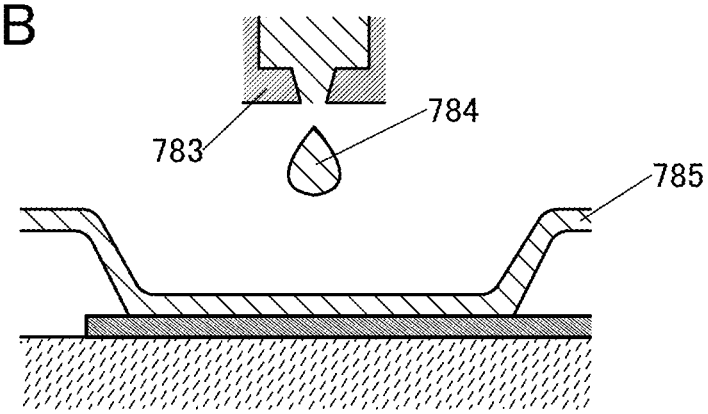

First, the conductive film 772 is formed over the planarization insulating film 770, and an insulating film 730 is formed to cover part of the conductive film 772 (see FIG. 30(A)).

Then, a droplet 784 is discharged from a droplet discharge apparatus 783 to an exposed portion of the conductive film 772, which is an opening of the insulating film 730, so that a layer 785 containing a composition is formed. The droplet 784 is a composition containing a solvent and is attached over the conductive film 772 (see FIG. 30(B)).

Note that the step of discharging the droplet 784 may be performed under reduced pressure.

Figure 30C:
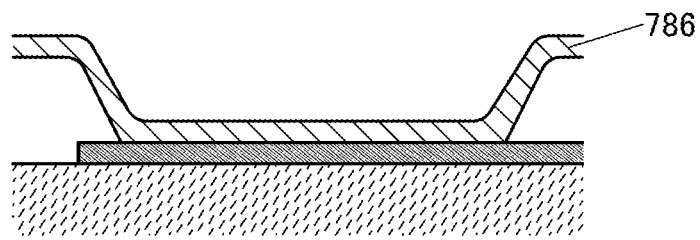

Then, the solvent is removed from the layer 785 containing the composition, and the layer is solidified to form the EL layer 786 (see FIG. 30(C)).

Note that as the method for removing the solvent, a drying process or a heating process is performed.

Figure 30D:
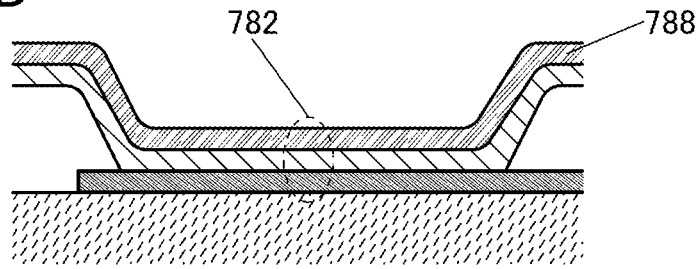

Next, the conductive film 788 is formed over the EL layer 786; thus, the light-emitting element 782 is formed (see FIG. 30(D)).

When the EL layer 786 is formed by a droplet discharge method as described above, the composition can be selectively discharged; accordingly, waste of material can be reduced. Furthermore, a lithography process or the like for shaping is not needed, and thus, the process can be simplified and cost reduction can be achieved.

Note that the above-described droplet discharge method is a general term for a method with a droplet discharge means such as a nozzle having a composition discharge outlet or a head having one or a plurality of nozzles.

Figure 31:
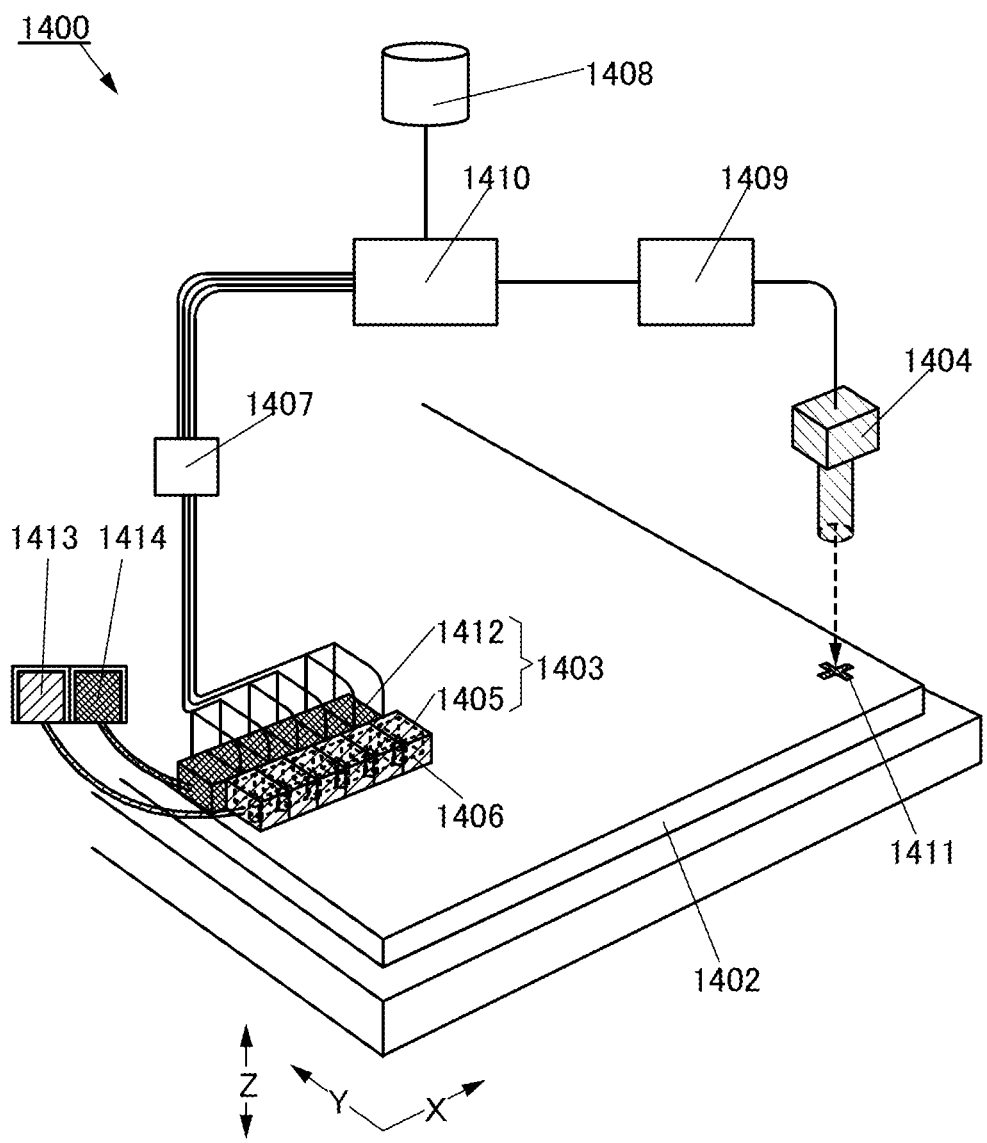
FIG. 31 A conceptual view illustrating a droplet discharge apparatus.

Next, a droplet discharge apparatus used for the droplet discharge method is described with reference to FIG. 31. FIG. 31 is a conceptual view illustrating a droplet discharge apparatus 1400.

The droplet discharge apparatus 1400 includes a droplet discharge means 1403. In addition, the droplet discharge means 1403 includes a head 1405 and a head 1412.

The head 1405 and the head 1412 are connected to a control means 1407 which is controlled by a computer 1410; thus, a preprogrammed pattern can be drawn.

The drawing may be conducted at a timing, for example, based on a marker 1411 formed over a substrate 1402. Alternatively, the reference point may be determined on the basis of an outer edge of the substrate 1402. Here, the marker 1411 is detected by an imaging means 1404 and converted into a digital signal by an image processing means 1409. The computer 1410 recognizes the digital signal, generates a control signal, and transmits it to the control means 1407.

An image sensor or the like utilizing a charge coupled device (CCD) or a complementary metal-oxide-semiconductor (CMOS) can be used as the imaging means 1404. Note that information about a pattern to be formed over the substrate 1402 is stored in a storage medium 1408, and on the basis of the information, a control signal is transmitted to the control means 1407, and each of the head 1405 and the head 1412 of the droplet discharge means 1403 can be individually controlled. The head 1405 and the head 1412 are supplied with a material to be discharged from a material supply source 1413 and a material supply source 1414 through pipes, respectively.

Inside the head 1405, a space as indicated by a dotted line 1406 to be filled with a liquid material and a nozzle which is a discharge outlet are provided. Although not illustrated, the inside structure of the head 1412 is similar to that of the head 1405. When the nozzle sizes of the head 1405 and the head 1412 are different from each other, different materials with different widths can be discharged simultaneously. Each head can discharge a plurality of light-emitting materials or the like to draw a pattern. In the case of drawing a pattern over a large area, the same material can be simultaneously discharged from a plurality of nozzles in order to improve throughput. When a large substrate is used, the head 1405 and the head 1412 can freely scan the substrate in directions indicated by arrows X, Y, and Z shown in FIG. 31, and a region in which a pattern is drawn can be freely set. Thus, a plurality of the same patterns can be drawn over one substrate.

Furthermore, the step of discharging the composition may be performed under reduced pressure. The substrate may be heated when the composition is discharged. The discharge of the composition is followed by one of or both drying and baking. Both the drying and baking are heat treatment but different in purpose, temperature, and time. The drying step and the baking step are performed under normal pressure or reduced pressure by laser irradiation, rapid thermal annealing, heating in a heating furnace, or the like. Note that there is no particular limitation on the timing of the heat treatment and the number of times of the heat treatment. The temperature for adequately performing the drying and baking steps depends on the material of the substrate and the properties of the composition.

In the above-described manner, the EL layer 786 can be manufactured with the droplet discharge apparatus.

The display device 700 illustrated in FIG. 27 is described again.

In the display device 700 illustrated in FIG. 27, an insulating film 730 is provided over the planarization insulating film 770 and the conductive film 772. The insulating film 730 covers part of the conductive film 772. Note that the light-emitting element 782 has a top-emission structure. Therefore, the conductive film 788 has a light-transmitting property and transmits light emitted from the EL layer 786. Note that although the top-emission structure is described as an example in this embodiment, one embodiment of the present invention is not limited thereto. For example, a bottom-emission structure in which light is emitted to the conductive film 772 side, or a dual-emission structure in which light is emitted to both the conductive film 772 and the conductive film 788 can also be employed.

The coloring film 736 is provided at a position overlapping with the light-emitting element 782. The light-blocking film 738 is provided at a position overlapping with the insulating film 730, in the lead wiring portion 711, and in the source driver circuit portion 704. The coloring film 736 and the light-blocking film 738 are covered with the insulating film 734. A space between the light-emitting element 782 and the insulating film 734 is filled with a sealing film 732. Note that although a structure with the coloring film 736 is described as the display device 700 shown in FIG. 27, the structure is not limited thereto. For example, a structure without the coloring film 736 may also be employed in the case where the EL layer 786 is formed by separate coloring.

<3-4. Structure Example of Display Device Provided with Input/Output Device>

An input/output device may be provided in the display device 700 illustrated in FIG. 26 and FIG. 27. As the input/output device, for example, a touch panel and the like are given.

Figure 28:
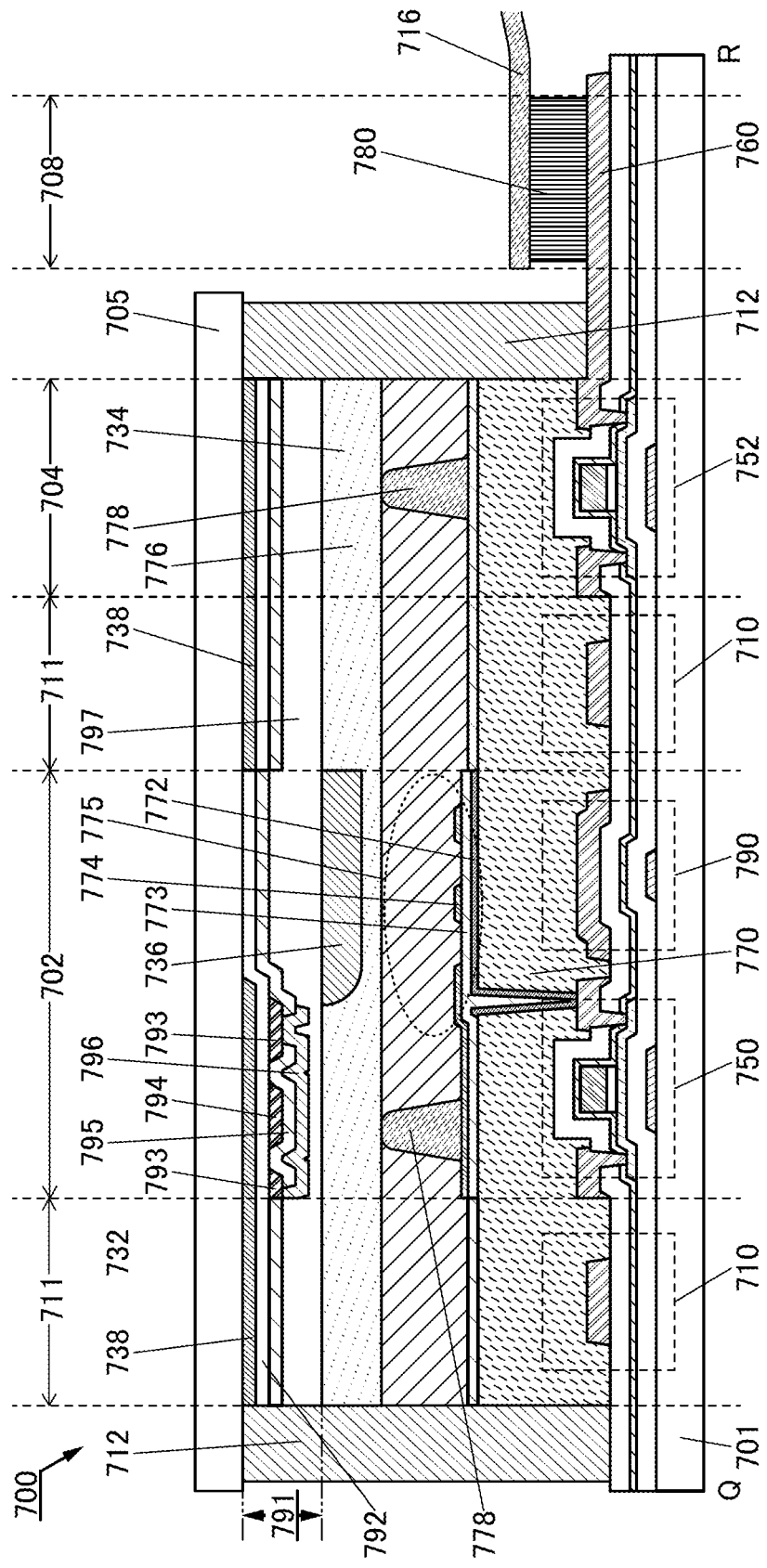
FIG. 28 A cross-sectional view illustrating one embodiment of a display device.
Figure 29:
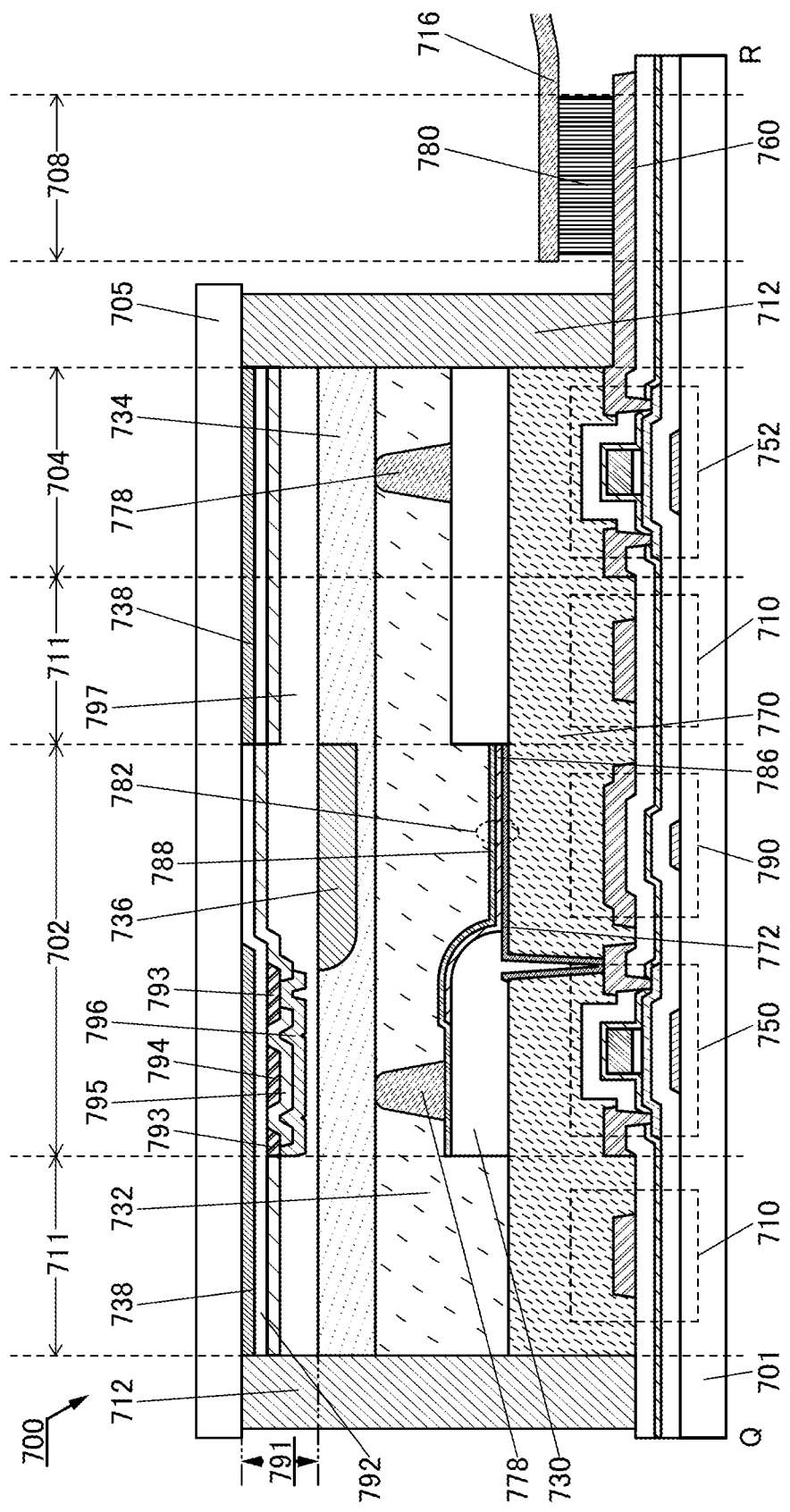
FIG. 29 A cross-sectional view illustrating one embodiment of a display device.

FIG. 28 illustrates a structure in which the display device 700 illustrated in FIG. 26 is provided with a touch panel 791. FIG. 29 illustrates a structure in which the display device 700 shown in FIG. 27 is provided with the touch panel 791.

FIG. 28 is a cross-sectional view of the structure in which the touch panel 791 is provided in the display device 700 illustrated in FIG. 26. FIG. 29 is a cross-sectional view of the structure in which the touch panel 791 is provided in the display device 700 illustrated in FIG. 27.

First, the touch panel 791 illustrated in FIG. 28 and FIG. 29 is described below.

The touch panel 791 illustrated in FIG. 28 and FIG. 29 is what is called an in-cell touch panel provided between the substrate 705 and the coloring film 736. The touch panel 791 is formed on the substrate 705 side before the light-blocking film 738 and the coloring film 736 are formed.

Note that the touch panel 791 includes the light-blocking film 738, an insulating film 792, an electrode 793, an electrode 794, an insulating film 795, an electrode 796, and an insulating film 797. A change in the mutual capacitance between the electrode 793 and the electrode 794 can be detected when an object such as a finger or a stylus approaches, for example.

A portion in which the electrode 793 intersects with the electrode 794 is illustrated in the upper portion of the transistor 750 illustrated in FIG. 28 and FIG. 29. Through openings provided in the insulating film 795, the electrode 796 is electrically connected to two electrodes 793 between which the electrode 794 is sandwiched. Note that a structure in which a region where the electrode 796 is provided is provided in the pixel portion 702 is illustrated in FIG. 28 and FIG. 29 as an example; however, one embodiment of the present invention is not limited thereto. For example, the region may be provided in the source driver circuit portion 704.

The electrode 793 and the electrode 794 are provided in a region overlapping with the light-blocking film 738. As illustrated in FIG. 28, it is preferable that the electrode 793 not overlap with the light-emitting element 782. As illustrated in FIG. 29, it is preferable that the electrode 793 not overlap with the liquid crystal element 775. In other words, the electrode 793 has an opening in a region overlapping with the light-emitting element 782 and the liquid crystal element 775. That is, the electrode 793 has a mesh shape. With this structure, the electrode 793 can have a structure in which light emitted from the light-emitting element 782 is not blocked. Alternatively, the electrode 793 can have a structure in which light transmitted through the liquid crystal element 775 is not blocked. Thus, since a reduction in luminance due to the placement of the touch panel 791 is extremely small, a display device with high visibility and low power consumption can be achieved. Note that the electrode 794 can have a similar structure.

In addition, since the electrode 793 and the electrode 794 do not overlap with the light-emitting element 782, a metal material with low visible light transmittance can be used for the electrode 793 and the electrode 794. Alternatively, since the electrode 793 and the electrode 794 do not overlap with the liquid crystal element 775, a metal material having low transmittance with respect to visible light can be used for the electrode 793 and the electrode 794.

Accordingly, the resistance of the electrode 793 and the electrode 794 can be reduced compared with an electrode using an oxide material with high visible light transmittance, so that the sensitivity of the touch panel can be increased.

For example, a conductive nanowire may be used for the electrodes 793, 794, and 796.

The nanowire has a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the above nanowire, a metal nanowire such as an Ag nanowire, a Cu nanowire, or an Al nanowire, a carbon nanotube, or the like is used. For example, in the case where an Ag nanowire is used for any one of or all of the electrodes 664, 665, and 667, the light transmittance of visible light can be greater than or equal to 89% and the sheet resistivity can be greater than or equal to 40/square and less than or equal to 100 Ω/square.

Although the structure of the in-cell touch panel is illustrated in FIG. 28 and FIG. 29, one embodiment of the present invention is not limited thereto. For example, a touch panel formed over the display device 700, what is called an on-cell touch panel, or a touch panel attached to the display device 700, what is called an out-cell touch panel, may be used.

In this manner, the display device of one embodiment of the present invention can be combined with various types of touch panel.

At least part of this embodiment can be implemented in combination with the other embodiments described in this specification as appropriate.

Embodiment 4

In this embodiment, a display device that includes a semiconductor device of one embodiment of the present invention will be described with reference to FIG. 32.

<4. Circuit Configuration of Display Device>

The display device illustrated in FIG. 32(A) includes a region including pixels of display elements (hereinafter referred to as a pixel portion 502), a circuit portion being provided outside the pixel portion 502 and including a circuit for driving the pixels (hereinafter referred to as a driver circuit portion 504), circuits each having a function of protecting an element (hereinafter referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or TAB (tape automated bonding).

The pixel portion 502 includes a plurality of circuits for driving display elements arranged in X rows (X is a natural number of 2 or more) and Y columns (Y is a natural number of 2 or more) (hereinafter referred to as pixel circuits 501). The driver circuit portion 504 includes driver circuits such as a circuit for outputting a signal (scan signal) to select a pixel (hereinafter referred to as a gate driver 504a) and a circuit for supplying a signal (data signal) to drive a display element in a pixel (hereinafter referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter referred to as scan lines GL_1 to GL_X). Note that a plurality of gate drivers 504a may be provided and the scan lines GL_1 to GL_X may be separately controlled by the plurality of gate drivers 504a. Alternatively, the gate driver 504a has a function of supplying an initialization signal. Without being limited thereto, the gate driver 504a can supply another signal.

The source driver 504b includes a shift register or the like. The source driver 504b receives a signal (image signal) from which a data signal is derived, as well as a signal for driving the shift register, through the terminal portion 507. The source driver 504b has a function of generating a data signal to be written to the pixel circuit 501 on the basis of the image signal. In addition, the source driver 504b has a function of controlling output of a data signal in response to a pulse signal produced by input of a start pulse, a clock signal, or the like. Furthermore, the source driver 504b has a function of controlling the potentials of wirings supplied with data signals (hereinafter referred to as data lines DL_1 to DL_Y). Alternatively, the source driver 504b has a function of supplying an initialization signal. However, without being limited thereto, the source driver 504b can supply another signal.

The source driver 504b includes a plurality of analog switches, for example. The source driver 504b can output, as the data signals, signals obtained by time-dividing the image signal by sequentially turning on the plurality of analog switches. The source driver 504b may include a shift register or the like.

A pulse signal and a data signal are inputted to each of the plurality of pixel circuits 501 through one of the plurality of scan lines GL supplied with scan signals and one of the plurality of data lines DL supplied with data signals, respectively. Writing and holding of data of the data signal to and in each of the plurality of pixel circuits 501 are controlled by the gate driver 504a. For example, to the pixel circuit 501 in the m-th row and the n-th column, a pulse signal is inputted from the gate driver 504a through the scan line GL_m (m is a natural number less than or equal to X) and a data signal is inputted from the source driver 504b through the data line DL_n (n is a natural number less than or equal to Y) in accordance with the potential of the scan line GL_m.

Figure 32A:
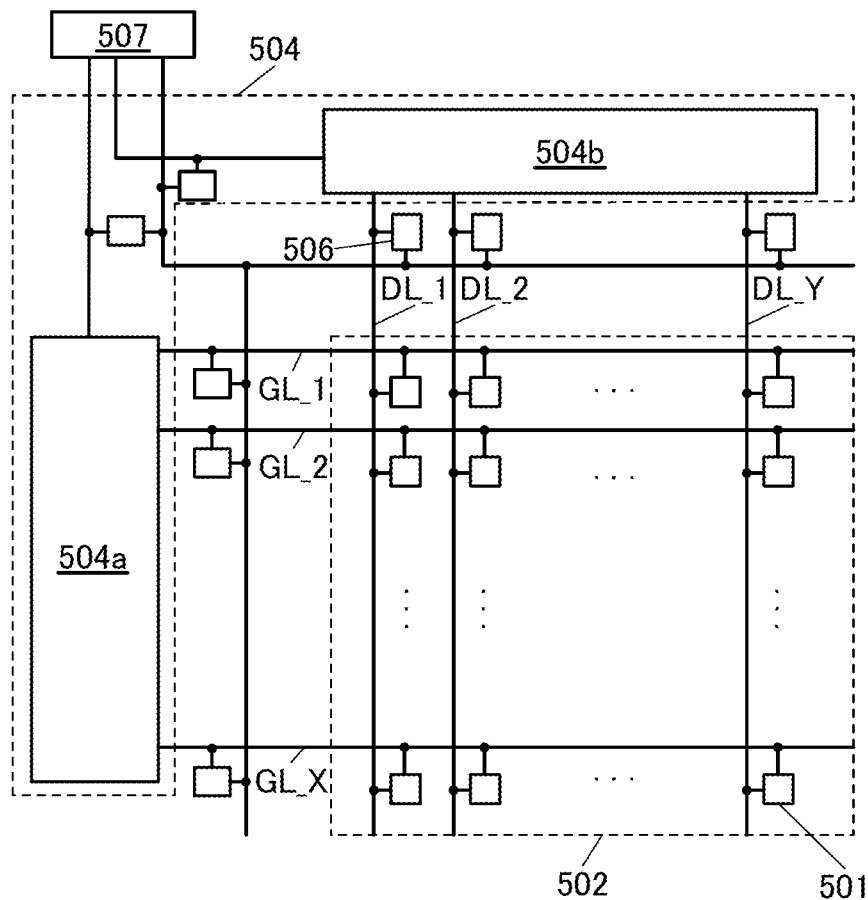
FIGS. 32A to 32C A block diagram and circuit diagrams illustrating a display device.

The protection circuit 506 illustrated in FIG. 32(A) is connected to, for example, the scan line GL, which is a wiring between the gate driver 504a and the pixel circuit 501. Alternatively, the protection circuit 506 is connected to the data line DL, which is a wiring between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers a portion having terminals for inputting power, control signals, and image signals to the display device from external circuits.

The protection circuit 506 is a circuit that electrically connects, when a potential out of a certain range is applied to the wiring connected to the protection circuit, the wiring to another wiring.

As illustrated in FIG. 32(A), the protection circuits 506 are provided for the pixel portion 502 and the driver circuit portion 504, so that the resistance of the display device to overcurrent generated by ESD (Electro Static Discharge) or the like can be improved. Note that the configuration of the protection circuits 506 is not limited thereto; for example, a structure in which the protection circuit 506 is connected to the gate driver 504a or a structure in which the protection circuit 506 is connected to the source driver 504b can be employed. Alternatively, a structure in which the protection circuit 506 is connected to the terminal portion 507 can be employed.

In FIG. 32(A), an example in which the driver circuit portion 504 is formed by the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 32B:
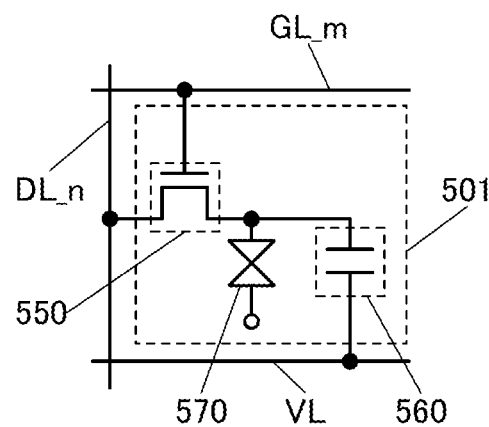

Each of the plurality of pixel circuits 501 illustrated in FIG. 32(A) can have the structure illustrated in FIG. 32(B), for example.

The pixel circuit 501 illustrated in FIG. 32(B) includes a liquid crystal element 570, a transistor 550, and a capacitor 560. As the transistor 550, the transistors described in the above embodiments can be used.

The potential of one of a pair of electrodes of the liquid crystal element 570 is set in accordance with the specifications of the pixel circuit 501 as appropriate. The alignment state of the liquid crystal element 570 is set depending on written data. A common potential may be supplied to one of the pair of electrodes of the liquid crystal element 570 included in each of the plurality of pixel circuits 501. A different potential may be supplied to one of the pair of electrodes of the liquid crystal element 570 of the pixel circuit 501 in each row.

For example, as a driving method of the display device including the liquid crystal element 570, a TN mode, an STN mode, a VA mode, an ASM (Axially Symmetric Aligned Micro-cell) mode, an OCB (Optically Compensated Birefringence) mode, an FLC (Ferroelectric Liquid Crystal) mode, an AFLC (AntiFerroelectric Liquid Crystal) mode, an MVA mode, a PVA (Patterned Vertical Alignment) mode, an IPS mode, an FFS mode, a TBA (Transverse Bend Alignment) mode, and the like may be employed. Other examples of the driving method of the display device include, in addition to the above driving methods, an ECB (Electrically Controlled Birefringence) mode, a PDLC (Polymer Dispersed Liquid Crystal) mode, a PNLC (Polymer Network Liquid Crystal) mode, and a guest-host mode. However, without limitation to the above, a variety of liquid crystal elements and the driving methods thereof can be used.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write data of a data signal by being turned on or turned off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 has a function as a storage capacitor for storing written data.

For example, in the display device including the pixel circuit 501 in FIG. 32(B), the pixel circuits 501 are sequentially selected row by row by the gate driver 504a illustrated in FIG. 32(A), whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 32C:
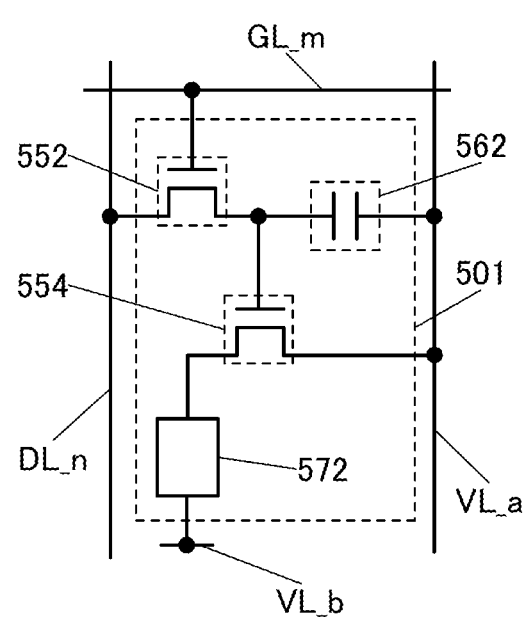

Alternatively, each of the plurality of pixel circuits 501 illustrated in FIG. 32(A) can have the structure illustrated in FIG. 32(C), for example.

The pixel circuit 501 illustrated in FIG. 32(C) includes transistors 552 and 554, a capacitor 562, and a light-emitting element 572. The transistors described in the above embodiments can be used as one of or both the transistor 552 and the transistor 554.

One of a source electrode and a drain electrode of the transistor 552 is electrically connected to a wiring to which a data signal is supplied (hereinafter referred to as a signal line DL_n). Moreover, a gate electrode of the transistor 552 is electrically connected to a wiring to which a gate signal is supplied (hereinafter referred to as a scan line GL_m).

The transistor 552 has a function of controlling writing of a data signal by being turned on or turned off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 has a function as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) or the like can be used, for example. Note that the light-emitting element 572 is not limited thereto; an inorganic EL element formed of an inorganic material may be used.

Note that a high power supply potential VDD is supplied to one of the potential supply line VL_a and the potential supply line VL_b, and a low power supply potential VSS is supplied to the other.

For example, in the display device including the pixel circuit 501 in FIG. 32(C), the pixel circuits 501 are sequentially selected row by row by the gate driver 504a illustrated in FIG. 32(A), whereby the transistors 552 are turned on and data of a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal, and the light-emitting element 572 emits light with a luminance corresponding to the amount of flowing current. This operation is sequentially performed row by row; thus, an image can be displayed.

At least part of this embodiment can be implemented in combination with the other embodiments described in this specification as appropriate.

Embodiment 5

In this embodiment, a display module and electronic devices, each of which includes a semiconductor device of one embodiment of the present invention, are described with reference to FIG. 33 to FIG. 36.

<5-1. Display Module>

Figure 33:
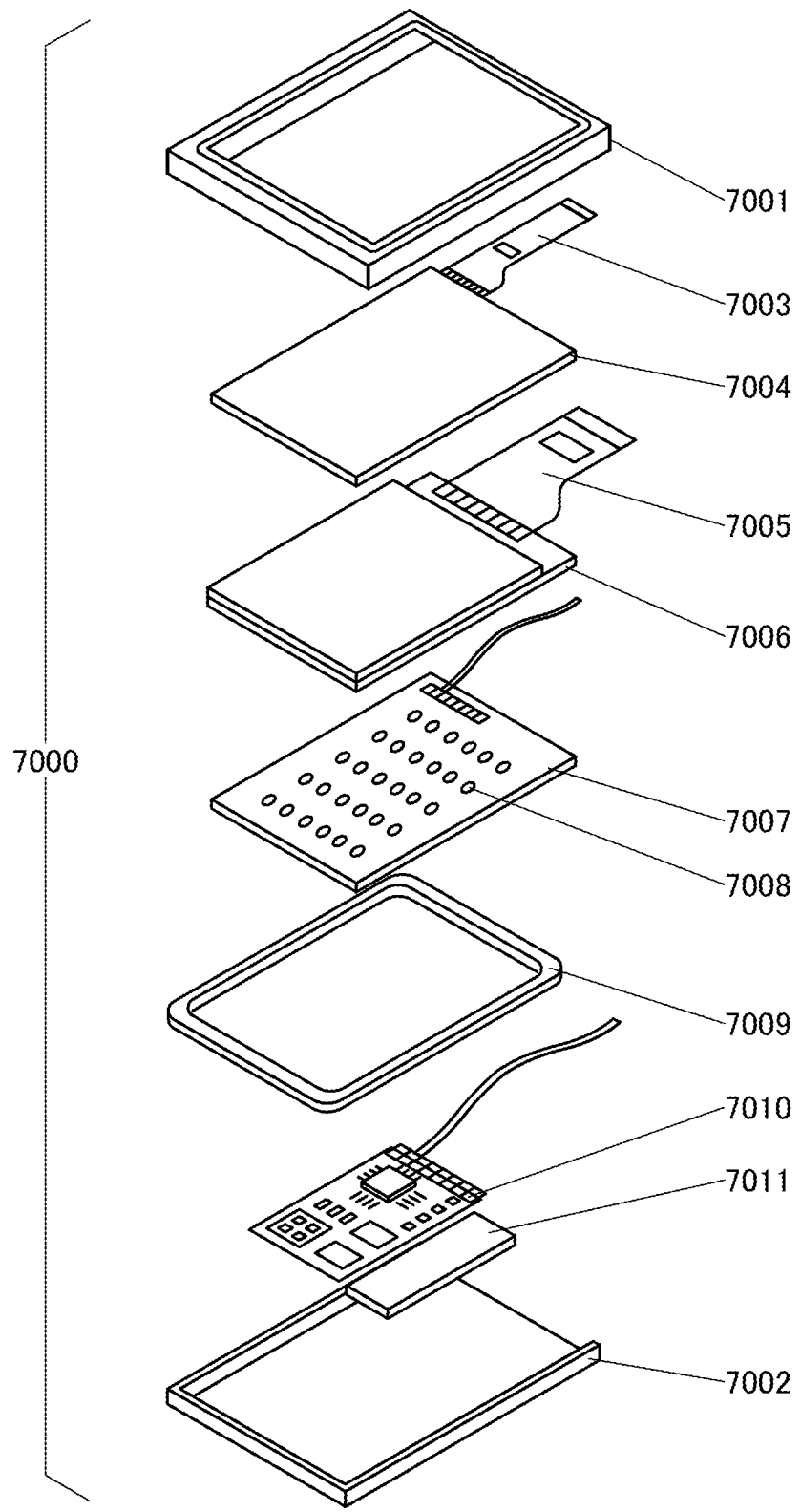
FIG. 33 A diagram illustrating a display module.

In a display module 7000 illustrated in FIG. 33, a touch panel 7004 connected to an FPC 7003, a display panel 7006 connected to an FPC 7005, a backlight 7007, a frame 7009, a printed board 7010, and a battery 7011 are included between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive or capacitive touch panel and overlap with the display panel 7006. Alternatively, a counter substrate (sealing substrate) of the display panel 7006 can have a touch panel function. Alternatively, a photosensor may be provided in each pixel of the display panel 7006 to form an optical touch panel.

The backlight 7007 includes a light source 7008. Note that in FIG. 33, the structure in which the light source 7008 is provided over the backlight 7007 is shown as an example; however, one embodiment of the present invention is not limited thereto. For example, a structure in which the light source 7008 is provided at an end portion of the backlight 7007 and a light diffusion plate is further provided may be employed. Note that the backlight 7007 need not be provided in the case where a self-luminous light-emitting element such as an organic EL element is used or in the case where a reflective panel or the like is employed.

The frame 7009 has a function of protecting the display panel 7006 and a function as an electromagnetic shield for blocking electromagnetic waves generated by the operation of the printed board 7010. The frame 7009 may also have a function as a radiator plate.

The printed board 7010 includes a power supply circuit and a signal processing circuit for outputting a video signal and a clock signal. As a power source for supplying power to the power supply circuit, an external commercial power source or a power source using the battery 7011 provided separately may be used. The battery 7011 can be omitted in the case where a commercial power source is used.

The display module 7000 may be additionally provided with a member such as a polarizing plate, a retardation plate, or a prism sheet.

<5-2. Electronic Device 1>

Next, FIG. 34(A) to FIG. 34(E) illustrate examples of electronic devices.

Figure 34A:
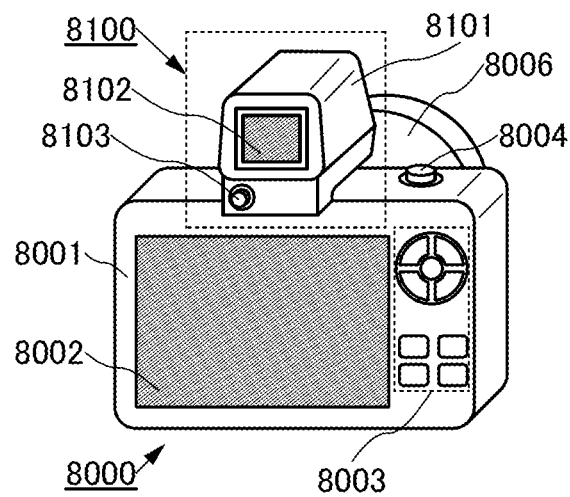
FIGS. 34A to 34E Diagrams illustrating electronic devices.

FIG. 34(A) is an external view of a camera 8000 to which a finder 8100 is attached.

The camera 8000 includes a housing 8001, a display portion 8002, an operation button 8003, a shutter button 8004, and the like. Furthermore, an attachable lens 8006 is attached to the camera 8000.

Although the lens 8006 of the camera 8000 here is detachable from the housing 8001 for replacement, the lens 8006 may be integrated with the housing.

Images can be taken with the camera 8000 at the press of the shutter button 8004. In addition, the display portion 8002 has a function as a touch panel and images can be taken at the touch of the display portion 8002.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 has a function as a power supply button. With the button 8103, the display portion 8102 can be turned on and off.

A display device of one embodiment of the present invention can be used in the display portion 8002 of the camera 8000 and the display portion 8102 of the finder 8100.

Note that although the camera 8000 and the finder 8100 are different electronic devices and detachable in FIG. 34(A), the housing 8001 of the camera 8000 may include a finder having a display device.

Figure 34B:
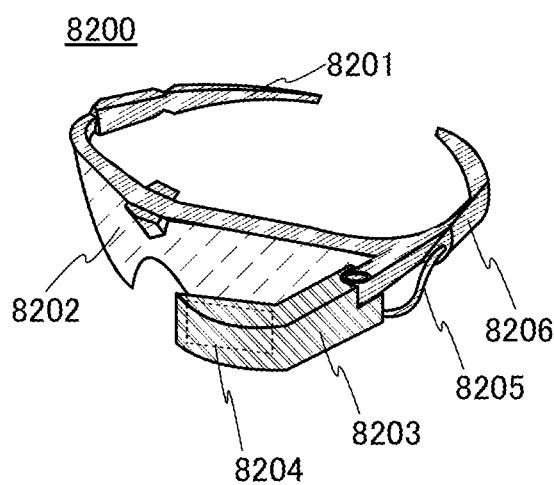

FIG. 34(B) is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205.

The main body 8203 includes a wireless receiver or the like, and video information such as received image data can be displayed on the display portion 8204. The movement of the eyeball and the eyelid of a user is captured by a camera provided in the main body 8203 and then coordinates of the points the user looks at are calculated using the information to utilize the points the user looks at as an input unit.

The mounting portion 8201 may include a plurality of electrodes at a position in contact with the user. The main body 8203 may be configured to sense current flowing through the electrodes with the movement of the user's eyeballs to recognize the points the user looks at.

The main body 8203 may be configured to sense current flowing through the electrodes to monitor the user's pulse. The mounting portion 8201 may include sensors such as a temperature sensor, a pressure sensor, and an acceleration sensor and may have a function of displaying the user's biological information on the display portion 8204. The main body 8203 may be configured to sense the movement of the user's head or the like to change an image displayed on the display portion 8204 in synchronization with the movement.

The display device of one embodiment of the present invention can be used in the display portion 8204.

Figure 34C:
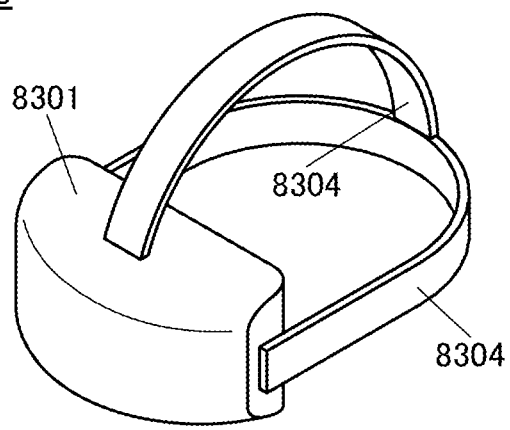
Figure 34D:
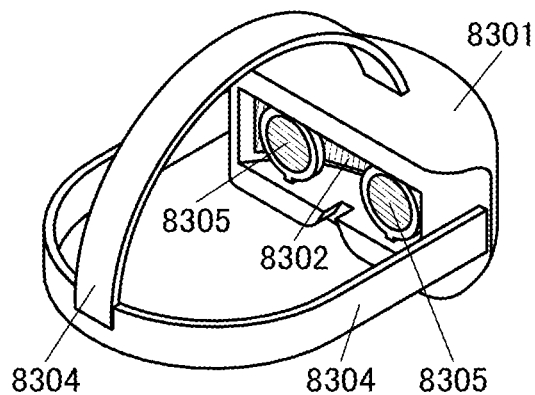
Figure 34E:
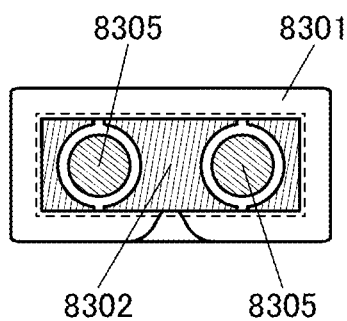

FIGS. 34(C), 34(D), and 34(E) are external views of a head-mounted display 8300.

The head-mounted display 8300 includes a housing 8301, a display portion 8302, a band-shaped fixing unit 8304, and a pair of lenses 8305.

A user can see display on the display portion 8302 through the lenses 8305. Note that it is favorable that the display portion 8302 be curved and placed. When the display portion 8302 is curved and placed, a user can feel high realistic sensation. Note that although in this embodiment, the structure in which one display portion 8302 is provided is shown as an example, the structure is not limited thereto, and a structure in which two display portions 8302 are provided may be employed. In this case, when one display portion is provided for one corresponding user's eye, three-dimensional display or the like using parallax is possible.

Note that the display device of one embodiment of the present invention can be used in the display portion 8302. The display device including the semiconductor device of one embodiment of the present invention has an extremely high resolution; thus, even when an image is magnified using the lenses 8305 as illustrated in FIG. 34(E), the user does not perceive pixels, and thus a more realistic image can be displayed.

<5-3. Electronic Device 2>

Next, FIG. 35(A) to FIG. 35(G) illustrate examples of electronic devices that are different from the electronic devices illustrated in FIG. 34(A) to FIG. 34(E).

The electronic devices illustrated in FIG. 35(A) to FIG. 35(G) include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIG. 35(A) to FIG. 35(G) have a variety of functions. Examples of the functions are a function of displaying a variety of information (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, and a function of reading a program or data stored in a memory medium and displaying the program or data on the display portion. Note that functions of the electronic devices illustrated in FIG. 35(A) to FIG. 35(G) are not limited to these, and the electronic devices can have a variety of functions. Although not illustrated in FIG. 35(A) to FIG. 35(G), the electronic devices may each have a plurality of display portions. The electronic devices may be provided with a camera or the like and have a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIG. 35(A) to FIG. 35(G) will be described in detail below.

Figure 35A:
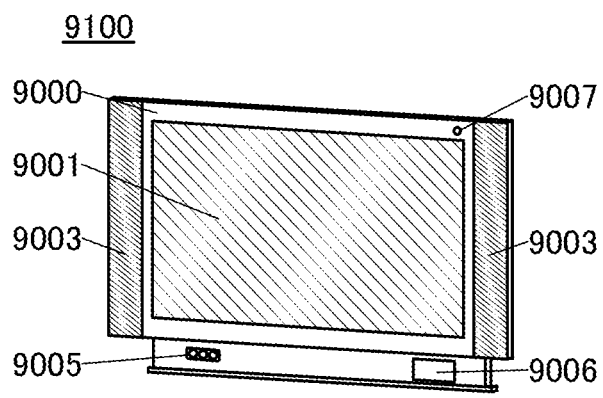
FIGS. 35A to 35G Diagrams illustrating electronic devices.

FIG. 35(A) is a perspective view illustrating a television device 9100. The television device 9100 can include the display portion 9001 having a large screen size of, for example, 50 inches or more, or 100 inches or more.

Figure 35D:
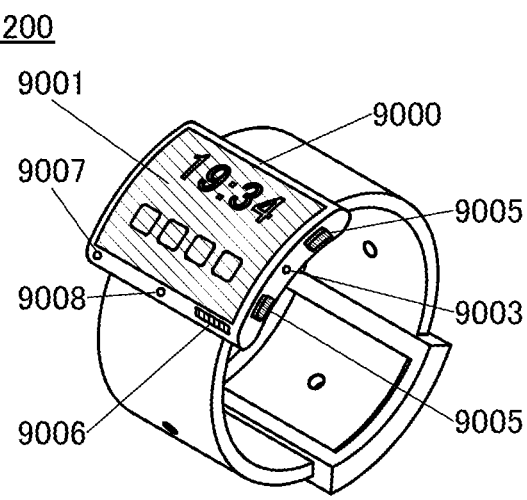
Figure 35B:
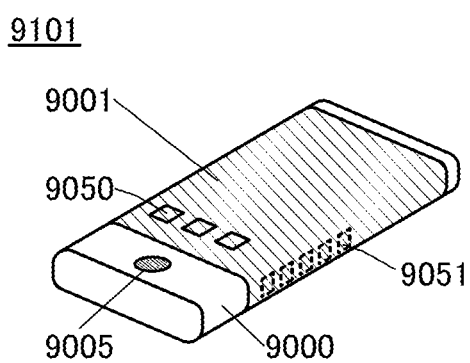

FIG. 35(B) is a perspective view of a portable information terminal 9101. The portable information terminal 9101 has a function as, for example, one or more selected from a telephone set, a notebook, and an information browsing system. Specifically, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Note that examples of the information 9051 include display indicating reception of an e-mail, an SNS (social networking service) message, or a telephone call, the title of an e-mail or an SNS message, the sender of an e-mail or an SNS message, date, time, remaining battery, and reception strength of an antenna. Instead of the information 9051, the operation buttons 9050 or the like may be displayed on the position where the information 9051 is displayed.

Figure 35E:
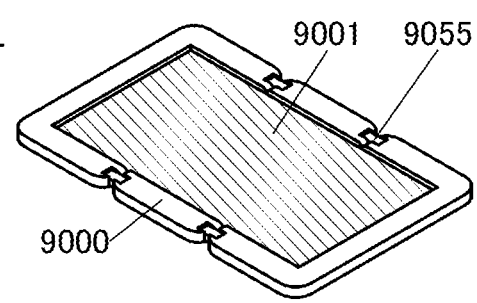
Figure 35C:
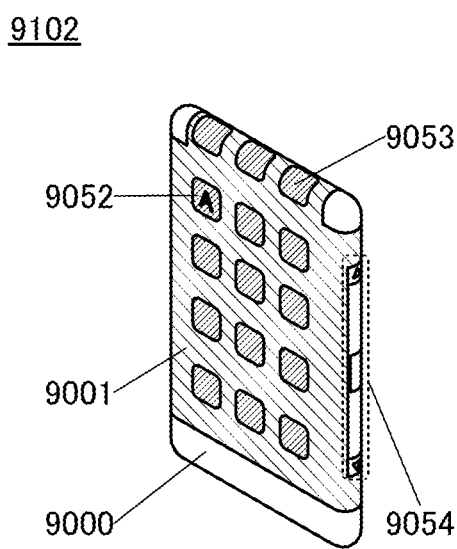

FIG. 35(C) is a perspective view of a portable information terminal 9102. The portable information terminal 9102 has a function of displaying information on three or more surfaces of the display portion 9001. Here, an example in which information 9052, information 9053, and information 9054 are displayed on different surfaces is shown. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 35(D) is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is curved and provided, and an image can be displayed on the curved display surface. The portable information terminal 9200 can employ near field communication conformable to a communication standard. For example, mutual communication with a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without using the connection terminal 9006.

Figure 35F:
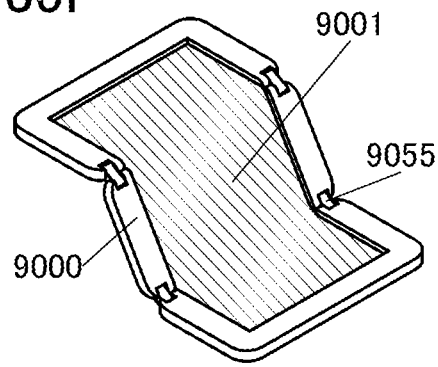
Figure 35G:
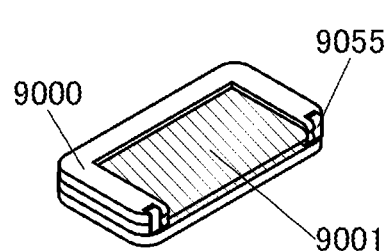

FIGS. 35(E), 35(F), and 35(G) are perspective views of a foldable portable information terminal 9201. FIG. 35(E) is a perspective view illustrating the portable information terminal 9201 that is opened, FIG. 35(F) is a perspective view illustrating the portable information terminal 9201 that is shifted from the opened state to the folded state or from the folded state to the opened state, and FIG. 35(G) is a perspective view illustrating the portable information terminal 9201 that is folded. The portable information terminal 9201 is highly portable when folded. When the portable information terminal 9201 is opened, a seamless large display region is highly browsable. The display portion 9001 included in the portable information terminal 9201 is supported by three housings 9000 joined together by hinges 9055. By being folded at the hinges 9055 between the two housings 9000, the portable information terminal 9201 can be reversibly changed in shape from the opened state to the folded state. For example, the portable information terminal 9201 can be bent with a radius of curvature of greater than or equal to 1 mm and less than or equal to 150 mm.

Figure 36A:
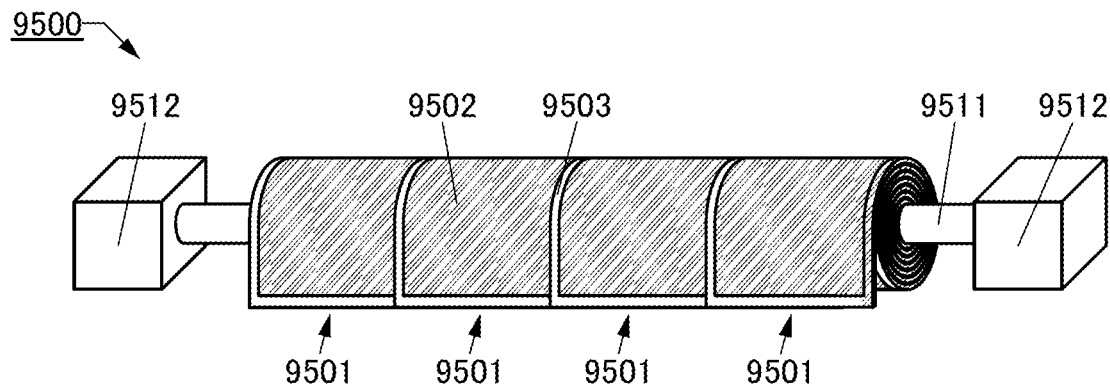
FIGS. 36A and 36B Perspective views illustrating a display device.
Figure 36B:
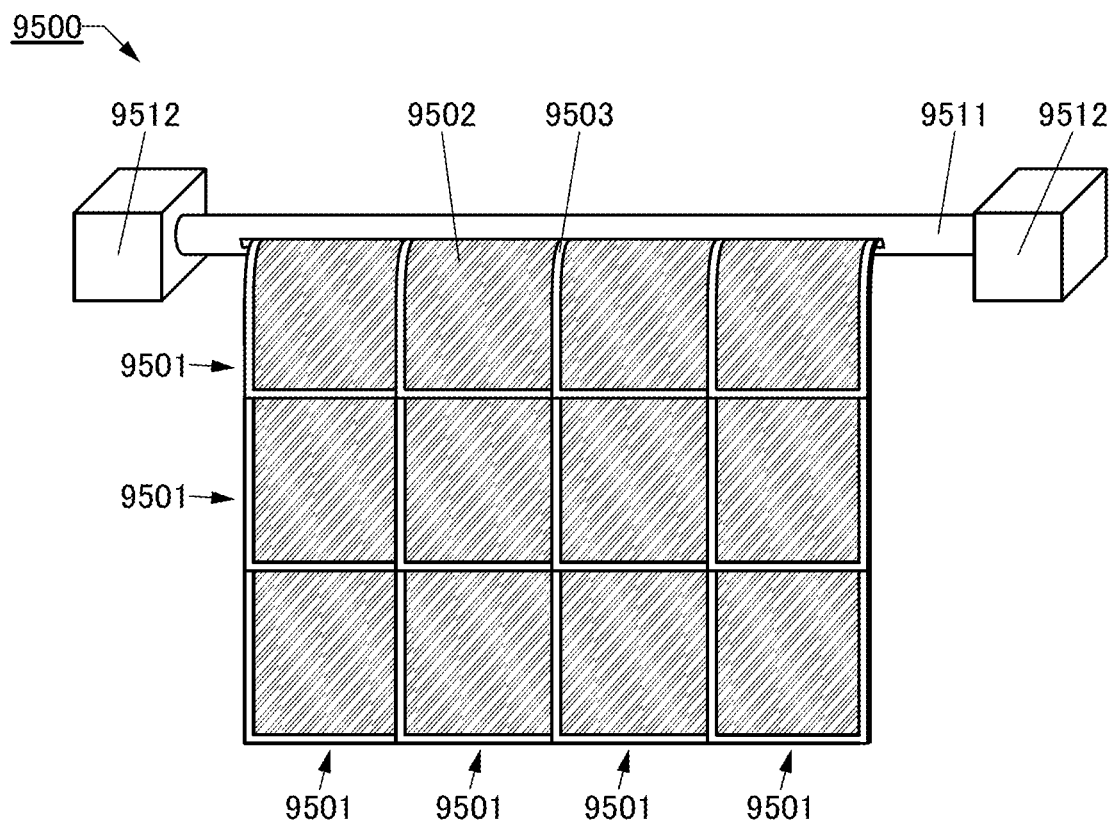

Next, FIGS. 36(A) and 36(B) show an example of an electronic device that is different from the electronic devices illustrated in FIG. 34(A) to FIG. 34(E) and the electronic devices illustrated in FIG. 35(A) to FIG. 35(G). FIGS. 36(A) and 36(B) are perspective views of a display device including a plurality of display panels. Note that the plurality of display panels are wound in the perspective view in FIG. 36(A) and the plurality of display panels are unwound in the perspective view in FIG. 36(B).

A display device 9500 illustrated in FIGS. 36(A) and 36(B) includes a plurality of display panels 9501, a shaft 9511, and a bearing 9512. The plurality of display panels 9501 each include a display region 9502 and a light-transmitting region 9503.

The plurality of display panels 9501 have flexibility. Two adjacent display panels 9501 are provided so as to partly overlap with each other. For example, the light-transmitting regions 9503 of the two adjacent display panels 9501 can overlap with each other. A display device having a large screen can be obtained with the plurality of display panels 9501. The display device is highly versatile because the display panels 9501 can be wound depending on its use.

Moreover, although the state where the display regions 9502 of the adjacent display panels 9501 are separated from each other is shown in FIGS. 36(A) and 36(B), without limitation to this structure, the display regions 9502 of the adjacent display panels 9501 may overlap with each other without any space so that a continuous display region 9502 is obtained, for example.

The electronic devices described in this embodiment each include the display portion for displaying some sort of data. Note that the semiconductor device of one embodiment of the present invention can also be used for an electronic device that does not have a display portion.

At least part of this embodiment can be implemented in combination with the other embodiments described in this specification as appropriate.

REFERENCE NUMERALS

A1 region
B1 region
100A transistor
100B transistor
100C transistor
100D transistor
100E transistor
100F transistor
100G transistor
100H transistor
100J transistor
102 substrate
104 insulating film
106 conductive film
108 oxide semiconductor film
108_1 oxide semiconductor film
108_2 oxide semiconductor film
108_3 oxide semiconductor film
108d drain region
108f region
108i channel region
108s source region
110 insulating film
112 conductive film
112_1 conductive film
112_2 conductive film
116 insulating film
118 insulating film
120a conductive film
120b conductive film
122 insulating film
141a opening
141b opening
143 opening
300A transistor
300B transistor
300C transistor
300D transistor
300E transistor
300F transistor
300G transistor
302 substrate
304 conductive film
306 insulating film
307 insulating film
308 oxide semiconductor film
308_1 oxide semiconductor film
308_2 oxide semiconductor film
308_3 oxide semiconductor film
312a conductive film
312b conductive film
312c conductive film
314 insulating film
316 insulating film
318 insulating film
320a conductive film
320b conductive film
341a opening
341b opening
342a opening
342b opening
342c opening
351 opening
352a opening
352b opening
501 pixel circuit
502 pixel portion
504 driver circuit portion
504a gate driver
504b source driver
506 protection circuit
507 terminal portion
550 transistor
552 transistor
554 transistor
560 capacitor
562 capacitor
570 liquid crystal element
572 light-emitting element
664 electrode 665 electrode
667 electrode
700 display device
701 substrate
702 pixel portion
704 source driver circuit portion
705 substrate
706 gate driver circuit portion
708 FPC terminal portion
710 signal line
711 wiring portion
712 sealant
716 FPC
730 insulating film
732 sealing film
734 insulating film
736 coloring film
738 light-blocking film
750 transistor
752 transistor
760 connection electrode
770 planarization insulating film
772 conductive film
773 insulating film
774 conductive film
775 liquid crystal element
776 liquid crystal layer
778 structure body
780 anisotropic conductive film
782 light-emitting element
783 droplet discharge apparatus
784 droplet
785 layer
786 EL layer
788 conductive film
790 capacitor
791 touch panel
792 insulating film
793 electrode
794 electrode
795 insulating film
796 electrode
797 insulating film
1400 droplet discharge apparatus
1402 substrate
1403 droplet discharge means
1404 imaging means
1405 head
1406 dotted line
1407 control means
1408 storage medium
1409 image processing means
1410 computer
1411 marker
1412 head
1413 material supply source
1414 material supply source
2190 plasma
2192 cation
2500 deposition chamber
2502a target
2502b target
2504 segregation region
2504a sputtered particles
2506 segregation region
2506a sputtered particles
2510a backing plate
2510b backing plate
2520 target holder
2520a target holder
2520b target holder
2530a magnet unit
2530b magnet unit
2530N1 magnet
2530N2 magnet
2530S magnet
2532 magnet holder
2542 member
2560 substrate
2570 substrate holder
2580a magnetic line of force
2580b magnetic line of force
7000 display module
7001 upper cover
7002 lower cover
7003 FPC
7004 touch panel
7005 FPC
7006 display panel
7007 backlight
7008 light source
7009 frame
7010 printed board
7011 battery
8000 camera
8001 housing
8002 display portion
8003 operation button
8004 shutter button
8006 lens
8100 finder
8101 housing
8102 display portion
8103 button
8200 head-mounted display
8201 mounting portion
8202 lens
8203 main body
8204 display portion
8205 cable
8206 battery
8300 head-mounted display
8301 housing
8302 display portion
8304 fixing unit
8305 lens
9000 housing
9001 display portion
9003 speaker
9005 operation key
9006 connection terminal
9007 sensor
9008 microphone
9050 operation button
9051 information
9052 information
9053 information
9054 information
9055 hinge
9100 television device
9101 portable information terminal
9102 portable information terminal
9200 portable information terminal
9201 portable information terminal 9500 display device
9501 display panel
9502 display region
9503 region
9511 shaft
9512 bearing

The invention claimed is:

1. A composite oxide semiconductor comprising:
a first region; and
a second region,
wherein the first region comprises a plurality of first clusters comprising In and oxygen as main components,
wherein the second region comprises a plurality of second clusters comprising Zn and oxygen as main components,
wherein the plurality of first clusters are directly connected to each other in three dimensions and sandwiched by the plurality of second clusters in three dimensions, and
wherein the plurality of second clusters are connected to each other.

2. A composite oxide semiconductor comprising:
a first region; and
a second region,
wherein the first region comprises a plurality of first clusters comprising In and oxygen as main components,
wherein the second region comprises a plurality of second clusters comprising oxygen and one of or both Zn and Sn as main components,
wherein the plurality of first clusters are directly connected to each other in three dimensions and sandwiched by the plurality of second clusters in three dimensions, and
wherein the plurality of second clusters are connected to each other.

3. The composite oxide semiconductor according to claim 1,
wherein each of the first region and the second region does not comprise Ga.

4. The composite oxide semiconductor according to claim 1,
wherein the first cluster has electrical conductivity, and
wherein the second cluster has electrical semiconductivity.

5. The composite oxide semiconductor according to claim 1,
wherein the first cluster comprises a portion longer than or equal to 0.5 nm and shorter than or equal to 1.5 nm.

6. A semiconductor device comprising the composite oxide semiconductor according to claim 1, further comprising:
a pair of insulating films between which the composite oxide semiconductor is sandwiched,
wherein in the case where thermal desorption spectroscopy analysis is performed in a range of higher than or equal to 100° C. and lower than or equal to 450° C., one of or both the pair of insulating films have a region where an amount of released oxygen converted into oxygen molecules is greater than or equal to $1\times10^{14}$ molecules/cm' and less than $1\times10^{16}$ molecules/cm$^2$.

7. A semiconductor device comprising the composite oxide semiconductor according to claim 2, further comprising:
a pair of insulating films between which the composite oxide semiconductor is sandwiched,
wherein in the case where thermal desorption spectroscopy analysis is performed in a range of higher than or equal to 100° C. and lower than or equal to 450° C., one of or both the pair of insulating films have a region where an amount of released oxygen converted into oxygen molecules is greater than or equal to $1\times10^{14}$ molecules/cm' and less than $1\times10^{16}$ molecules/cm$^2$.

8. The semiconductor device according to claim 6,
wherein each of the first region and the second region does not comprise Ga.

9. A display device comprising:
semiconductor device according to claim 6; and
a display element.

10. A display module comprising:
the display device according to claim 9; and
a touch sensor.

11. An electronic device comprising:
semiconductor device according to claim 6; and
an operation key or a battery.

12. A semiconductor device comprising:
a first conductive film;
a first insulating film over the first conductive film;
an oxide semiconductor film over the first insulating film;
a second insulating film over the oxide semiconductor film; and
a second conductive film over the second insulating film,
wherein the oxide semiconductor film comprises a first region comprising In and Zn and a second region comprising In and Zn,
wherein In concentration in the first region is 2 or more times and 10 or less times In concentration in the second region,
wherein the first region comprises a plurality of first clusters directly connected to each other in three dimensions,
wherein the second region comprises a plurality of second clusters,
wherein the plurality of first clusters are sandwiched by the plurality of second clusters in three dimensions, and
wherein a diameter of the first cluster or the second cluster is greater than or equal to 0.5 nm and less than or equal to 2.5 nm.

13. A semiconductor device comprising:
an oxide semiconductor film comprising a channel formation region,
wherein the channel formation region comprises a first region comprising In and Zn and a second region comprising In and Zn,
wherein In concentration in the first region is 2 or more times and 10 or less times In concentration in the second region, and
wherein the first region comprises a plurality of clusters three-dimensionally connected to each other so as to extend in a cloud-like manner.

* * * * *